United States Patent
Kurokawa

(10) Patent No.: US 10,410,571 B2
(45) Date of Patent: Sep. 10, 2019

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/657,573

(22) Filed: Jul. 24, 2017

(65) Prior Publication Data

US 2018/0040274 A1 Feb. 8, 2018

(30) Foreign Application Priority Data

Aug. 3, 2016 (JP) ................................. 2016-152678
Aug. 30, 2016 (JP) ................................. 2016-167660

(51) Int. Cl.
*G09G 3/20* (2006.01)
*G06F 3/041* (2006.01)
(Continued)

(52) U.S. Cl.
CPC .......... *G09G 3/2092* (2013.01); *G06F 3/041* (2013.01); *G09G 3/3233* (2013.01); *G09G 3/3266* (2013.01); *G09G 3/3275* (2013.01); *G09G 3/3677* (2013.01); *G09G 3/3688* (2013.01); *G02F 1/1368* (2013.01); *G02F 1/133553* (2013.01); *G09G 2300/046* (2013.01); *G09G 2300/0838* (2013.01); *G09G 2300/0871* (2013.01); *G09G 2310/0286* (2013.01); *G09G 2310/0289* (2013.01); *G09G 2330/02* (2013.01);
(Continued)

(58) Field of Classification Search
CPC ................ G06F 1/1641; G09G 3/2092; G09G 2310/0289; G09G 2300/0871; G09G 2300/0838; G09G 3/3266; G09G 3/3275
See application file for complete search history.

(56) References Cited

U.S. PATENT DOCUMENTS

2003/0107688 A1 6/2003 Yamagishi
2007/0241667 A1* 10/2007 Ohsawa ................. C09K 11/06
                                                              313/504

(Continued)

FOREIGN PATENT DOCUMENTS

JP      2008-225381 A    9/2008
WO   WO-2007/041150   4/2007

*Primary Examiner* — Dennis P Joseph
(74) *Attorney, Agent, or Firm* — Fish & Richardson P.C.

(57) ABSTRACT

A display device with high driving performance is provided. The display device includes a base, a display portion, a gate deriver, a level shifter, a source driver IC, and a controller IC. Each of the display portion, the gate driver, and the level shifter includes a transistor including a metal oxide in a channel formation region and is formed over the base. Each of the source driver IC and the controller IC includes a transistor including silicon in a channel formation region and is mounted over the base. The display portion is electrically connected to the gate driver and the source driver IC. The gate driver is electrically connected to the controller IC through the level shifter, and the source driver IC is electrically connected to the controller IC.

24 Claims, 34 Drawing Sheets

(51) Int. Cl.
*G09G 3/3233* (2016.01)
*G09G 3/3266* (2016.01)
*G09G 3/3275* (2016.01)
*G09G 3/36* (2006.01)
G02F 1/1335 (2006.01)
G02F 1/1368 (2006.01)
H01L 27/12 (2006.01)
H01L 27/32 (2006.01)
H01L 29/786 (2006.01)

(52) U.S. Cl.
CPC ...... *H01L 27/1225* (2013.01); *H01L 27/3232* (2013.01); *H01L 27/3262* (2013.01); *H01L 29/7869* (2013.01)

(56) References Cited

U.S. PATENT DOCUMENTS

| | | | |
|---|---|---|---|
| 2010/0110623 A1* | 5/2010 | Koyama | H01L 27/1248 361/679.01 |
| 2015/0255492 A1 | 9/2015 | Takahashi et al. | |
| 2015/0355468 A1* | 12/2015 | Osterhout | G06F 3/012 345/633 |
| 2016/0012790 A1* | 1/2016 | Zheng | G09G 3/3688 345/204 |
| 2017/0263203 A1* | 9/2017 | Zhao | G09G 3/3677 |
| 2017/0270405 A1 | 9/2017 | Kurokawa | |
| 2017/0301376 A1 | 10/2017 | Kurokawa | |
| 2017/0337884 A1 | 11/2017 | Kurokawa | |
| 2017/0343386 A1* | 11/2017 | Tanaka | G01D 5/24 |
| 2018/0061344 A1 | 3/2018 | Kurokawa | |

\* cited by examiner

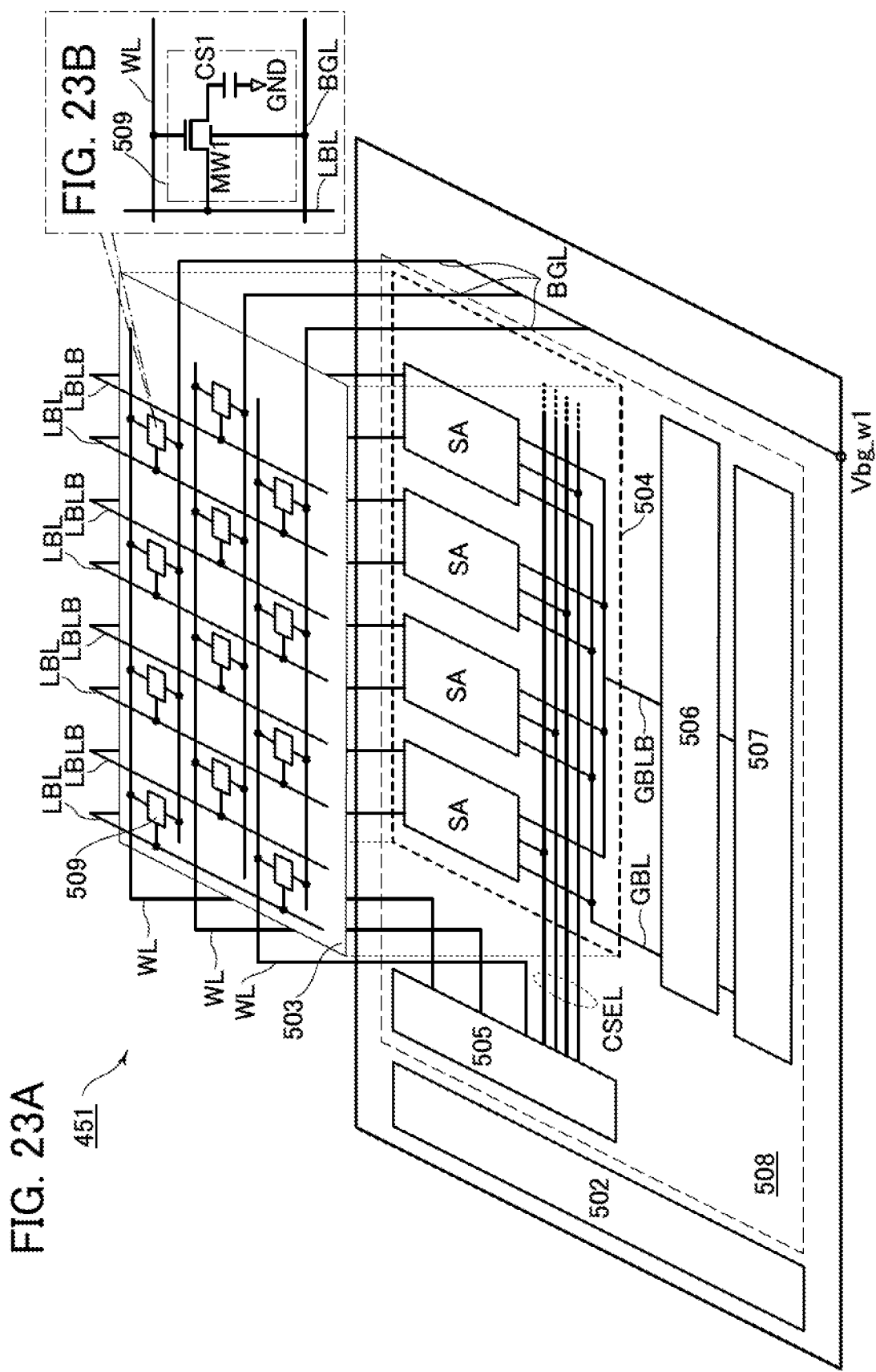

DISPLAY DEVICE AND ELECTRONIC DEVICE

BACKGROUND OF THE INVENTION

1. Field of the Invention

One embodiment of the present invention relates to a display device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

Display devices included in mobile phones such as smartphones, tablet information terminals, and notebook personal computers (PC) have undergone various improvements in recent years. For example, there have been developed display devices with features such as higher resolution, higher color reproducibility (higher NTSC ratio), a smaller driver circuit, and lower power consumption.

As an example, an improved display device has a function of automatically adjusting the brightness of an image displayed on the display device in accordance with ambient light. An example of such a display device is a display device having a function of displaying an image by reflecting ambient light and a function of displaying an image by making a light-emitting element emit light. This structure enables the brightness of an image displayed on a display device to be adjusted in the following manner: the display device enters a display mode for displaying an image with the use of reflected light (hereinafter referred to as reflective mode) when ambient light is sufficiently strong, whereas the display device enters a display mode for displaying an image with light emitted from a light-emitting element (hereinafter referred to as transmissive mode or self-luminous mode) when ambient light is weak. In other words, the display device can display images in a display mode that is selected from the reflective mode, the self-luminous mode, and a mode using both the reflective and self-luminous modes in accordance with the intensity of ambient light sensed with an illuminometer (illuminance sensor).

As examples of a display device having a function of displaying an image by making a light-emitting element emit light and a function of displaying an image by reflecting ambient light, Patent Documents 1 to 3 each disclose a display device in which one pixel includes a pixel circuit for controlling a liquid crystal element and a pixel circuit for controlling a light-emitting element (such a display device is referred to as a hybrid display device).

REFERENCE

[Patent Document 1] United States Patent Application Publication No. 2003/0107688
[Patent Document 2] PCT International Publication No. WO2007/041150
[Patent Document 3] Japanese Published Patent Application No. 2008-225381

SUMMARY OF THE INVENTION

In a display device including one type of a display element, using a transistor including a metal oxide or an oxide semiconductor in a channel formation region (hereinafter, the transistor is referred to as "OS transistor") for a pixel circuit including a display element, a driver circuit, or the like has been proposed. The OS transistor has a characteristic of extremely low off-state current. Thus, when the OS transistor is used for a pixel circuit, for example, the frequency of refreshing image data held in the pixel circuit can be reduced in displaying a still image by a display device. Alternatively, when the OS transistor is used for a driver circuit, for example, the operation of the driver circuit is not necessary for displaying a still image by the display device. Thus, the necessary setting information or the like is stored in a nonvolatile memory using the OS transistor, which enables the block of supplying power.

For the above-described pixel circuit or driver circuit, a transistor including silicon in a channel formation region (hereinafter, the transistor is referred to as "Si transistor") can be used. In particular, to improve the performance of a buffer amplifier, a register circuit, a pass transistor logic circuit, or the like in the driver circuit, Si transistors are preferably used.

To utilize both the characteristics of OS transistors and the characteristics of Si transistors, the driver circuit of the display device, which is formed using both the OS transistors and the Si transistors, has been proposed. However, the conditions of heat treatment, such as a temperature, a time, and an atmosphere, are different between a process for forming the OS transistor and a process for forming the Si transistor with high withstand voltage in the driver circuit or the like. Thus, in some cases, it is difficult to form the OS transistor and the Si transistor with high withstand voltage in one circuit.

An object of one embodiment of the present invention is to provide a novel display device. Another object of one embodiment of the present invention is to provide an electronic device including a novel display device.

Another object of one embodiment of the present invention is to provide a display device including a driver circuit with high driving performance. Another object of one embodiment of the present invention is to provide a display device with high pixel density. Another object of one embodiment of the present invention is to provide a display device with low power consumption.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1)

One embodiment of the present invention is a display device including a base, a display portion, a first circuit, a second circuit, and a first integrated circuit, where the display portion is formed over the base, where the first circuit is formed over the base, where the second circuit is formed over the base, where the first integrated circuit is mounted over the base, where the first circuit is configured to operate as a gate driver of the display portion, where the second circuit is configured to shift a level of a potential inputted to the second circuit and to supply the shifted potential to the first circuit, and where the first integrated circuit is configured to operate as a source driver of the display portion.

(2)

Another embodiment of the present invention is the display device described in (1), including a second integrated circuit, where the second integrated circuit is mounted over the base, where the second integrated circuit includes a memory circuit, an image processing portion, and a controller, where the memory circuit is configured to store an image data, where the image processing portion is configured to process the image data, and where the controller is configured to control supplying power to at least one of the first circuit, the second circuit, the first integrated circuit, the memory circuit, and the image processing portion.

(3)

Another embodiment of the present invention is the display device described in (2), where the second integrated circuit includes a first transistor, and where the first transistor includes silicon in a channel formation region.

(4)

Another embodiment of the present invention is the display device described in (2) or (3), where the second integrated circuit includes a second transistor, and where the second transistor includes a metal oxide in a channel formation region.

(5)

Another embodiment of the present invention is the display device described in any one of (1) to (4), where the second circuit includes a third circuit, where the third circuit includes third to eighth transistors, a first capacitor, and a second capacitor, where each of the third to eighth transistors includes a metal oxide in a channel formation region, where a first terminal of the third transistor is electrically connected to a gate of the third transistor, where a first terminal of the fourth transistor is electrically connected to a gate of the fourth transistor, where a gate of the fifth transistor is electrically connected to the first terminal of the fourth transistor, where a first terminal of the fifth transistor is electrically connected to a second terminal of the third transistor, where a gate of the sixth transistor is electrically connected to the first terminal of the third transistor, where a first terminal of the sixth transistor is electrically connected to a second terminal of the fourth transistor, where a first terminal of the seventh transistor is electrically connected to a first terminal of the eighth transistor, where a gate of the seventh transistor is electrically connected to the second terminal of the third transistor, where a gate of the eighth transistor is electrically connected to the second terminal of the fourth transistor, where a first terminal of the first capacitor is electrically connected to the gate of the seventh transistor, where a second terminal of the first capacitor is electrically connected to the first terminal of the seventh transistor, and where a first terminal of the second capacitor is electrically connected to the gate of the eighth transistor.

(6)

Another embodiment of the present invention is the display device described in (5), where the second circuit includes a first differential amplifier, a second differential amplifier, and a buffer circuit, where the buffer circuit includes a first input terminal, a second input terminal, and a third circuit, where the first input terminal is electrically connected to the first terminal of the third transistor, where the second input terminal is electrically connected to the first terminal of the fourth transistor, where each of the first differential amplifier and the second differential amplifier includes a ninth transistor, where the ninth transistor includes a metal oxide in a channel formation region, where an output terminal of the first differential amplifier is electrically connected to the first input terminal of the buffer circuit, and where an output terminal of the second differential amplifier is electrically connected to the second input terminal of the buffer circuit.

(7)

Another embodiment of the present invention is the display device described in (6), where the second integrated circuit includes a logic circuit, where a first output terminal of the logic circuit is electrically connected to an input terminal of the first differential amplifier, where a second output terminal of the logic circuit is electrically connected to an input terminal of the second differential amplifier, and where the logic circuit is configured to output a pulse signal from the first output terminal when a potential of a signal inputted to an input terminal of the logic circuit changes from a low level to a high level and configured to output a pulse signal from the second output terminal when a potential of a signal inputted to the input terminal of the logic circuit changes from a high level to a low level.

(8)

Another embodiment of the present invention is the display device described in any one of (1) to (7), where each of the display portion and the first circuit includes a tenth transistor, and where the tenth transistor includes a metal oxide in a channel formation region.

(9)

Another embodiment of the present invention is the display device described in any one of (1) to (8), where the first integrated circuit includes an eleventh transistor, and where the eleventh transistor includes silicon in a channel formation region.

(10)

Another embodiment of the present invention is the display device described in any one of (1) to (9), where the display portion includes a first display element and a second display element, where the first display element is configured to display an image with use of light reflection, and where the second display element is configured to display an image by self light emission.

(11)

Another embodiment of the present invention is an electronic device, including the display device described in any one of (1) to (10), a touch sensor, and a housing.

(12)

Another embodiment of the present invention is a head-mounted electronic device including the display device described in any one of (1) to (9) and a structure body that is worn on a head.

According to one embodiment of the present invention, a novel display device can be provided. According to another embodiment of the present invention, an electronic device including a novel display device can be provided.

According to another embodiment of the present invention, a display device including a driver circuit with high driving performance. According to another embodiment of the present invention, a display device with high pixel density can be provided. According to another embodiment of the present invention, a display device with low power consumption can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIGS. 23A and 23B are block diagrams illustrating a configuration example of a frame memory.

DETAILED DESCRIPTION OF THE INVENTION

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, when a metal oxide is included in a channel formation region of a transistor that has at least one of an amplifying function, a rectifying function, and a switching function, the metal oxide can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

(Embodiment 1)

In this embodiment, a display device that is one embodiment of the present invention will be described.

Figure 1A:
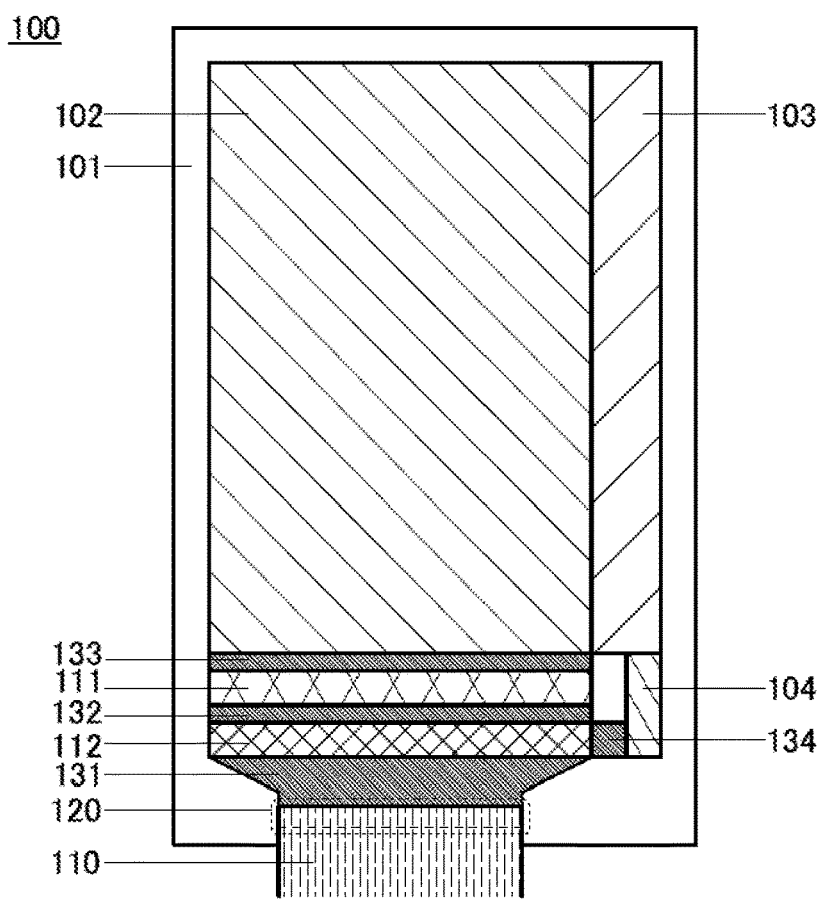
FIGS. 1A and 1B are a top view and a perspective view illustrating an example of a display device.

FIG. 1A illustrates an example of an appearance of a display device of one embodiment of the present invention. A display device 100 is a display device including one of a liquid crystal element and a light-emitting element as a display element, and the display element is included in a display portion 102.

Figure 1B:
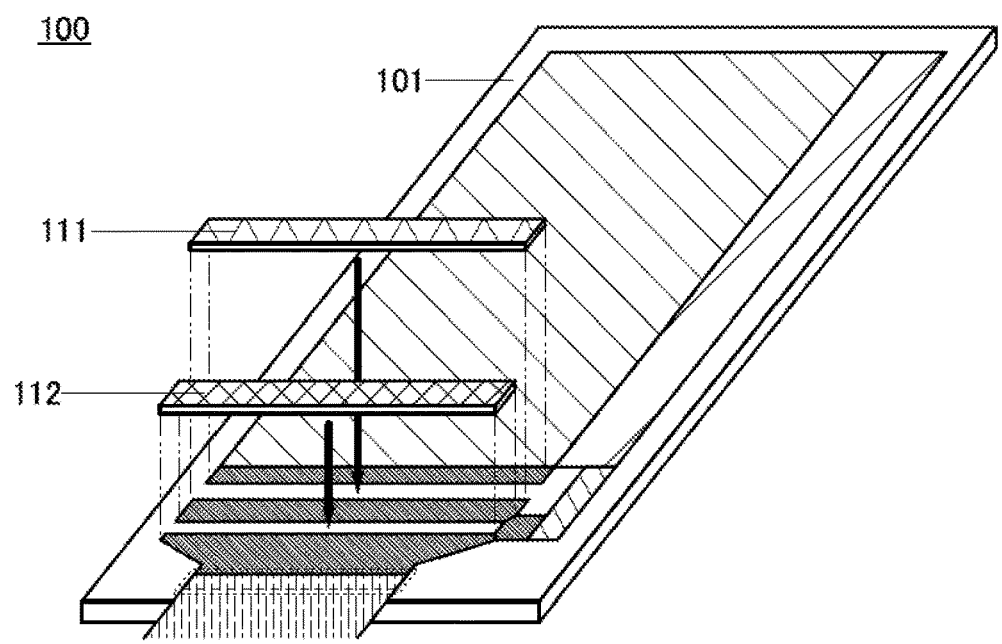

The display device 100 includes the display portion 102, a gate driver 103, a level shifter 104, a source driver IC 111, and a controller IC 112 over a base 101. The display portion 102, the gate driver 103, and the level shifter 104 are formed over the base 101. The source driver IC 111 and the controller IC 112 are mounted as components of an IC chip or the like, over the base 101 with use of an anisotropic conductive adhesive or an anisotropic conductive film by a chip on glass (COG) method or the like. FIG. 1B illustrates a state where the source driver IC 111 and the controller IC 112 are mounted. The display device 100 is electrically connected to a flexible printed circuit (FPC) 110 as a unit for inputting a signal or the like from the outside. The source driver IC 111 and/or the controller IC 112 may be mounted on the FPC 110 or the like by a chip on film (COF) method instead of a COG method.

In addition, wirings 131 to 134 are formed over the base 101 so that the circuits are electrically connected to each other. In the display device 100, the controller IC 112 is electrically connected to the FPC 110 through the wiring 131, and the source driver IC 111 is electrically connected to the controller IC 112 through the wiring 132. The display portion 102 is electrically connected to the source driver IC 111 through the wiring 133. The level shifter 104 is electrically connected to the controller IC 112 through the wiring 134.

The gate driver 103 is electrically connected to the display portion 102, and the level shifter 104 is electrically connected to the gate driver 103.

A connection portion 120 between the wiring 131 and the FPC 110 has an anisotropic conductive adhesive, whereby electrical conduction between the FPC 110 and the wiring 131 can be obtained.

The gate driver 103 has a function of selecting a plurality of pixel circuits in the display portion 102, and the source driver IC 111 has a function of transmitting image data to the pixel circuits in the display portion 102.

The display portion 102, the gate driver 103, and the level shifter 104 can be formed, for example, using OS transistors, over the base 101. In other words, a step of forming OS transistors over the base 101 is performed, whereby the display portion 102, the gate driver 103, and the level shifter 104 can be formed.

The source driver IC 111 and the controller IC 112 can be formed, for example, using Si transistors, over the base 101. In the case where IC chips (integrated circuits) for the source driver IC 111 and the controller IC 112 are formed using Si transistors, a Si wafer is preferably used for a base where the Si transistors are formed. Thus, for example, Si transistors are formed over the Si wafer, whereby the source driver IC 111 and/or the controller IC 112 can be formed.

Although the controller IC 112 will be described in detail in Embodiment 3, the controller IC 112 includes a frame memory, a register, and the like. Such circuits are preferably formed using Si transistors with a logic process (hereinafter, referred to as logic Si transistors).

Furthermore, when a circuit storing data, such as a frame memory or a register, is formed, an OS transistor with an extremely low off-state current is preferably used as a transistor holding a potential corresponding to the data. In other words, it is further preferable that the controller IC 112 include a logic Si transistor and an OS transistor. Specifically, the logic Si transistor is formed on the Si wafer, an interlayer film is formed over the logic Si transistor, and then the OS transistor is formed over the interlayer film.

Although the source driver IC 111 will be described in detail in Embodiment 3, the source driver IC 111 includes a shift register, a level shifter, a digital analog conversion circuit, a buffer, and the like. Such circuits are preferably formed using Si transistors with a process for a driver IC (high withstand-voltage process) (such a Si transistor is hereinafter referred to as a high withstand-voltage Si transistor).

The high withstand-voltage Si transistor has lower resistance to heat treatment than the logic Si transistor in some cases. When the source driver IC 111 is formed using the high withstand-voltage Si transistors and the OS transistors for which heat treatment is necessary, it is difficult to exert the potential performance in some cases. Thus, the source driver IC 111 is preferably formed using only high withstand-voltage Si transistors.

As described above, the controller IC 112 including the logic Si transistors and the OS transistors and the source driver IC 111 including the high withstand-voltage Si transistors are mounted over the base 101 where the OS transistors are formed, so that the transistors having different levels of resistance to heat treatment, i.e., the logic Si transistors, the high withstand-voltage Si transistors, and the OS transistors, can be provided in the display device 100. With such a structure, degradation of transistor characteristics, caused by a difference in heat treatment conditions, can be prevented, and all of the logic Si transistor, the high withstand-voltage Si transistor, and the OS transistor, which have favorable transistor characteristics, can be used in one device. As a result, a display device with high driving performance can be achieved.

Figure 2A:
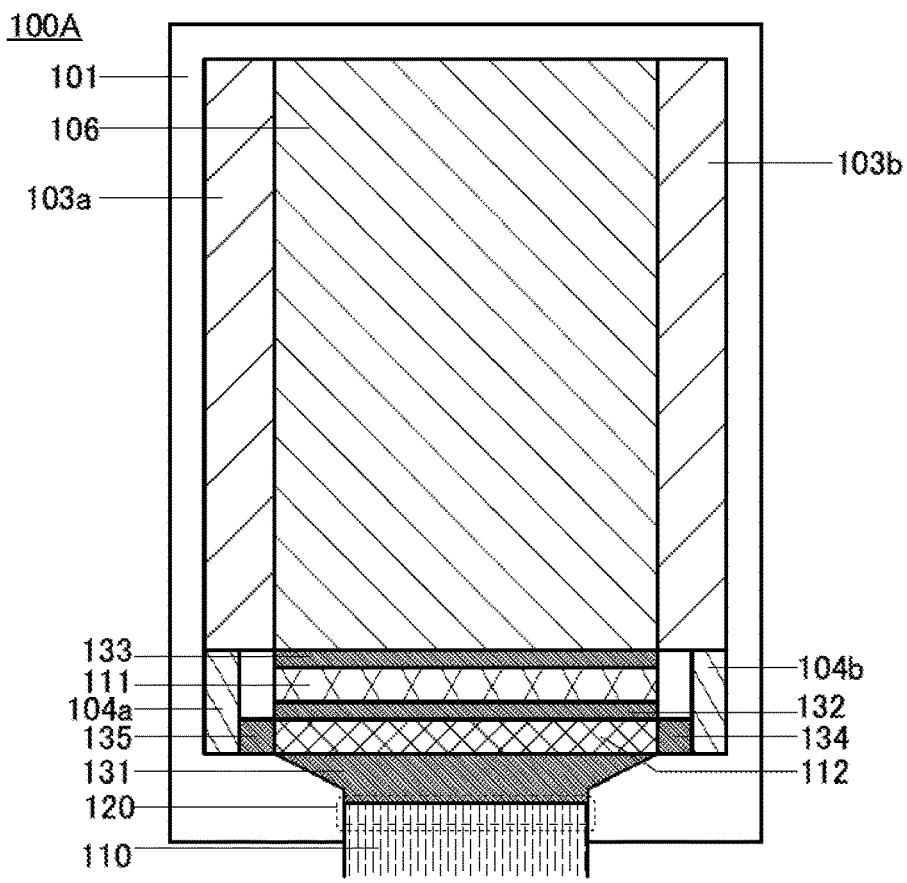
FIGS. 2A and 2B are a top view and a perspective view illustrating an example of a display device.

FIG. 2A illustrates a display device having another structure of the display device 100 in FIG. 1A. A display device 100A is a hybrid display device including a reflective element and a light-emitting element as display elements. The reflective element and the light-emitting element are included in a display portion 106.

Figure 2B:
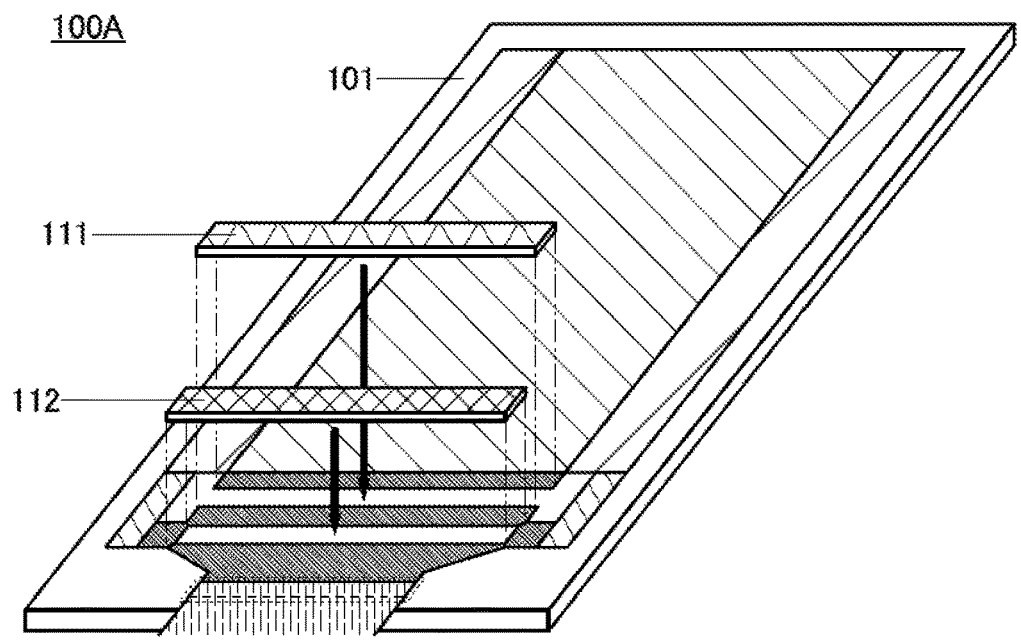

The display device 100A includes the display portion 106, a gate driver 103a, a gate driver 103b, a level shifter 104a, a level shifter 104b, the source driver IC 111, and the controller IC 112 over the base 101. The display portion 106, the gate driver 103a, the gate driver 103b, the level shifter 104a, and the level shifter 104b are formed over the base 101. The source driver IC 111 and the controller IC 112 are mounted as components of an IC chip or the like, over the base 101, using an anisotropic conductive adhesive or an anisotropic conductive film by a COG method or the like. FIG. 2B illustrates a state where the source driver IC 111 and the controller IC 112 are mounted. The display device 100A is electrically connected to the FPC 110 as a unit for inputting a signal or the like from the outside. The source driver IC 111 and/or the controller IC 112 may be mounted on the FPC 110 or the like by a COF method instead of a COG method.

In addition, wirings 131 to 135 are formed over the base 101 so that the circuits are electrically connected to each other. In the display device 100, the controller IC 112 is electrically connected to the FPC 110 through the wiring 131, and the source driver IC 111 is electrically connected to the controller IC 112 through the wiring 132. The display portion 106 is electrically connected to the source driver IC 111 through the wiring 133. The level shifter 104a is electrically connected to the controller IC 112 through the wiring 135, and the level shifter 104b is electrically connected to the controller IC 112 through the wiring 134.

The connection portion 120 between the wiring 131 and the FPC 110 has an anisotropic conductive adhesive, whereby electrical conduction between the FPC 110 and the wiring 131 can be obtained.

The gate driver 103a has a function of selecting one of the reflective element and the light-emitting element in the display portion 106. The gate driver 103b has a function of selecting the other of the reflective element and the light-emitting element in the display portion 106. The source driver IC 111 has a function of transmitting image data to the reflective element and/or the light-emitting element in the display portion 106.

The display portion 106, the gate driver 103a, the gate driver 103b, the level shifter 104a, and the level shifter 104b can be formed, for example, using OS transistors, over the base 101. In other words, a step of forming OS transistors over the base 101 is performed, whereby the display portion 106, the gate driver 103a, the gate driver 103b, the level shifter 104a, and the level shifter 104b can be formed.

As for transistors included in the IC chips of the source driver IC 111 and the controller IC 112, the description of the display device 100 can be referred to. As in the case of the display device 100, the source driver IC 111 is preferably formed using high withstand-voltage Si transistors, and the controller IC 112 is preferably formed using logic Si transistors and OS transistors.

As described above, as in the case of the display device 100, the controller IC 112 including the logic Si transistors and the OS transistors and the source driver IC 111 including the high withstand-voltage Si transistor are mounted over the base 101 where the OS transistors are formed, so that the transistors having different levels of resistance to heat treatment, i.e., the logic Si transistors, the high withstand-voltage Si transistors, and the OS transistors, can be provided in the display device 100A. As a result, a display device with high driving performance can be achieved.

Figure 3:
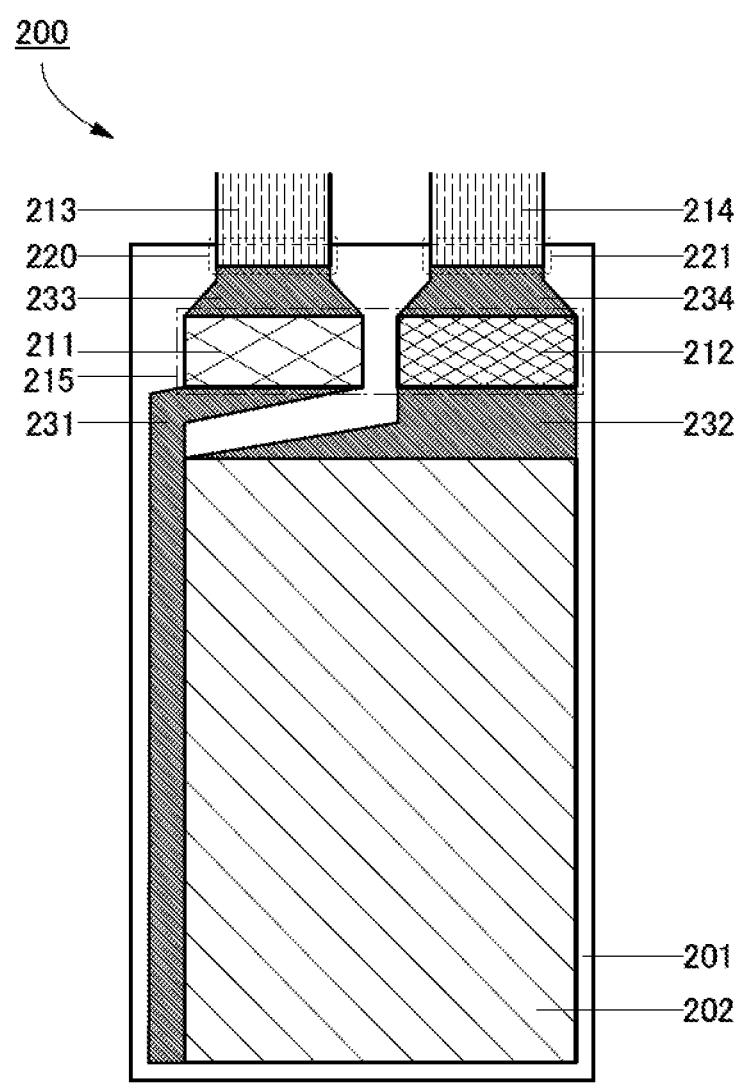
FIG. 3 is a top view illustrating an example of a touch sensor unit.
Figure 4:
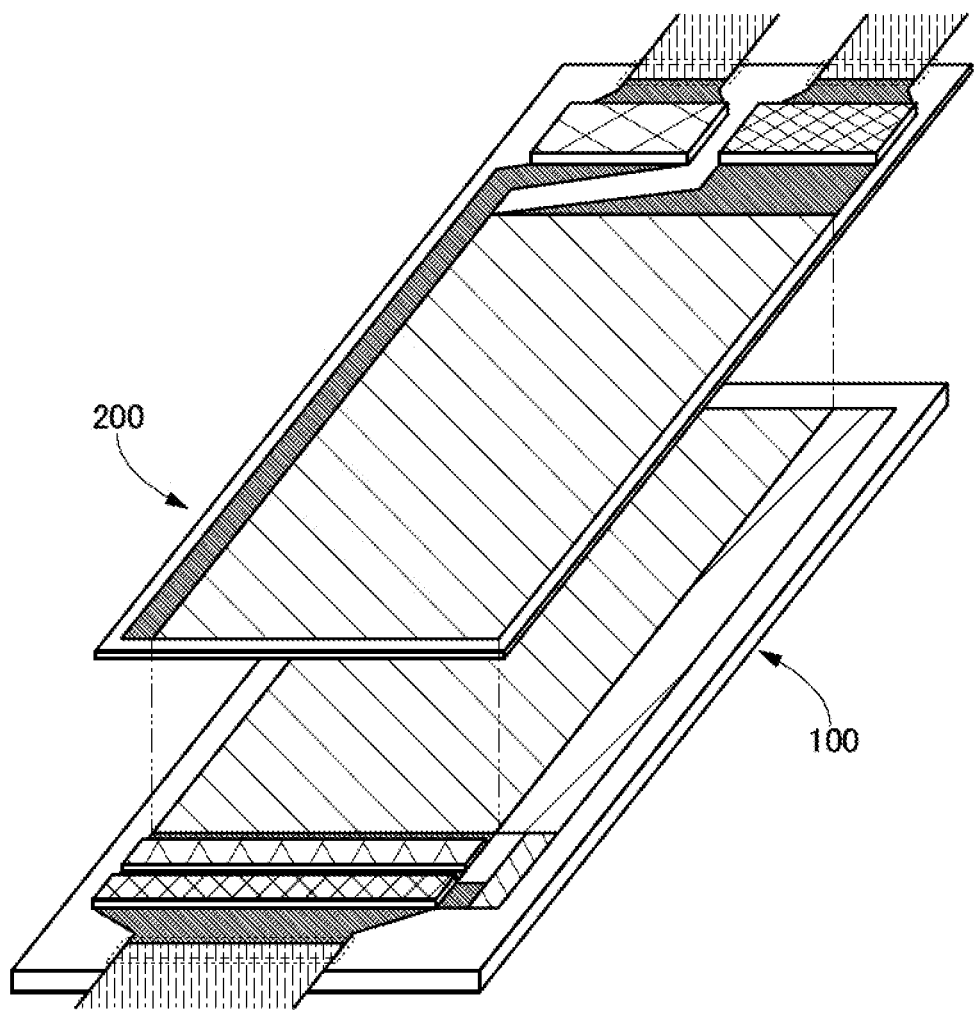
FIG. 4 is a perspective view illustrating an example in which a touch sensor unit is mounted over a display device.

Furthermore, a touch sensor unit can be provided in the display device 100 or the display device 100A. FIG. 3 illustrates a touch sensor unit that can be provided in the display device 100 or the display device 100A. FIG. 4 illustrates an example in which the touch sensor unit is provided in the display device 100.

A touch sensor unit 200 includes a sensor array 202, a touch sensor (TS) driver IC 211, and a sense circuit 212 over a base 201. In FIG. 3, the TS driver IC 211 and the sense circuit 212 are collectively shown as a peripheral circuit 215. The sensor array 202 is formed over the base 201. The TS driver IC 211 and the sense circuit 212 are mounted as components of an IC chip or the like, over the base 201, using an anisotropic conductive adhesive or an anisotropic conductive film by a COG method or the like. The touch sensor unit 200 is electrically connected to an FPC 213 and an FPC 214 as units for inputting a signal or the like from the outside. The TS driver IC 211 and the sense circuit 212 may be mounted on the FPC 213, the FPC 214, or the like by a COF method instead of a COG method.

In addition, wirings 231 to 234 are formed over the base 201 so that the circuits are electrically connected to each other. In the touch sensor unit 200, the TS driver IC 211 is electrically connected to the sensor array 202 through the wiring 231, and the TS driver IC 211 is electrically connected to the FPC 213 through the wiring 233. The sense circuit 212 is electrically connected to the sensor array 202 through the wiring 232, and the sense circuit 212 is electrically connected to the FPC 214 through the wiring 234.

A connection portion 220 between the wiring 233 and the FPC 213 has an anisotropic conductive adhesive, whereby electrical conduction between the FPC 213 and the wiring 233 can be obtained. Also, a connection portion 221 between the wiring 234 and the FPC 214 has an anisotropic conductive adhesive, whereby electrical conduction between the FPC 214 and the wiring 234 can be obtained.

The touch sensor unit 200 is provided to overlap with the display device 100 or the display device 100A, whereby the display device 100 or the display device 100A can have a function of a touch panel. FIG. 4 illustrates an example in which the touch sensor unit 200 overlaps with the display device 100 so that the display device 100 has a function of a touch panel.

This embodiment can be combined with any of the other embodiments in this specification as appropriate.

(Embodiment 2)

In this embodiment, the base 101 applicable to the display device 100 described in Embodiment 1 and a circuit that can be formed over the base 101 will be described.

<Base 101>

As the base 101, an insulator substrate or a conductor substrate can be used, for example. As the insulator substrate, a glass substrate, a quartz substrate, a sapphire substrate, a stabilized zirconia substrate (e.g., an yttria-stabilized zirconia substrate), or a resin substrate is used, for example. As the conductor substrate, for example, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Furthermore, as the base 101, a flexible substrate can be used. As a method for providing an element over a flexible substrate, an element is formed over a non-flexible substrate, and then the element is separated and transferred to a flexible substrate. In that case, a separation layer is preferably provided between the non-flexible substrate and the element. As the base 101, a sheet, a film, or foil containing a fiber may be used. The base 101 may have elasticity. The base 101 may have a property of returning to its original shape when bending or pulling is stopped. Alternatively, the base 101 may have a property of not returning to its original shape. The thickness of the base 101 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the base 101 has a small thickness, the weight of the display device 100 can be reduced. When the base 101 has a small thickness, even in the case of using glass or the like, the base 101 may have elasticity or a property of returning to its original shape when bending or pulling is stopped. Therefore, an impact applied to the semiconductor device over the base 101, which is caused by dropping or the like, can be reduced. That is, a durable semiconductor device can be provided.

For the flexible substrate, for example, metal, an alloy, a resin, glass, or fiber thereof can be used. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate because of its low coefficient of linear expansion.

<Pixel Circuit Included in Display Portion>

Next, a pixel circuit included in the display portion 102 and a pixel circuit included in the display portion 106 are described.

The pixel circuit in the display portion 102 includes one kind of a display element such as a liquid crystal element or a light-emitting element. The configuration of the pixel circuit in the display portion 102 depends on the kind of display element.

Figure 5A:
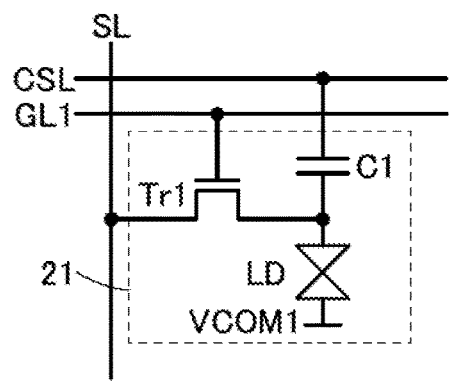
FIGS. 5A to 5E are circuit diagrams each illustrating a configuration example of a pixel.

FIG. 5A illustrates an example of a pixel circuit in which a liquid crystal element is used as a display element of the display portion 102. A pixel circuit 21 includes a transistor Tr1, a capacitor C1, and a liquid crystal element LD.

A first terminal of the transistor Tr1 is electrically connected to a wiring SL, a second terminal of the transistor Tr1 is electrically connected to a first terminal of the liquid crystal element LD, and a gate of the transistor Tr1 is electrically connected to a wiring GL1. A first terminal of the capacitor C1 is electrically connected to a wiring CSL, and a second terminal of the capacitor C1 is electrically connected to the first terminal of the liquid crystal element LD. A second terminal of the liquid crystal element LD is electrically connected to a wiring VCOM1.

The wiring SL functions as a signal line that supplies an image signal to the pixel circuit 21. The wiring GL1 functions as a scanning line that selects the pixel circuit 21. The wiring CSL functions as a capacitor wiring that holds a potential of the first terminal of the capacitor C1, i.e., a potential of the first terminal of the liquid crystal element LD. The wiring VCOM1 is a wiring that supplies a fixed potential such as 0 V or a GND potential as a common potential to the second terminal of the liquid crystal element LD.

In the case where a liquid crystal element is used as a display element of the display portion 102, the pixel circuit 21 is employed in the display portion 102, whereby an image can be displayed on the display portion 102.

Figure 5B:
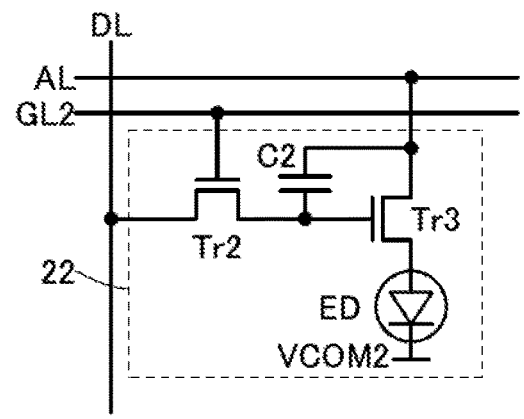

FIG. 5B illustrates an example of a pixel circuit in which a light-emitting element is used as a display element of the display portion 102. Note that the light-emitting element is an organic electroluminescence (EL) element. A pixel circuit 22 includes a transistor Tr2, a transistor Tr3, a capacitor C2, and a light-emitting element ED.

A first terminal of the transistor Tr2 is electrically connected to a wiring DL, a second terminal of the transistor Tr2 is electrically connected to a gate of the transistor Tr3, and a gate of the transistor Tr2 is electrically connected to the wiring GL2. A first terminal of the transistor Tr3 is electrically connected to a first terminal of the light-emitting element ED, and a second terminal of the transistor Tr3 is electrically connected to a wiring AL. A first terminal of the capacitor C2 is electrically connected to the second terminal of the transistor Tr3, and a second terminal of the capacitor C2 is electrically connected to the gate of the transistor Tr3. A second terminal of the light-emitting element ED is electrically connected to a wiring VCOM2.

The wiring DL functions as a signal line that supplies an image signal to the pixel circuit 22. The wiring GL2 functions as a scanning line that selects a pixel circuit 22. The wiring AL functions as a current supply line that supplies a current to the light-emitting element ED. The wiring VCOM2 is a wiring that supplies a fixed potential such as 0 V or a GND potential as a common potential to the second terminal of the light-emitting element ED.

The capacitor C2 has a function of holding a voltage between the second terminal of the transistor Tr3 and the gate of the transistor Tr3. Thus, the on-state current flowing through the transistor Tr3 can be kept constant. In the case where parasitic capacitance between the second terminal of the transistor Tr3 and the gate of the transistor Tr3 is large, the capacitor C2 is not necessarily provided.

Figure 5C:
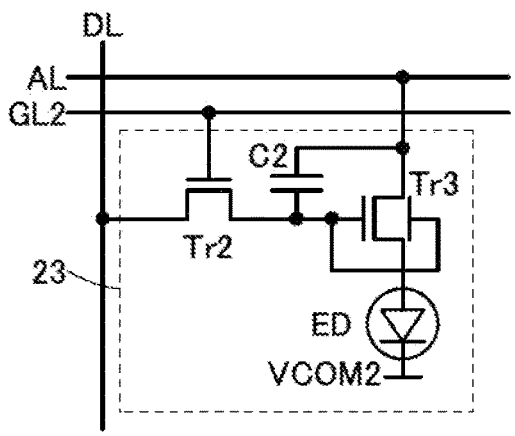

In the case where a light-emitting element is used as a display element of the display portion 102, a pixel circuit 23 illustrated in FIG. 5C, which has a different configuration from the pixel circuit 22, may be employed.

The pixel circuit 23 has a configuration where a back gate is provided for the transistor Tr3 in the pixel circuit 22, and the back gate of the transistor Tr3 is electrically connected to the gate of the transistor Tr3. Such a configuration enables an increase in the amount of on-state current flowing through the transistor Tr3.

Figure 5D:
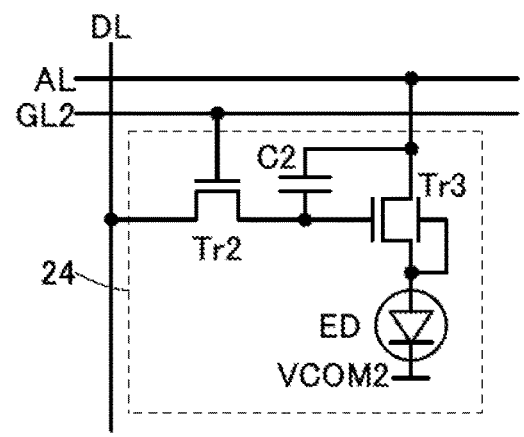

In the case where a light-emitting element is used as a display element of the display portion 102, a pixel circuit 24 illustrated in FIG. 5D, which has a different configuration from the pixel circuit 22 and the pixel circuit 23, may be used.

The pixel circuit 24 has a configuration where a back gate is provided for the transistor Tr3 in the pixel circuit 22, and the back gate of the transistor Tr3 is electrically connected to the first terminal of the transistor Tr3. Such a configuration enables suppression of a shift of the threshold voltage of the transistor Tr3. For this reason, the reliability of the transistor Tr3 can be improved.

Figure 5E:
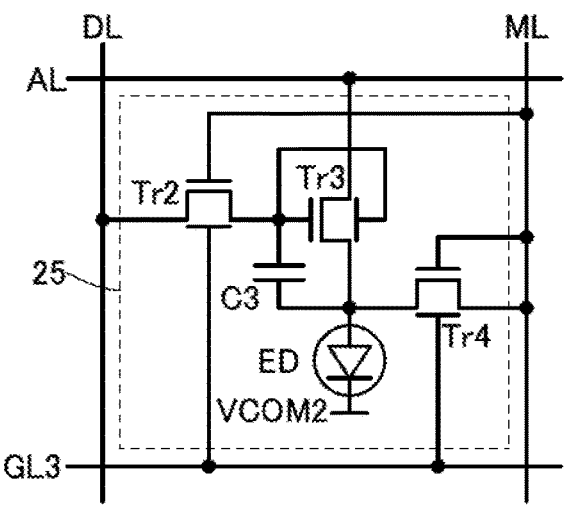

In the case where a light-emitting element is used as a display element of the display portion 102, a pixel circuit 25 illustrated in FIG. 5E, which is a different configuration from the pixel circuits 22 to 24, may be used.

The pixel circuit 25 includes the transistor Tr2, the transistor Tr3, and a transistor Tr4, a capacitor C3, and the light-emitting element ED.

The first terminal of the transistor Tr2 is electrically connected to the wiring DL, the second terminal of the transistor Tr2 is electrically connected to the gate of the transistor Tr3, the gate of the transistor Tr2 is electrically connected to a wiring ML, and the back gate of the transistor Tr2 is electrically connected to a wiring GL3. The first terminal of the transistor Tr3 is electrically connected to the first terminal of the light-emitting element ED, the second terminal of the transistor Tr3 is electrically connected to the wiring AL, and the gate of the transistor Tr3 is electrically connected to the back gate of the transistor Tr3. A first terminal of the transistor Tr4 is electrically connected to the first terminal of the light-emitting element ED, a second terminal of the transistor Tr4 is electrically connected to the wiring ML, a gate of the transistor Tr4 is electrically connected to the wiring ML, and a back gate of the transistor Tr4 is electrically connected to the wiring GL3. A first terminal of the capacitor C3 is electrically connected to the gate of the transistor Tr3, and the second terminal of the capacitor C3 is electrically connected to the first terminal of the transistor Tr3. The second terminal of the light-emitting element ED is electrically connected to the wiring VCOM2.

The wiring DL functions as a signal line that supplies an image signal to the pixel circuit 25. The wiring GL3 functions as a wiring which applies a fixed potential to control threshold voltages of the transistor Tr2 and the transistor Tr4. The wiring ML is a wiring that applies a potential to the gate of the transistor Tr2, the second terminal of the transistor Tr4, and the gate of the transistor Tr4, which functions as a scanning line that selects the pixel circuit 22. For the wiring AL and the wiring VCOM2, the description of the wiring AL and the wiring VCOM2 for the pixel circuit 22 is referred to.

With such a configuration, the threshold voltages of the transistor Tr2 and the transistor Tr4 are controlled, whereby a variation in luminance of a plurality of light-emitting elements ED in the display portion 106 can be corrected. Thus, when the pixel circuit 25 is used in the display portion 102, the display device 100 with favorable display quality can be provided.

Next, a pixel circuit of the display portion 106 is described. As described above, the display portion 106 is provided in a hybrid display device, and thus both a reflective element and a light-emitting element are provided. In other words, a pixel configuration in the display portion 106 is different from the pixel configuration in the display portion 102. Here, a case in which a liquid crystal element and an organic EL element are used as the reflective element and the light-emitting element, respectively, is considered. In this case, a pixel circuit used in the display portion 106 is described.

Figure 6A:
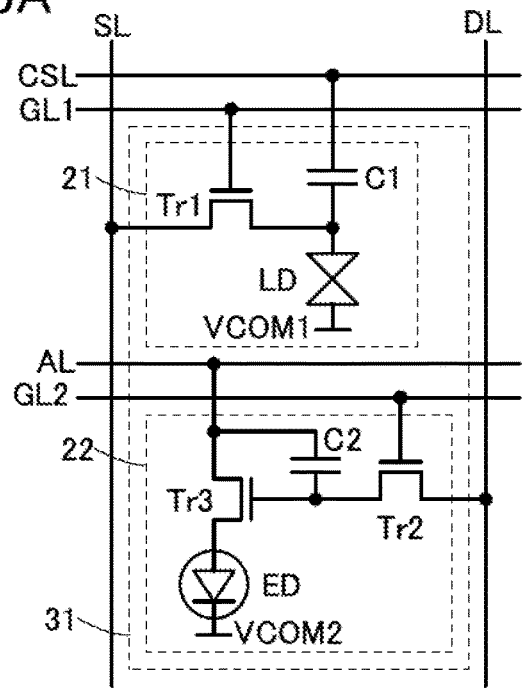
FIGS. 6A and 6B are circuit diagrams each illustrating a configuration example of a pixel.

FIG. 6A illustrates an example of a pixel circuit used in the display portion 106. A pixel circuit 31 includes the pixel circuit 21 and the pixel circuit 22. In the pixel circuit 31, the pixel circuit 21 is supplied with an image signal from the wiring SL, and the pixel circuit 22 is supplied with an image signal from the wiring DL, whereby a luminance expressed by the liquid crystal element LD and a luminance expressed by the light-emitting element ED can be controlled independently.

FIG. 6A illustrates an example of a pixel circuit including one pixel circuit 21 and one pixel circuit 22; however, the configuration of the pixel circuit in the display portion 106 is not limited thereto. The pixel circuit in the display portion 106 may include a plurality of pixel circuits 21 and/or a plurality of pixel circuits 22.

Figure 6B:
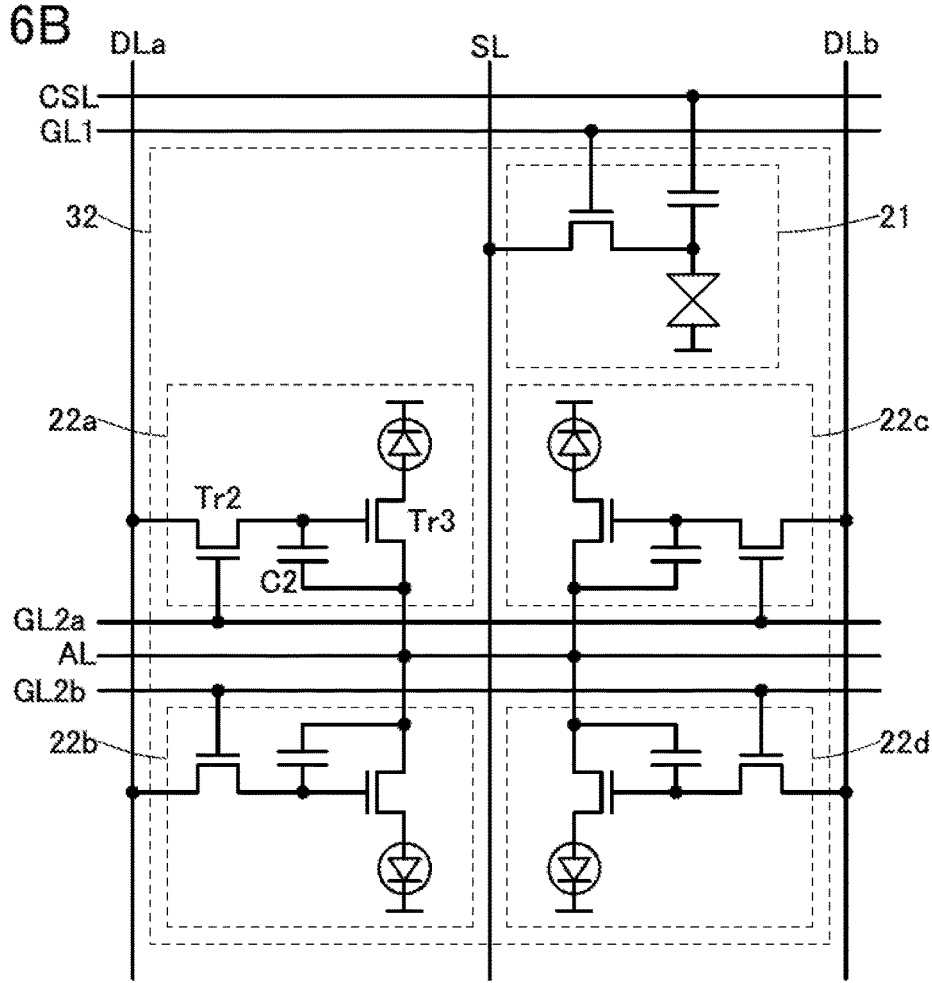

As an example, FIG. 6B illustrates a pixel circuit including one pixel circuit 21 and four pixel circuits 22. A pixel circuit 32 includes the pixel circuit 21 and pixel circuits 22a to 22d. Each of the pixel circuits 22a to 22d has the same configuration as the pixel circuit 22.

The gate of the transistor Tr2 included in each of the pixel circuits 22a and 22c is electrically connected to a wiring GL2a. The gate of the transistor Tr2 included in each of the pixel circuits 22b and 22d is electrically connected to a wiring GL2b.

The first terminal of the transistor Tr2 included in each of the pixel circuits 22a and 22b is electrically connected to a wiring DLa. The first terminal of the transistor Tr2 included in each of the pixel circuits 22c and 22d is electrically connected to a wiring DLb.

The second terminal of the transistor Tr3 included in each of the pixel circuits 22a to 22d is electrically connected to the wiring AL.

Each of the wiring GL2a and the wiring GL2b has a function similar to that of the wiring GL2 for the pixel circuit 22. Each of the wiring DLa and the wiring DLb has a function similar to that of the wiring DL for the pixel circuit 22.

As described above, in the pixel circuits 22a to 22d, the wiring GL2a is shared between the pixel circuit 22a and the pixel circuit 22c, and the wiring GL2b is shared between the pixel circuit 22b and the pixel circuit 22d. However, such a configuration that one wiring GL2 is shared between all of the pixel circuits 22a to 22d may be employed. In this case, it is preferable that the pixel circuits 22a to 22d be electrically connected to respective four wirings DL.

The light-emitting elements ED included in the pixel circuits 22a to 22d emit light having wavelengths in different ranges; thus, the display device including the display portion 106 can display a color image.

For example, light emitted from the light-emitting element ED included in the pixel circuit 22a is red light, light emitted from the light-emitting element ED included in the pixel circuit 22b is green light, and light emitted from the light-emitting element ED included in the pixel circuit 22c is blue light. Accordingly, the pixel circuit 32 can emit light of three primary colors. Thus, the pixel circuit 32 can express a variety of colors in accordance with a supplied image signal.

In addition to the above, for example, when light emitted from the light-emitting element ED included in the pixel circuit 22d is white light, the emission luminance of the display portion 106 can be improved. Furthermore, the color temperature of the white light is adjusted, whereby display quality of the display device including the display portion 106 can be improved.

Figure 7A:
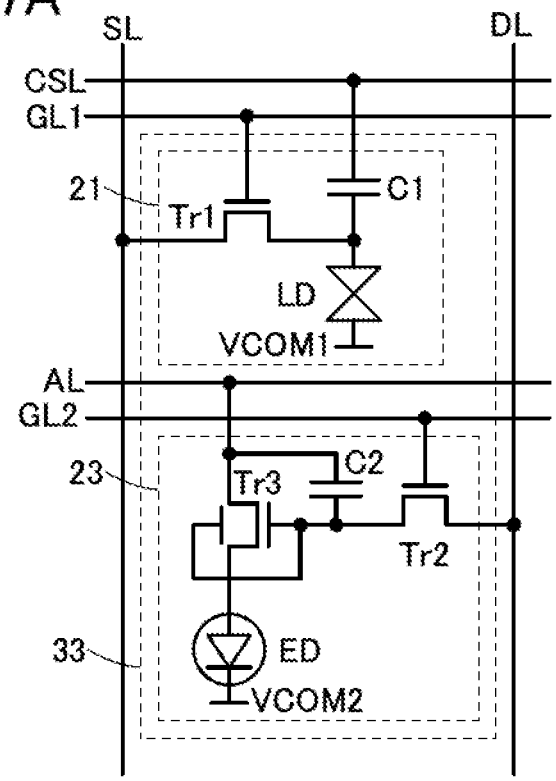
FIGS. 7A and 7B are circuit diagrams each illustrating a configuration example of a pixel.

FIG. 7A illustrates a pixel circuit that can be used in the display portion 106 and is a different from the pixel circuit 31 and the pixel circuit 32. A pixel circuit 33 includes the pixel circuit 21 and the pixel circuit 23. As in the pixel circuit 31, in the pixel circuit 33, the pixel circuit 21 is supplied with an image signal from the wiring SL, and the pixel circuit 23 is supplied with an image signal from the wiring DL, whereby a luminance expressed by the liquid crystal element LD and a luminance expressed by the light-emitting element ED can be controlled independently.

As described above, in the pixel circuit 23, the gate of the transistor Tr3 is electrically connected to the back gate of the transistor Tr3, so that the on-state current of the transistor Tr3 can be increased.

Although the pixel circuit 33 in FIG. 7A includes one pixel circuit 21 and one pixel circuit 23, a configuration of a pixel circuit in the display portion 106 is not limited thereto. The pixel circuit included in the display portion 106 may include a plurality of pixel circuits 21 and/or a plurality of pixel circuits 23. For example, the pixel circuit in the display portion 106 may include one pixel circuit 21 and four pixel circuits 23 as in the pixel circuit 32 illustrated in FIG. 6B. Such a circuit configuration (not illustrated) is obtained by electrically connecting the gates of the transistors Tr3 to the respective back gates of the transistors Tr3 in the pixel circuits 22a to 22d in the pixel circuit 32 illustrated in FIG. 6B.

Figure 7B:
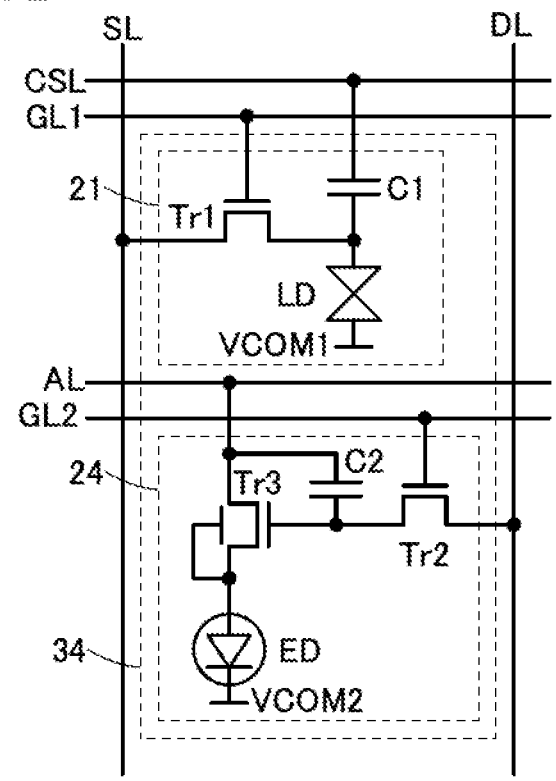

FIG. 7B illustrates a pixel circuit that can be used in the display portion 106 and is different from the pixel circuits 31 to 33. A pixel circuit 34 includes the pixel circuit 21 and the pixel circuit 24. In the pixel circuit 34, as in the pixel circuit 31 and the pixel circuit 33, the pixel circuit 21 is supplied with an image signal from the wiring SL, and the pixel circuit 24 is supplied with an image signal from the wiring DL, whereby a luminance expressed by the liquid crystal element LD and a luminance expressed by the light-emitting element ED can be controlled independently.

As described above, in the pixel circuit 24, the first terminal of the transistor Tr3 is electrically connected to the back gate of the transistor Tr3, so that a shift of the threshold voltage of the transistor Tr3 can be suppressed.

Although the pixel circuit 34 in FIG. 7B includes one pixel circuit 21 and one pixel circuit 23, a configuration of a pixel circuit in the display portion 106 is not limited thereto. The pixel circuit included in the display portion 106 may include a plurality of pixel circuits 21 and/or a plurality of pixel circuits 24. For example, the pixel circuit in the display portion 106 may one pixel circuit 21 and four pixel circuits 24 as in the pixel circuit 32 illustrated in FIG. 6B. Such a circuit configuration (not illustrated) is obtained by electrically connecting the first terminals of the transistors Tr3 to the respective back gates of the transistors Tr3 in the pixel circuits 22a to 22d in the pixel circuit 32 illustrated in FIG. 6B.

Figure 8:
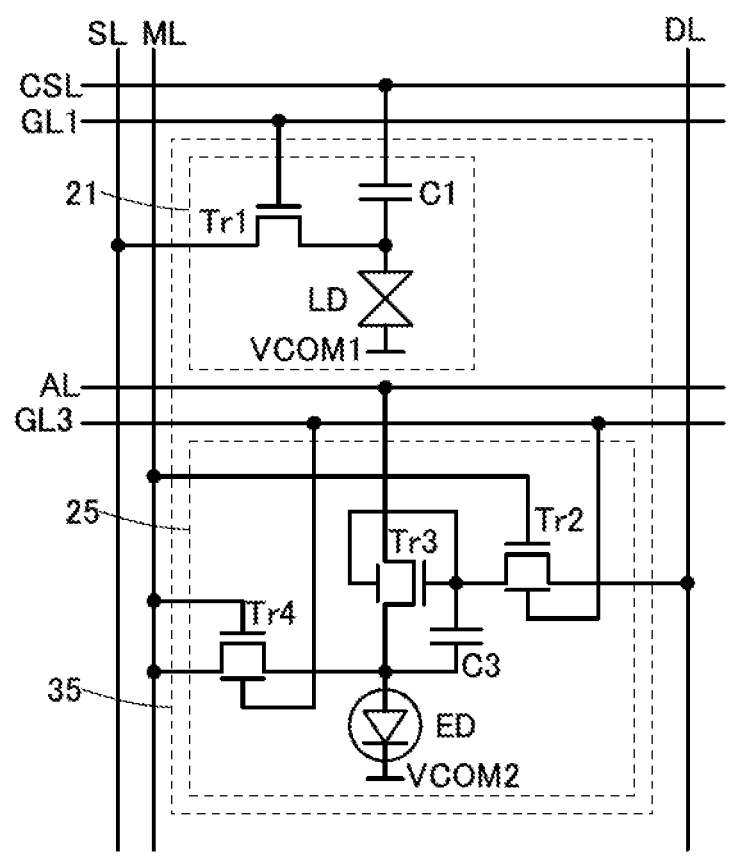
FIG. 8 is a circuit diagram illustrating a configuration example of a pixel.

FIG. 8 illustrates a pixel circuit that can be used in the display portion 106 and is different from the pixel circuits 31 to 34. A pixel circuit 35 includes the pixel circuit 21 and the pixel circuit 25. In the pixel circuit 35, as in the pixel circuit 31 and the pixel circuit 34, the pixel circuit 21 is supplied with an image signal from the wiring SL, and the pixel circuit 25 is supplied with an image signal from the wiring DL, whereby a luminance expressed by the liquid crystal element LD and a luminance expressed by the light-emitting element ED can be controlled independently.

As described above, in the pixel circuit 25, the back gate of the transistor Tr2 and the back gate of the transistor Tr4 are electrically connected to the wiring GL3, so that the threshold voltages of the transistor Tr2 and the transistor Tr4 can be controlled. Thus, a variation in luminance of a plurality of light-emitting elements ED in the display portion 106 can be corrected.

Figure 9:
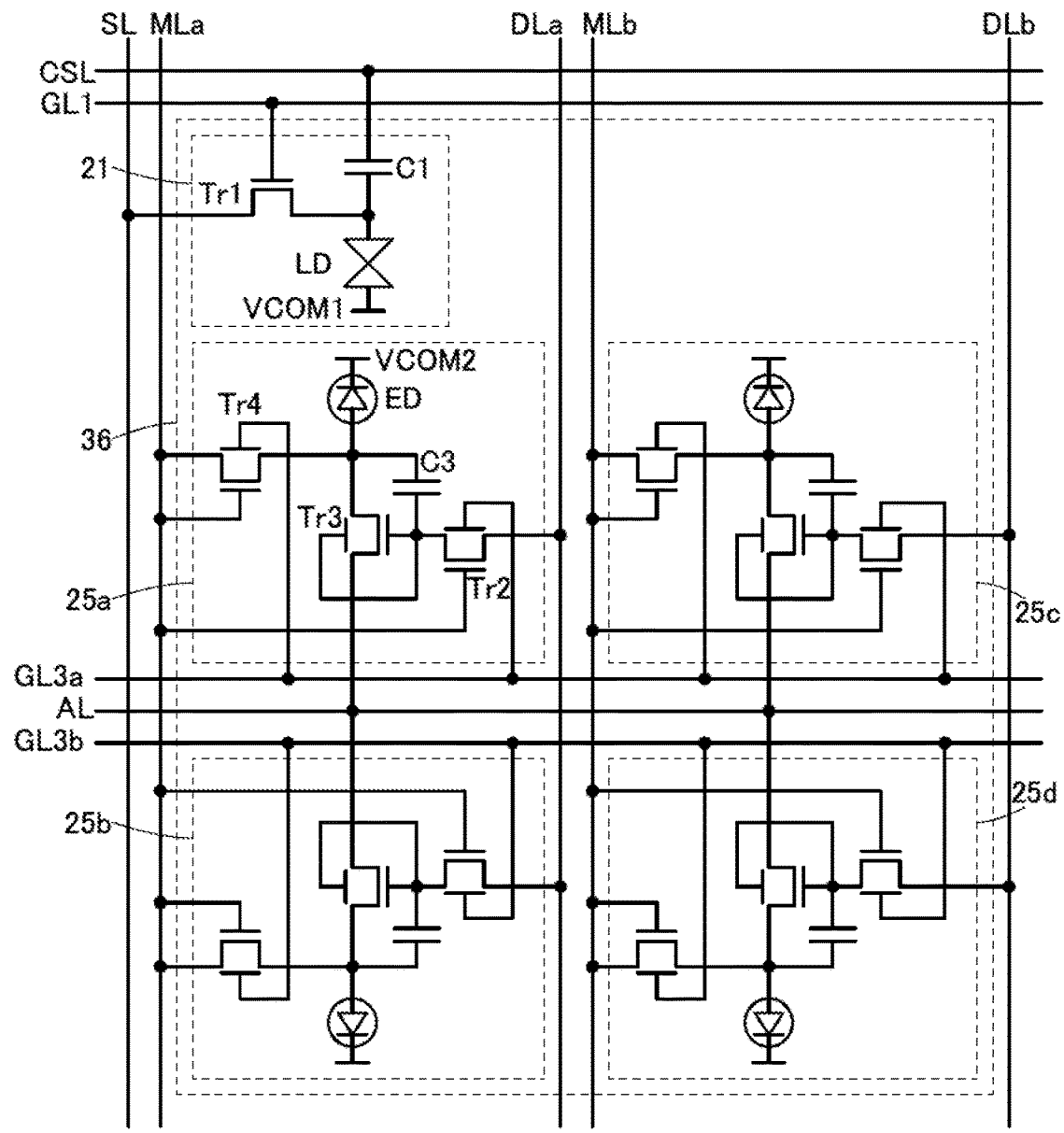
FIG. 9 is a circuit diagram illustrating a configuration example of a pixel.

Although the pixel circuit 35 in FIG. 8 includes one pixel circuit 21 and one pixel circuit 25, a configuration of a pixel circuit in the display portion 106 is not limited thereto. The pixel circuit included in the display portion 106 may include a plurality of pixel circuits 21 and/or a plurality of pixel circuits 25. For example, the pixel circuit in the display portion 106 may one pixel circuit 21 and four pixel circuits 25 as in the pixel circuit 32 illustrated in FIG. 6B. A configuration example in such a case is illustrated in FIG. 9. A pixel circuit 36 includes the pixel circuit 21 and pixel circuits 25a to 25d. Each of the pixel circuits 25a to 25d has the same configuration as the pixel circuit 25.

The back gate of the transistor Tr2 and the back gate of the transistor Tr4 included in each of the pixel circuits 25a and 25c are electrically connected to a wiring GL3a. The back gate of the transistor Tr2 and the back gate of the transistor Tr4 included in each of the pixel circuits 25b and 25d are electrically connected to a wiring GL3b.

The first terminal of the transistor Tr2 included in each of the pixel circuits 25a and 25b is electrically connected to the wiring DLa. The first terminal of the transistor Tr2 included in each of the pixel circuits 25c and 25d is electrically connected to the wiring DLb.

The second terminal of the transistor Tr4 included in each of the pixel circuits 25a and 25b is electrically connected to a wiring MLa. The second terminal of the transistor Tr4 included in each of the pixel circuits 25c and 25d is electrically connected to a wiring MLb.

The second terminal of the transistor Tr3 included in each of the pixel circuits 25a to 25d is electrically connected to the wiring AL.

The wiring GL3a and the wiring GL3b have a function similar to that of the wiring GL3 of the pixel circuit 25. The wiring DLa and the wiring DLb have a function similar to that of the wiring DL of the pixel circuit 25. The wiring MLa and the wiring MLb have a function similar to that of the wiring ML of the pixel circuit 25.

As described above, in the pixel circuits 25a to 25d, the wiring GL3a is shared between the pixel circuit 25a and the pixel circuit 25c, and the wiring GL3b is shared between the pixel circuit 25b and the pixel circuit 25d. However, such a configuration that one wiring GL3 is shared between all of the pixel circuits 25a to 25d may be employed. In this case, it is preferable that the pixel circuits 25a to 25d be electrically connected to respective four wirings DL.

When the light-emitting elements ED included in the pixel circuits 25a to 25d emit light having wavelengths in different ranges as in the case of the pixel circuit 32, the display device including the display portion 106 can display a color image. For this configuration, the description of the pixel circuit 32 is referred to.

<Gate Driver>

Next, an example of the gate driver 103 that can be formed over the base 101 is described.

«Circuit Configuration of Gate Driver»

Figure 10A:
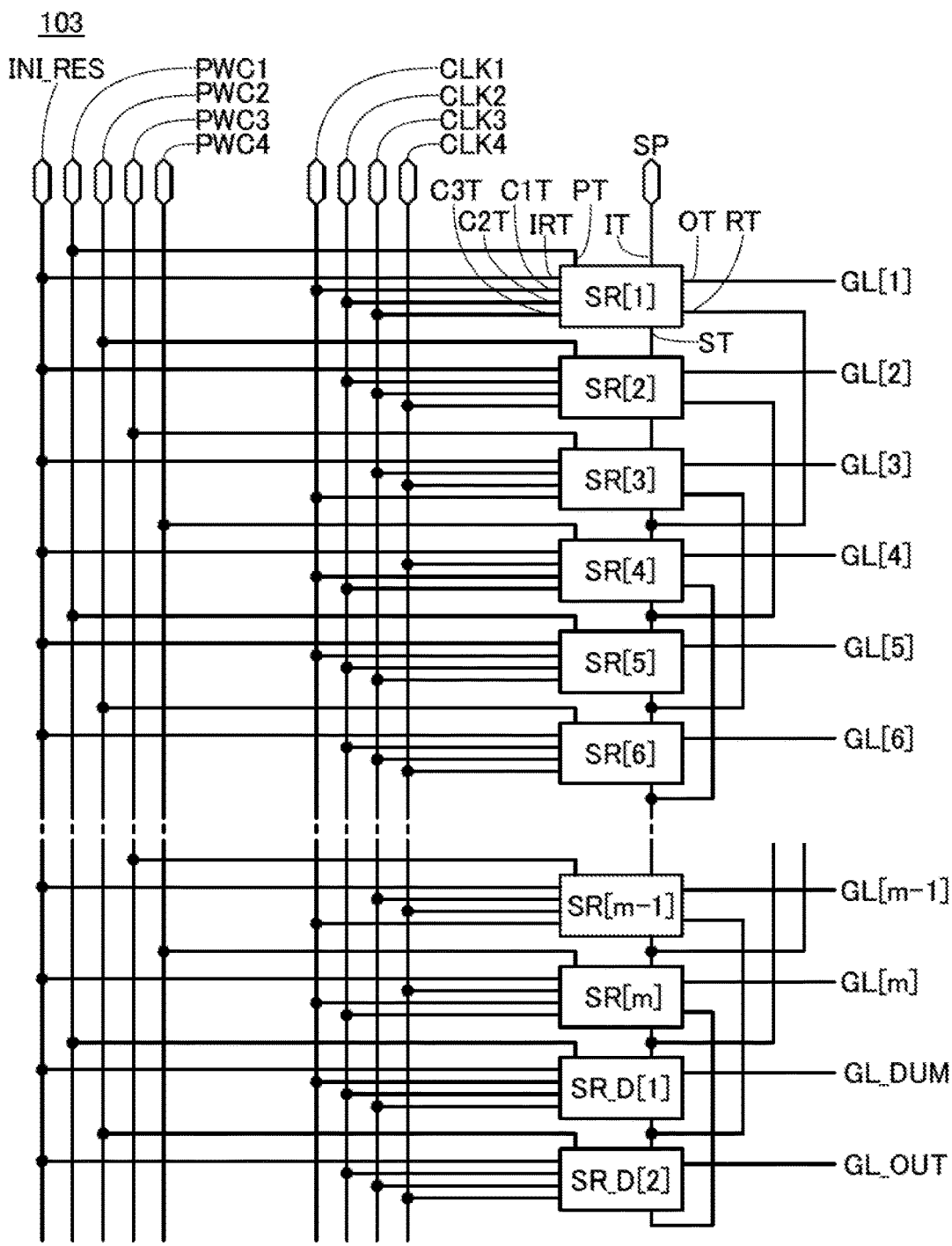
FIGS. 10A to 10C are a block diagram illustrating a structure example of a gate driver, and diagrams illustrating circuits included in the gate driver.

FIG. 10A is a circuit diagram illustrating an example of the gate driver 103. The gate driver 103 includes circuits SR[1] to SR[m], a circuit SR_D[1], and a circuit SR_D[2]. In the gate driver 103, a shift register is composed of the circuits SR[1] to SR[m], the circuit SR_D[1], and the circuit SR_D[2]. Note that m is an integer greater than or equal to 1, which indicates the number of pixel circuits in one column of the display portion 102 or the display portion 106.

Figure 10B:
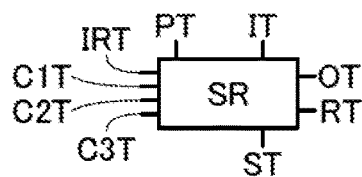
Figure 10C:
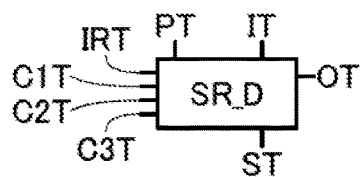

With use of FIGS. 10B and 10C, terminals provided for the circuits SR[1] to SR[m], the circuit SR_D[1], and the circuit SR_D[2] are described. In FIG. 10B, a circuit SR represents one of the circuits SR[1] to SR[m]. In FIG. 10C, a circuit SR_D represents either the circuit SR_D[1] or the circuit SR_D[2].

The circuit SR includes a terminal IT, a terminal OT, a terminal RT, a terminal ST, a terminal PT, a terminal IRT, a terminal C1T, a terminal C2T, and a terminal C3T. The circuit SR_D includes the terminal IT, the terminal OT, the terminal ST, the terminal PT, the terminal IRT, the terminal C1T, the terminal C2T, and the terminal C3T.

The terminal IT is an input terminal to which a start pulse signal or a signal outputted from the terminal ST of the circuit SR in the previous stage is inputted. The terminal OT is an output terminal that is electrically connected to a pixel circuit in the display portion 102 or the display portion 106. The terminal ST is an output terminal that transmits a signal to the circuit SR in a next stage. To the terminal RT, a signal from the terminal ST of the circuit SR in a stage that follows the next stage is inputted.

A start pulse signal SP is a signal that is inputted when the gate driver 103 is driven. The start pulse signal SP is inputted to the gate driver 103 from the controller IC 112 through the level shifter 104 every time an image for one frame is displayed on the display device 100.

To the terminal PT, a signal (pulse width control signal) that controls the pulse width of a signal outputted from the terminal OT is inputted. Pulse width control signals PWC1 to PWC4 are signals controlling widths of pulse signals outputted to wirings GL[1] to GL[m], a wiring GL_DUM, and a wiring GL_OUT.

To the terminal IRT, an initialization reset signal INI_RES is inputted. Clock signals different from each other are inputted to the terminal C1T, the terminal C2T, and the terminal C3T.

A clock signal CLK2 has the same wavelength and the same cycle as the clock signal CLK1, and the transmission of the clock signal CLK2 is delayed from that of the clock signal CLK1 by a ¼ cycle. A clock signal CLK3 is an inverted signal of the clock signal CLK1, and a clock signal CLK4 is an inverted signal of the clock signal CLK2.

Next, a specific circuit configuration of the gate driver 103 will be described. The start pulse signal SP is inputted to the terminal IT of the circuit SR[1]. The terminal ST of the circuit SR[i] (i is an integer greater than or equal to 1 and less than or equal to (m−1)) is electrically connected to the terminal IT of the circuit SR[i+1]. The terminal ST of the circuit SR[m] is electrically connected to the terminal IT of the circuit SR_D[1], and the terminal ST of the circuit SR_D[1] is electrically connected to the terminal IT of the circuit SR_D[2].

The terminal RT of the circuit SR[p] (p is an integer greater than or equal to 1 and less than or equal to (m−2)) is electrically connected to the terminal ST of the circuit SR[p+2]. The terminal RT of the circuit SR[m−1] is electrically connected to the terminal ST of the circuit SR_D[1], and the terminal RT of the circuit SR[m] is electrically connected to the terminal ST of the circuit SR_D[2].

The terminal OT of the circuit SR[x] (x is an integer greater than or equal to 1 and less than or equal to m) is electrically connected to a wiring GL[x]. The terminal OT of the circuit SR_D[1] is electrically connected to the wiring GL_DUM, and the terminal OT of the circuit SR_D[2] is electrically connected to the wiring GL_OUT. The wiring GL_DUM functions as a dummy wiring, and the wiring GL_OUT has a function of transmitting a data signal informing that the start pulse signal reaches the circuit SR_D[2] (the last stage of the shift register of the gate driver 103).

To the terminal IRT of each of the circuit SR[x], the circuit SR_D[1], and the circuit SR_D[2], the initialization reset signal INI_RES is inputted.

To the terminal C1T of the circuit SR[s] (s is an integer greater than or equal to 1 and less than or equal to m, where the relation, s=4a+1, is satisfied, and a is an integer greater than or equal to 0), the clock signal CLK1 is inputted. To the terminal C2T of the circuit SR[s], the clock signal CLK2 is inputted. To the terminal C3T of the circuit SR[s], the clock signal CLK3 is inputted. To the terminal PT of the circuit SR[s], the pulse width control signal PWC1 is inputted.

To the terminal C1T of the circuit SR[s+1], the clock signal CLK2 is inputted. To the terminal C2T of the circuit SR[s+1], the clock signal CLK3 is inputted. To the terminal C3T of the circuit SR[s+1], the clock signal CLK4 is inputted. To the terminal PT of the circuit SR[s+1], the pulse width control signal PWC2 is inputted.

To the terminal C1T of the circuit SR[s+2], the clock signal CLK3 is inputted. To the terminal C2T of the circuit SR[s+2], the clock signal CLK4 is inputted. To the terminal C3T of the circuit SR[s+2], the clock signal CLK1 is inputted. To the terminal PT of the circuit SR[s+2], the pulse width control signal PWC3 is inputted.

To the terminal C1T of the circuit SR[s+3], the clock signal CLK4 is inputted. To the terminal C2T of the circuit SR[s+3], the clock signal CLK1 is inputted. To the terminal C3T of the circuit SR[s+3], the clock signal CLK2 is inputted. To the terminal PT of the circuit SR[s+3], the pulse width control signal PWC4 is inputted.

Note that in the gate driver 103 in FIG. 10A, the input of the clock signal and the pulse width control signal to the circuit SR[m−1] is performed in a manner similar to that of the input of the clock signal and the pulse width control signal to the circuit SR[s+2]. Furthermore, the input of the clock signal and the pulse width control signal to the circuit SR[m] is performed in a manner similar to that of the input of the clock signal and the pulse width control signal to the circuit SR[s+3]. Furthermore, the input of the clock signal and the pulse width control signal to the circuit SR_D[1] is performed in a manner similar to that of the input of the clock signal and the pulse width control signal to the circuit SR[s]. The input of the clock signal and the pulse width control signal to the circuit SR_D[2] is performed in a manner similar to that of the input of the clock signal and the pulse width control signal to the circuit SR[s+1].

Note that in this specification, the clock signal CLK1, the clock signal CLK2, the clock signal CLK3, the clock signal CLK4, the pulse width control signal PWC1, the pulse width control signal PWC2, the pulse width control signal PWC3, the pulse width control signal PWC4, and the start pulse signal SP are collectively referred to as a timing signal in some cases. In a display device of one embodiment of the present invention, the timing signal is generated by the controller IC 112.

Note that in the gate driver 103 in FIG. 10A, only the following components are illustrated: the circuit SR[1], the circuit SR[2], the circuit SR[3], the circuit SR[4], the circuit SR[5], the circuit SR[6], the circuit SR[m−1], the circuit SR[m], the circuit SR_D[1], the circuit SR_D[2], the wiring GL[1], the wiring GL[2], the wiring GL[3], the wiring GL[4], the wiring GL[5], the wiring GL[6], the wiring GL[m−1], the wiring GL[m], the wiring GL_DUM, the wiring GL_OUT, the terminal IT, the terminal OT, the terminal RT, the terminal ST, the terminal PT, the terminal IRT, the terminal C1T, the terminal C2T, the terminal C3T, the clock signal CLK1, the clock signal CLK2, the clock signal CLK3, the clock signal CLK4, the pulse width control signal PWC1, the pulse width control signal PWC2, the pulse width control signal PWC3, the pulse width control signal PWC4, and the initialization reset signal INI_RES. Description of the other circuits, wirings, and numerals are omitted.

Figure 11:
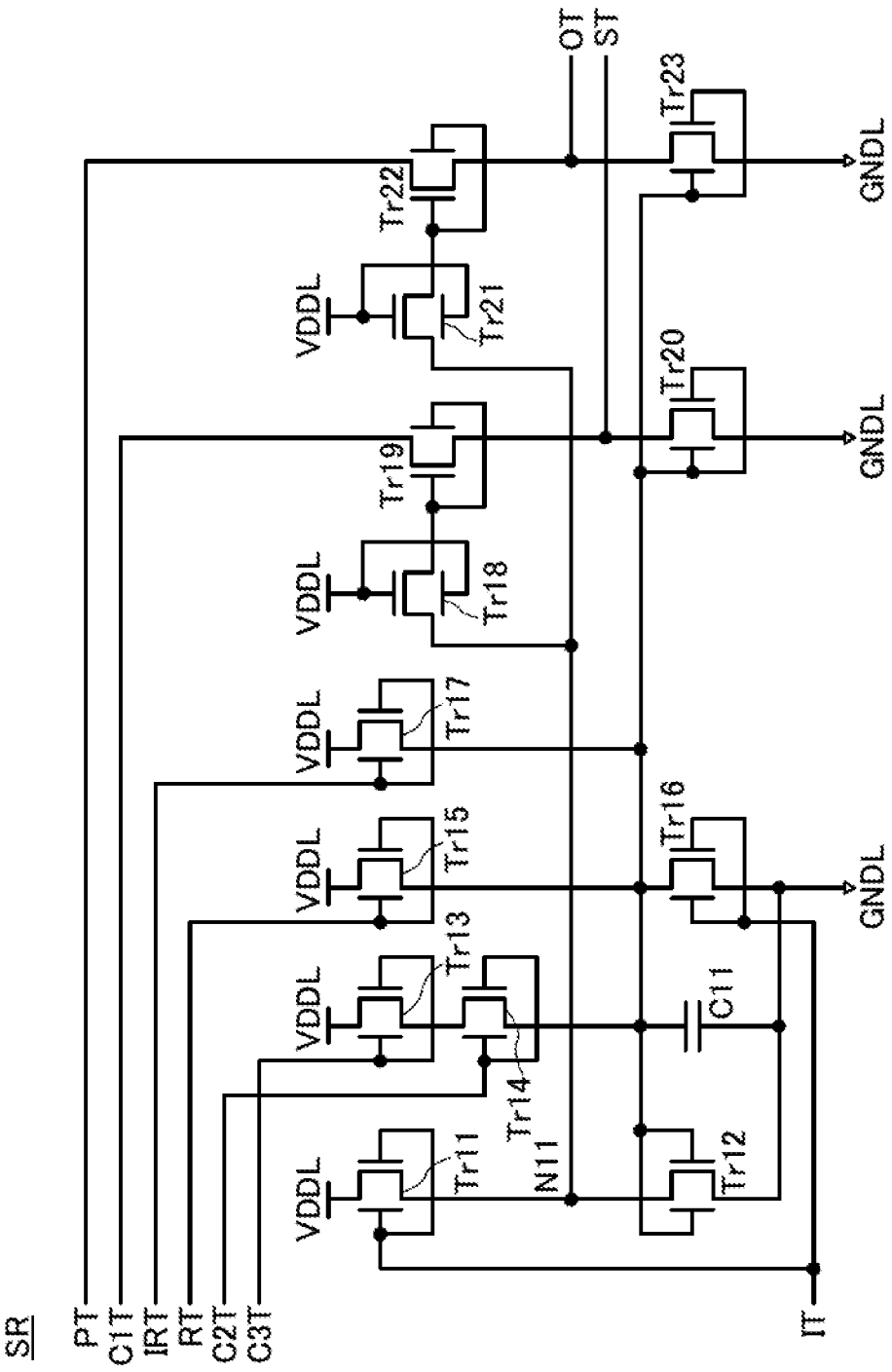
FIG. 11 is a circuit diagram illustrating a circuit included in a gate driver.

Next, circuit configurations of the circuits SR[1] to SR[m] are described. FIG. 11 illustrates a configuration of the circuit SR in FIG. 10B.

The circuit SR is formed not using a p-channel transistor but using an n-channel transistor. The circuit SR includes transistors Tr11 to Tr23 and a capacitor C11. Note that each of the transistors Tr11 to Tr23 is provided with a back gate.

A wiring VDDL illustrated in the circuit SR in FIG. 11 is a wiring for applying a potential VDD that is a high-level potential. A wiring GNDL illustrated in the circuit SR in FIG. 11 is a wiring for applying a GND potential.

A first terminal of the transistor Tr11 is electrically connected to the wiring VDDL, a second terminal of the transistor Tr11 is electrically connected to a first terminal of the transistor Tr21, and a gate and the back gate of the transistor Tr11 are electrically connected to the terminal IT. A first terminal of the transistor Tr12 is electrically connected to the first terminal of the transistor Tr21, a second terminal of the transistor Tr12 is electrically connected to the wiring GNDL, and a gate and a back gate of the transistor Tr12 are electrically connected to a gate and the back gate of the transistor Tr23. A connection portion between the second terminal of the transistor Tr11 and the first terminal of the transistor Tr12 is referred to as a node N11.

A first terminal of the transistor Tr13 is electrically connected to the wiring VDDL, a second terminal of the transistor Tr13 is electrically connected to a first terminal of the transistor Tr14, and a gate and the back gate of the transistor Tr13 are electrically connected to the terminal C3T. A second terminal of the transistor Tr14 is electrically connected to the gate and the back gate of the transistor Tr23, and a gate and the back gate of the transistor Tr14 are electrically connected to the terminal C2T. A first terminal of the capacitor C11 is electrically connected to the gate and the back gate of the transistor Tr23, and a second terminal of the capacitor C11 is electrically connected to the wiring GNDL.

A first terminal of the transistor Tr15 is electrically connected to the wiring VDDL, a second terminal of the transistor Tr15 is electrically connected to the gate and the back gate of the transistor Tr23, and a gate and the back gate of the transistor Tr15 are electrically connected to the terminal RT. A first terminal of the transistor Tr16 is electrically connected to the gate and the back gate of the transistor Tr23, a second terminal of the transistor Tr16 is electrically connected to the wiring GNDL, and a gate and the back gate of the transistor Tr16 are electrically connected to the terminal IT.

A first terminal of the transistor Tr17 is electrically connected to the wiring VDDL, a second terminal of the transistor Tr17 is electrically connected to the gate and the back gate of the transistor Tr23, and a gate and the back gate of the transistor Tr17 is electrically connected to the terminal IRT.

A first terminal of the transistor Tr18 is electrically connected to the first terminal of the transistor Tr21, a second terminal of the transistor Tr18 is electrically connected to a gate and the back gate of the transistor Tr19, and a gate and the back gate of the transistor Tr18 is electrically connected to the wiring VDDL. A first terminal of the transistor Tr19 is electrically connected to the terminal C1T, and a second terminal of the transistor Tr19 is electrically connected to the terminal ST. A first terminal of the transistor Tr20 is electrically connected to the terminal ST, a second terminal of the transistor Tr20 is electrically connected to the wiring GNDL, and a gate and the back gate of the transistor Tr20 are electrically connected to the gate and the back gate of the transistor Tr23.

A second terminal of the transistor Tr21 is electrically connected to a gate and the back gate of the transistor Tr22, and a gate and the back gate of the transistor Tr21 is electrically connected to the wiring VDDL. A first terminal of the transistor Tr22 is electrically connected to the terminal PT, and a second terminal of the transistor Tr22 is electrically connected to the terminal OT. A first terminal of the transistor Tr23 is electrically connected to the terminal OT, and a second terminal of the transistor Tr23 is electrically connected to the wiring GNDL.

Figure 12:
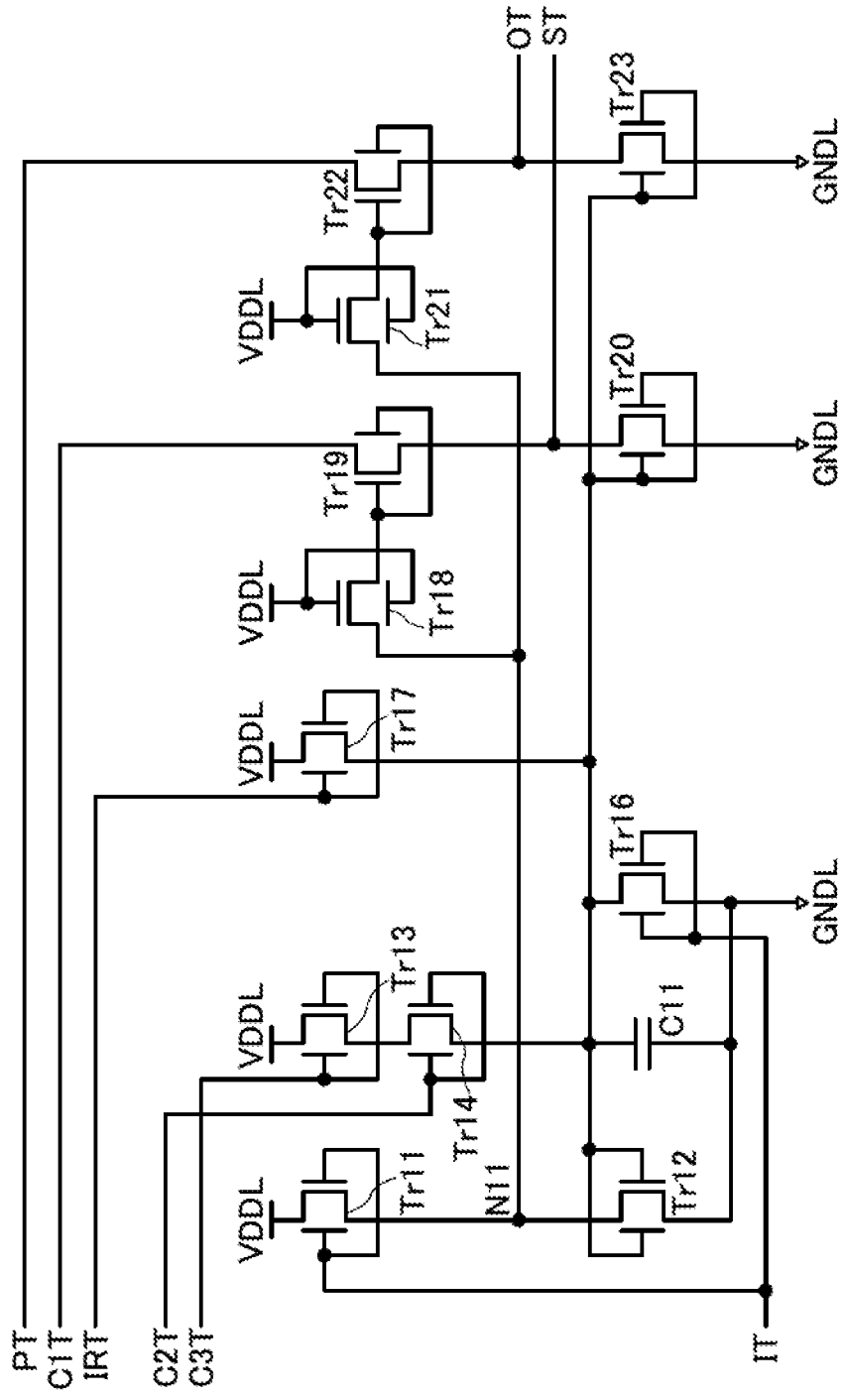
FIG. 12 is a circuit diagram illustrating a circuit included in a gate driver.

Next, circuit configurations of the circuit SR_D[1] and the circuit SR_D[2] are described. FIG. 12 illustrates a circuit configuration of the circuit SR_D in FIG. 10C.

The circuit SR_D has a configuration in which the terminal RT is removed from the circuit SR. Thus, the circuit SR_D has a configuration in which the transistor Tr15 is removed from the circuit SR.

Note that all of the transistors included in the circuit SR in FIG. 11 and the circuit SR_D in FIG. 12 is provided with a back gate, and the back gates are electrically connected to respective gates. This configuration enables an increase in the amount of on-state current flowing through the transistors.

Although all of the transistors included in the circuit SR in FIG. 11 and the circuit SR_D in FIG. 12 is provided with a back gate, the circuit SR and the circuit SR_D may include a transistor without a back gate. In this case, only the gate may be electrically connected to a predetermined element or a predetermined wiring because the gate and the back gate in FIG. 11 and FIG. 12 are electrically connected to each other in each of the transistors in the circuit SR and the circuit SR_D.

«Operation of Gate Driver»

Figure 13:
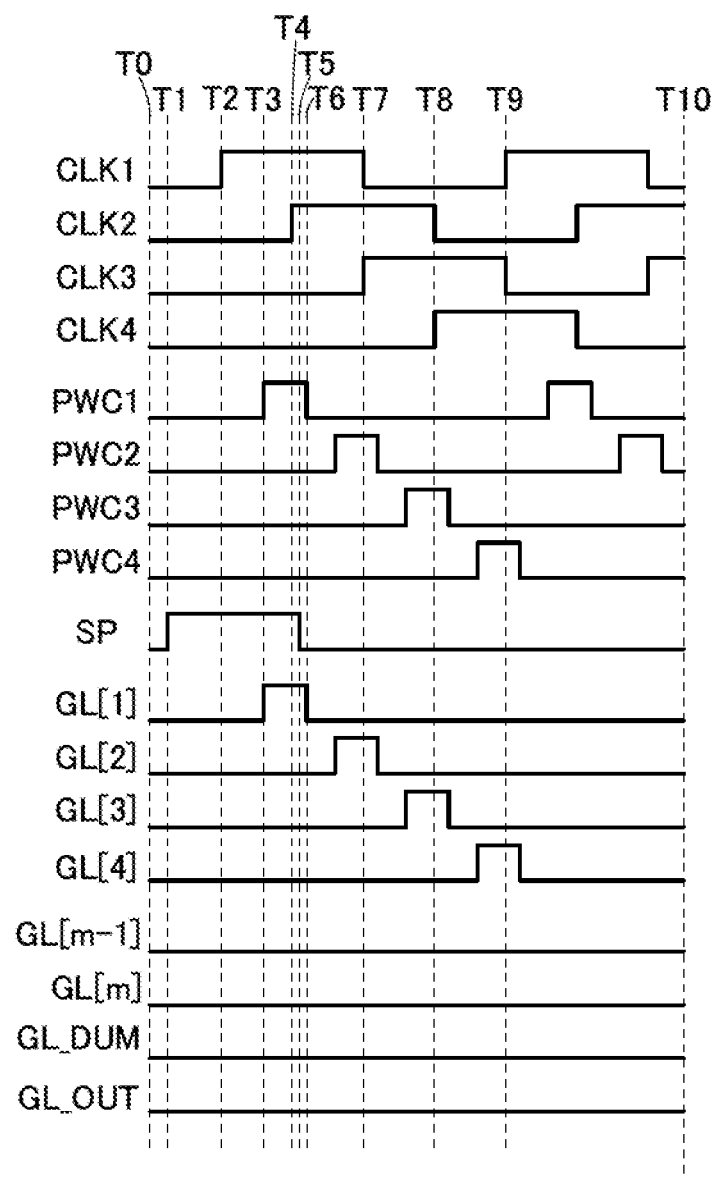
FIG. 13 is a timing chart illustrating an operation example of a gate driver.

Next, operation of the gate driver 103 is described. FIG. 13 is a timing chart showing an operation example of the gate driver 103, which shows changes in potentials of the clock signal CLK1, the clock signal CLK2, the clock signal CLK3, the clock signal CLK4, the pulse width control signal PWC1, the pulse width control signal PWC2, the pulse width control signal PWC3, the pulse width control signal PWC4, and the start pulse signal SP, from time T0 to time T10. In addition, the timing chart shows changes in potentials of the wiring GL[1], the wiring GL[2], the wiring GL[3], the wiring GL[4], the wiring GL[m-1], the wiring GL[m], the wiring GL_DUM, and the wiring GL_OUT each of which serves as an output wiring of the gate driver 103.

[Circuit SR[1]]

As shown in FIGS. 10A to 10C, the clock signal CLK1 is inputted to the terminal C1T of the circuit SR[1], the clock signal CLK2 is inputted to the terminal C2T of the circuit SR[1], the clock signal CLK3 is inputted to the terminal C3T of the circuit SR[1], and the pulse width control signal PWC1 is inputted to the terminal PT of the circuit SR[1].

At the time T1, a high-level potential is inputted as a start pulse signal to the terminal IT of the circuit SR[1] in the gate driver 103. Thus, the transistor Tr11 and the transistor Tr16 are turned on.

When the transistor Tr11 is turned on, the potential VDD is applied to the first terminal of the transistor Tr12, the first terminal of the transistor Tr18, and the first terminal of the transistor Tr21. Note that the transistor Tr18 and the transistor Tr21 are always in an on state for the circuit configuration. Accordingly, the potential VDD is applied to the gate and the back gate of the transistor Tr19 and the gate and the back gate of the transistor Tr22, and the transistor Tr19 and the transistor Tr22 are turned on.

Thus, the terminal PT and the terminal OT are electrically connected to each other, and the terminal C1T and the terminal ST are electrically connected to each other.

When the transistor Tr16 is turned on, the GND potential is applied to the gate and the back gate of the transistor Tr12, the gate and the back gate of the transistor Tr20, and the gate and the back gate of the transistor Tr23. Thus, the transistor Tr12, the transistor Tr20, and the transistor Tr23 are in an off state.

At the time T2, a high-level potential is inputted as the clock signal CLK1 to the gate driver 103. Thus, the high-level potential is inputted from the terminal C1T through the transistor Tr19 to the terminal ST in the circuit SR[1].

At the time T3, a high-level potential is inputted as the pulse width control signal PWC1 to the gate driver 103. Thus, the high-level potential is inputted from the terminal PT through the transistor Tr22 to the terminal OT in the circuit SR[1]. Thus, the wiring GL[1] electrically connected to the terminal OT of the circuit SR[1] has a high-level potential.

At the time T4, a high-level potential is inputted as the clock signal CLK2 to the gate driver 103. Thus, the high-level potential is inputted from the terminal C2T in the circuit SR[1], and the high-level potential is applied to the gate and the back gate of the transistor Tr14. Thus, the transistor Tr14 is turned on.

At the time TS, a low-level potential is inputted as a start pulse signal to the terminal IT of the circuit SR[1] in the gate driver 103. Thus, the transistor Tr11 and the transistor Tr16 are turned off.

When the transistor Tr11 is turned off, the node N11 becomes in a floating state. Thus, the gate and the back gate of the transistor Tr19 and the gate and the back gate of the transistor Tr22 hold potentials VDD. Thus, the transistor Tr19 and the transistor Tr22 are each kept in an on state.

At the time T6, a low-level potential is inputted as the pulse width control signal PWC1 to the gate driver 103. Thus, the low-level potential is inputted from the terminal PT through the transistor Tr22 to the terminal OT in the circuit SR[1]. Thus, the wiring GL[1] electrically connected to the terminal OT of the circuit SR[1] has the low-level potential.

At the time 77, a low-level potential is inputted as the clock signal CLK1 to the gate driver 103, and a high-level potential is inputted as the clock signal CLK3 to the gate driver 103. Thus, the low-level potential is inputted from the terminal C1T through the transistor Tr19 to the terminal ST in the circuit SR[1]. Furthermore, in the circuit SR[1], the high-level potential is applied from the terminal C3T, and accordingly, the high-level potential is applied to the gate and the back gate of the transistor Tr13. Thus, the transistor Tr13 is turned on.

At this time, the transistor Tr14 is also in an on state; thus, the potential VDD is applied to the gate and the back gate of the transistor Tr12, the gate and the back gate of the transistor Tr20, the gate and the back gate of the transistor Tr23, and the capacitor C11. Thus, the transistor Tr12, the transistor Tr20, and the transistor Tr23 are turned on.

When the transistor Tr20 is turned on, the GND potential is applied to the terminal ST. In addition, when the transistor Tr23 is turned on, the GND potential is applied to the terminal OT.

When the transistor Tr12 is turned on, the GND potential is applied to the second terminal of the transistor Tr11, the first terminal of the transistor Tr18, and the first terminal of the transistor Tr21. Note that the transistor Tr18 and the transistor Tr21 are always in an on state for the circuit configuration, and the GND potential is applied to the gate and the back gate of the transistor Tr19 and the gate and the back gate of the transistor Tr22. Thus, the transistor Tr19 and the transistor Tr22 are turned off.

The potential VDD is applied to the first terminal of the capacitor C11. Since the transistor Tr16 is in an off state, the capacitor C11 holds the potential VDD. The transistor Tr16 is not turned on unless the high-level potential is inputted from the terminal IT. In other words, the capacitor C11 holds the potential VDD until the high-level potential is inputted from the terminal IT.

[Circuit SR[2] and Thereafter]

In the case of the circuit SR[2], as shown in FIG. 10, the clock signal CLK2 is inputted to the terminal C1T of the circuit SR[2], the clock signal CLK3 is inputted to the terminal C2T of the circuit SR[2], the clock signal CLK4 is inputted to the terminal C3T of the circuit SR[2], and the pulse width control signal PWC2 is inputted to the terminal PT of the circuit SR[2].

In the operation of the circuit SR[1], from the time T2 to the time T7, the terminal ST has a high-level potential. In other words, from the time T2 to the time T7, the high-level potential outputted from the terminal ST of the circuit SR[1] is inputted to the terminal IT of the circuit SR[2].

The circuit SR[2] has a circuit configuration similar to that of the circuit SR[1], and thus, the circuit SR[2] operates in a manner similar to that of the circuit SR[1]. From the time T2 to the time T7, the high-level potential is inputted to the terminal IT of the circuit SR[2]. When the high-level potential is inputted as the pulse width control signal PWC2 to the terminal PT of the circuit SR[2] while the terminal IT of the circuit SR[2] has the high-level potential, the high-level potential is outputted from the terminal OT of the circuit SR[2]. Accordingly, the wiring GL[2] electrically connected to the terminal OT of the circuit SR[2] has a high-level potential. Furthermore, when the clock signal CLK2 has the high-level potential (from the time T4 to a time T8), the high-level potential is outputted from the terminal ST of the circuit SR[2]. From the time T8 to a time 19, the low-level potential is outputted from the terminal ST of the circuit SR[2], and the potential VDD is held at the capacitor C11 of the circuit SR[2].

Figure 14:
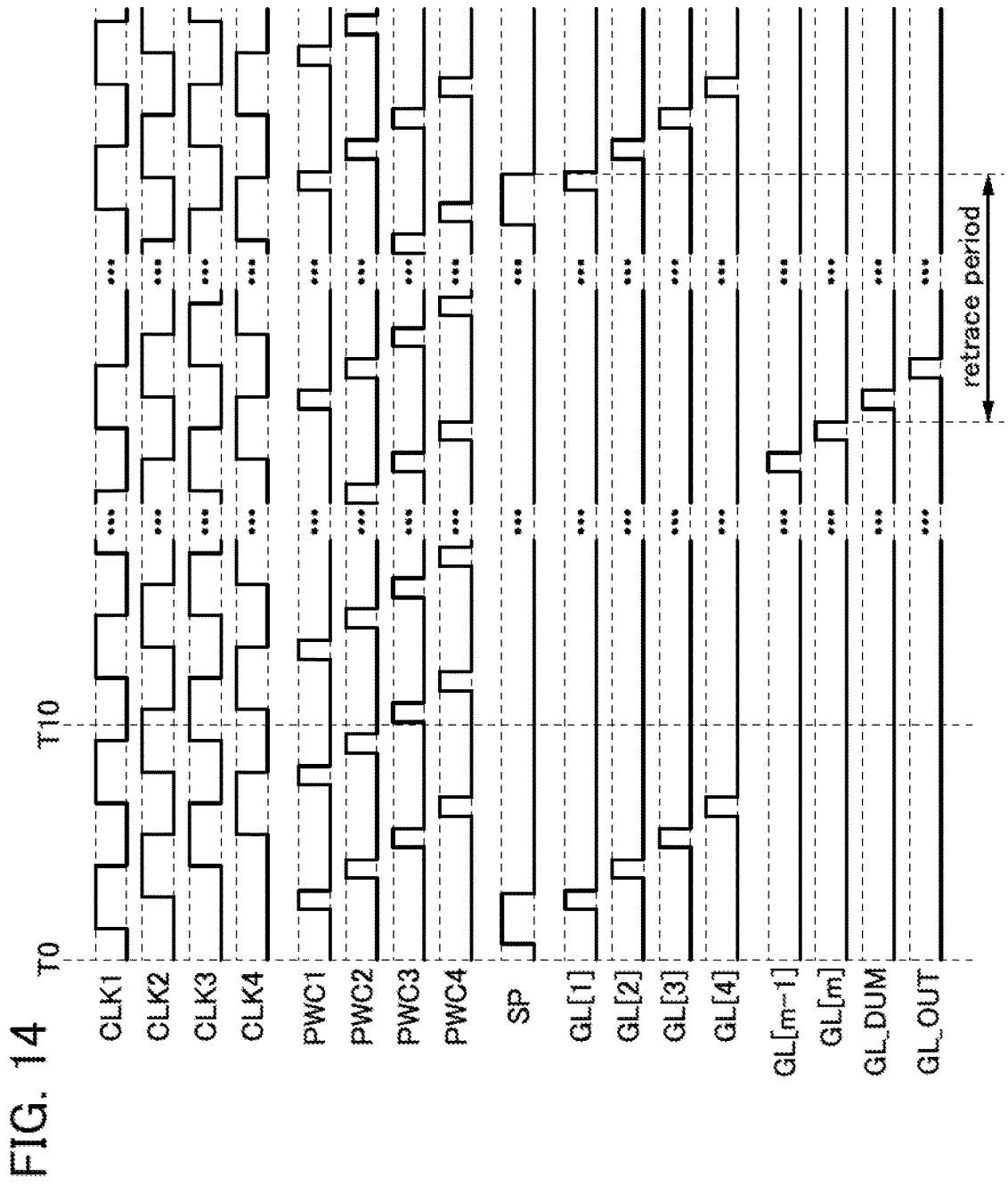
FIG. 14 is a timing chart illustrating an operation example of a gate driver.

In the circuit SR[3] and the subsequent circuits SR, the high-level potential is inputted to the terminal IT, and the high-level potential is inputted to the terminal C1T, the terminal C2T, the terminal C3T, and the terminal PT at a predetermined timing, whereby the high-level potential can be outputted from the terminal OT and the terminal ST in an operation similar to those of the circuit SR[1] and the circuit SR[2]. FIG. 14 is a timing chart showing operations following the time T10 of the gate driver 103 in addition to the operations from the time T0 to the time T10. After the high-level potential is outputted from the wiring GL[m], a high-level potential is inputted as a start pulse signal to the terminal IT of the circuit SR[1] during a retrace period. Note that the retrace period indicates a period from a time at which the potential of the wiring GL[m] decreases from the high-level potential to the low-level potential to a time at which the potential of the start pulse signal decreases from the high-level potential to the low-level potential.

[Terminal RT of Circuit SR]

The terminal RT of the circuit SR[p] is electrically connected to the terminal ST of the circuit SR[p+2]. In other words, when the high-level potential is outputted from the terminal ST of the circuit SR[p+2], a high-level potential is inputted to the terminal RT of the circuit SR[p], and accordingly, the transistor Tr15 of the circuit SR[p] is turned on. Thus, the potential VDD is applied to the gate and the back gate of the transistor Tr12, the gate and the back gate of the transistor Tr20, the gate and the back gate of the transistor Tr23, and the capacitor C11.

When the transistor Tr20 is turned on, the GND potential is applied to the terminal ST. In addition, when the transistor Tr23 is turned on, the GND potential is applied to the terminal OT. Moreover, when the transistor Tr12 is turned on, the GND potential is applied to the second terminal of the transistor Tr11, the first terminal of the transistor Tr18, and the first terminal of the transistor Tr21. Note that the transistor Tr18 and the transistor Tr21 are always in an on state for the circuit configuration, and accordingly, the GND potential is applied to the gate and the back gate of the transistor Tr19 and the gate and the back gate of the transistor Tr22. Thus, the transistor Tr19 and the transistor Tr22 are turned off.

In other words, when the high-level potential is outputted from the terminal ST of the circuit SR[p+2] to the terminal RT of the circuit SR[p], the GND potential is outputted from each of the terminal OT and the terminal ST as in a manner similar to that of the circuit SR[1] from the time T7 to the time T8.

[Terminal IRT of Circuit SR]

The initialization reset signal INI_RES is inputted to each of the terminals IRT of the circuits SR[1] to SR[m], the circuit SR_D[1], and the circuit SR_D[2]. When the initialization reset signal INI_RES has a high-level potential, the high-level potential is inputted to each of the terminals IRT of the above circuits. The transistor Tr17 of each circuit is turned on.

Thus, the potential VDD is applied to the gate and the back gate of the transistor Tr12, the gate and the back gate of the transistor Tr20, the gate and the back gate of the transistor Tr23, and the capacitor C11.

When the transistor Tr20 is turned on, the GND potential is applied to the terminal ST of each circuit. In addition, when the transistor Tr23 is turned on, the GND potential is applied to the terminal OT of each circuit. Moreover, when the transistor Tr12 is turned on, the GND potential is applied to the second terminal of the transistor Tr11, the first terminal of the transistor Tr18, and the first terminal of the transistor Tr21. Note that the transistor Tr18 and the transistor Tr21 are always in an on state for the circuit configuration, and accordingly the GND potential is applied to the gate and the back gate of the transistor Tr19 and the gate and the back gate of the transistor Tr22. Thus, the transistor Tr19 and the transistor Tr22 are tuned off.

In other words, a high-level potential is inputted as the initialization reset signal INI_RES, the GND potential is outputted from the terminal OT and the terminal ST of each of the circuits SR[1] to SR[m], the circuit SR_D[1], and the circuit SR_D[2].

<Configuration Example 1 of Level Shifter>

Figure 15:
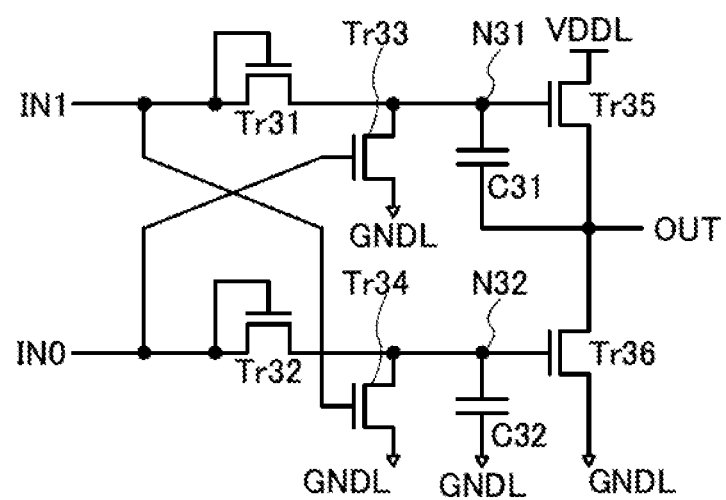
FIG. 15 is a circuit diagram showing a configuration example of a level shifter.

Next, the level shifter 104 that can be formed over the base 101 is described. FIG. 15 illustrates a configuration example of the level shifter 104.

A level shifter 600 illustrated in FIG. 15 is an example of the level shifter 104, which is formed using only n-channel transistors without p-channel transistors. The level shifter 600 includes a transistor Tr31 to a transistor Tr36, a capacitor C31, and a capacitor C32.

A first terminal of the transistor Tr31 is electrically connected to an input terminal IN1, a second terminal of the transistor Tr31 is electrically connected to a gate of the transistor Tr35, and a gate of the transistor Tr31 is electrically connected to the first terminal of the transistor Tr31. That is, the transistor Tr31 has a diode-connected structure. A first terminal of the transistor Tr32 is electrically connected to an input terminal IN0, a second terminal of the transistor Tr32 is electrically connected to a gate of the transistor Tr36, and a gate of the transistor Tr32 is electrically connected to the first terminal of the transistor Tr32. The transistor Tr32 has a diode-connected structure. A first terminal of the transistor Tr33 is electrically connected to the gate of the transistor Tr35, a second terminal of the transistor Tr33 is electrically connected to the wiring GNDL, and a gate of the transistor Tr33 is electrically connected to the input terminal IN0. A first terminal of the transistor Tr34 is electrically connected to a gate of the transistor Tr36, a second terminal of the transistor Tr34 is electrically connected to the wiring GNDL, and a gate of the transistor Tr34 is electrically connected to the input terminal IN1. A first terminal of the transistor Tr35 is electrically connected to the wiring VDDL, and a second terminal of the transistor Tr35 is electrically connected to an output terminal OUT. A first terminal of the transistor Tr36 is electrically connected to the wiring GNDL, and a second terminal of the transistor Tr36 is electrically connected to the output terminal OUT.

A first terminal of the capacitor C31 is electrically connected to the gate of the transistor Tr35, and a second terminal of the capacitor C31 is electrically connected to the output terminal OUT. A first terminal of the capacitor C32 is electrically connected to the gate of the transistor Tr36, and a second terminal of the capacitor C32 is electrically connected to the wiring GNDL.

Note that a connection portion between the first terminal of the capacitor C31 and the gate of the transistor Tr35 is referred to as a node N31. In addition, a connection portion between the first terminal of the capacitor C32 and the gate of the transistor Tr36 is referred to as a node N32.

The wiring VDDL is a wiring that supplies a potential higher than a high-level potential described later. The wiring GNDL is a wiring that supplies the GND potential.

Figure 16:
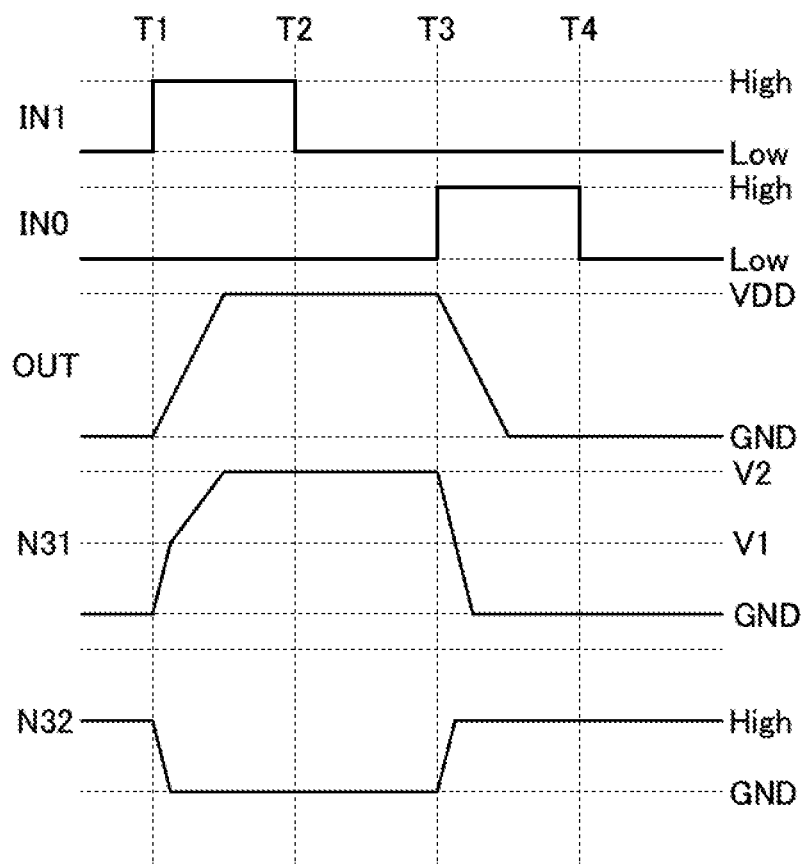
FIG. 16 is a timing chart illustrating an operation example of a level shifter.

FIG. 16 is a timing chart showing an operation example of the level shifter 600. The timing chart shows changes in potentials of the input terminal IN1, the input terminal IN0, the output terminal OUT, the node N31, and the node N32 from the time T1 to the time T4.

To the input terminal IN1, either a low-level potential (denoted by Low in FIG. 16) or a high-level potential (denoted by High in FIG. 16) is applied, and to the input terminal IN0, either a low-level potential or a high-level potential is applied.

From the output terminal OUT, the potential VDD higher than the high-level potential or the GND potential is outputted.

At the time T1, the high-level potential is inputted to the input terminal IN', and the low-level potential is inputted to the input terminal IN0. The transistor Tr31 has a diode-connected structure; thus, the potential of the node N31 electrically connected to the second terminal of the transistor Tr31 increases up to the high-level potential (up to V1 in FIG. 16). Since the high-level potential is applied to the gate of the transistor Tr34, the transistor Tr34 is turned on, and the potential of the node N32 electrically connected to the first terminal of the transistor Tr34 decreases to the GND potential. Since the low-level potential is applied to the gate of the transistor Tr33, the transistor Tr33 is turned off.

Here, the node N31 and the transistor Tr35 are focused on. Since the transistor Tr35 is in an on state, a potential outputted from the output terminal OUT gradually increases. Since the transistor Tr36 is in an off state, a potential of the second terminal of the capacitor C31 increases with an increase of the potential outputted from the output terminal OUT. Thus, by the boosting effect of the capacitor C31, the potential of the node N31 also increases (up to V2 in FIG. 16). That is, the potential of the gate of the transistor Tr35 increases, and accordingly, the amount of on-state current flowing through the transistor Tr35 increases. Thus, the potential outputted from the output terminal OUT increases to VDD.

At the time T2, the low-level potential is inputted to the input terminal IN1. The low-level potential is inputted to the input terminal IN0 continuously since before the time T2. The transistor Tr31 becomes in an off state due to the low-level potential inputted from the input terminal IN1, and the transistor Tr32 is continuously in an off state due to the low-level potential inputted from the input terminal IN0. In addition, the low-level potential is inputted to the gate of the transistor Tr34, and accordingly, the transistor Tr34 is in an off state. By the above operation, the node N31 and the node N32 are in a floating state, and the potentials of the node N31 and the node N32 are held. Thus, the potential outputted from the output terminal OUT is not changed.

At the time T3, the low-level potential is inputted to the input terminal IN1 continuously since before the time T3. The high-level potential is inputted to the input terminal IN0. The transistor Tr32 has a diode-connected structure, and thus the potential of the node N32 electrically connected to the second terminal of the transistor Tr32 increases. The high-level potential is inputted from the input terminal IN0 to the gate of the transistor Tr33, and thus, the potential of the node N31 electrically connected to the first terminal of the transistor Tr33 decreases to the GND potential.

Here, the transistor Tr36 is focused on. Since the transistor Tr36 is in an on state, the potential outputted from the output terminal OUT gradually decreases and comes to be the GND potential.

At the time T4, the low-level potential is inputted to the input terminal IN1 continuously since before the time T4. The low-level potential is inputted to the input terminal IN0. The transistor Tr31 is continuously in an off state due to the low-level potential inputted from the input terminal IN1, and the transistor Tr32 is in an off state due to the low-level potential inputted from the input terminal IN0. In addition, the low-level potential is inputted to the gate of the transistor Tr33, and accordingly, the transistor Tr33 becomes in an off state. By the above operation, the node N31 and the node N32 are in a floating state, and the potentials of the node N31 and the node N32 are held. Thus, the potential outputted from the output terminal OUT is not changed.

When the level shifter 104 has the configuration of the level shifter 600 illustrated in FIG. 15, the level of the potential of the input voltage can be shifted higher. Note that the level shifter 600 may be used as a unit for shifting the potential of a timing signal inputted to a gate driver of a light-emitting element, for example.

<Configuration Example 2 of Level Shifter>

Another configuration example of the level shifter is described.

Before another configuration example of a level shifter is described, a buffer circuit and a differential amplifier included in the level shifter are described.

«Buffer Circuit»

Figure 17A:
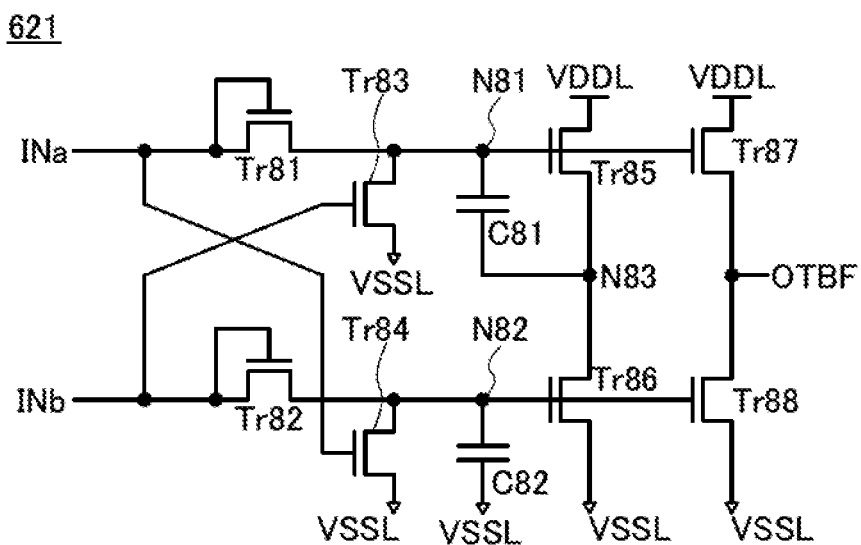
FIGS. 17A and 17B are a circuit diagram illustrating a configuration example of a buffer circuit and a timing chart illustrating an operation example of the circuit configuration.

FIG. 17A illustrates a configuration example of a buffer circuit 621. The buffer circuit 621 includes transistors Tr81 to Tr88, a capacitor C81, and a capacitor C82.

A first terminal of the transistor Tr81 is electrically connected to an input terminal INa, a second terminal of the transistor Tr81 is electrically connected to a gate of the transistor Tr85 and a gate of the transistor Tr87, and a gate of the transistor Tr81 is electrically connected to the first terminal of the transistor Tr81. That is, the transistor Tr81 has a diode-connected structure. A first terminal of the transistor Tr82 is electrically connected to an input terminal INb, a second terminal of the transistor Tr82 is electrically connected to a gate of the transistor Tr86 and a gate of the transistor Tr88, and a gate of the transistor Tr82 is electrically connected to the first terminal of the transistor Tr82. That is, the transistor Tr82 has a diode-connected structure. A first terminal of the transistor Tr83 is electrically connected to the gate of the transistor Tr85, a second terminal of the transistor Tr83 is electrically connected to a wiring VSSL, and a gate of the transistor Tr83 is electrically connected to the input terminal INb. A first terminal of the transistor Tr84 is electrically connected to the gate of the transistor Tr86, a second terminal of the transistor Tr84 is electrically connected to the wiring VSSL, and a gate of the transistor Tr84 is electrically connected to the input terminal INa. A first terminal of the transistor Tr85 is electrically connected to the wiring VDDL. A first terminal of the transistor Tr86 is electrically connected to the wiring VSSL. A second terminal of the transistor Tr85 is electrically connected to a second terminal of the transistor Tr86. A first terminal of the transistor Tr87 is electrically connected to the wiring VDDL, and a second terminal of the transistor Tr87 is electrically connected to an output terminal OTBF. A first terminal of the transistor Tr88 is electrically connected to the wiring VSSL, and a second terminal of the transistor Tr88 is electrically connected to the output terminal OTBF.

A first terminal of the capacitor C81 is electrically connected to the gate of the transistor Tr85, and a second terminal of the capacitor C81 is electrically connected to the second terminal of the transistor Tr85. A first terminal of the capacitor C82 is electrically connected to the gate of the transistor Tr86, and a second terminal of the capacitor C82 is electrically connected to the wiring VSSL.

Note that a connection portion between the first terminal of the capacitor C81 and the gate of the transistor Tr85 is referred to as a node N81. In addition, a connection portion between the first terminal of the capacitor C82 and the gate of the transistor Tr86 is referred to as a node N82. Further, a connection portion between the second terminal of the transistor Tr85 and the second terminal of the transistor Tr86 is referred to as a node N83.

The wiring VDDL is a wiring that supplies the potential VDD, and the wiring VSSL is a wiring that supplies the potential VSS. Note that the potential VDD is higher than the potential VSS.

Next, an operation example of the buffer circuit 621 is described.

Figure 17B:
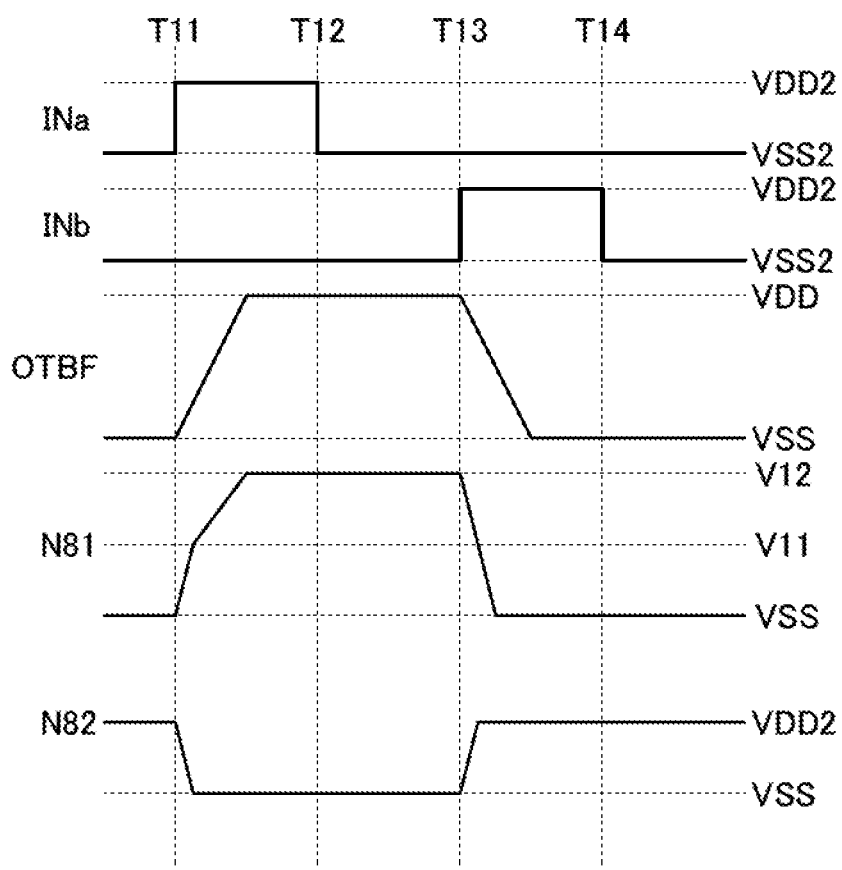

FIG. 17B is a timing chart showing an operation example of the buffer circuit 621. The timing chart shows changes in potentials of the input terminal INa, the input terminal INb, the output terminal OTBF, the node N81, and the node N82 from a time T11 to a time T14.

To the input terminal INa, either a potential VSS2 as the low-level potential or a potential VDD2 as the high-level potential is applied. To the input terminal INb, either the potential VSS2 or the potential VDD2 is applied.

The potential VSS2 is lower than the potential VSS or equivalent to the potential VSS. The potential VDD2 is a potential lower than the potential VDD.

From the output terminal OTBF, either the potential VDD or the potential VSS is outputted depending on the potentials of the input terminal INa and the input terminal INb.

At the time T11, the potential VDD2 is inputted to the input terminal INa, and the potential VSS2 is inputted to the input terminal INb. The transistor Tr81 has a diode-connected structure. Thus, the potential of the node N81 electrically connected to the second terminal of the transistor Tr81 increases (up to V11 in FIG. 17B). Since the potential VDD2 is applied to the gate of the transistor Tr84, the transistor Tr84 is turned on, and the potential of the node N82 electrically connected to the first terminal of the transistor Tr84 decreases to the potential VSS. Since the potential VSS is applied to the gate of the transistor Tr83, the transistor Tr83 is turned off.

Here, the node N81 and the transistor Tr85 are focused on. Since the transistor Tr85 is in an on state, the potential of a node N83 gradually increases. In addition, since the transistor Tr86 is in an off state, the second terminal of the capacitor C81 also increases with an increase of the potential of the node N83. By the boosting effect of the capacitor C81, the potential of the node N81 also increases (up to V12 in FIG. 17B). In other words, the potential of the gate of the transistor Tr85 increases, and accordingly, the amount of on-state current flowing through the transistor Tr85 increases. Thus, the potential of the node N83 increases to the potential VDD.

Since the potential of the gate of the transistor Tr87 is equivalent to the potential of the node N81, the amount of on-state current flowing through the transistor Tr87 increases with an increase in the potential of the node N83. Since the node N82 has the potential VSS, the transistor Tr88 is in an off state. Thus, the potential VDD is outputted from the output terminal OTBF.

At the time T12, the potential VSS2 is inputted to the input terminal INa. In addition, the potential VSS2 is inputted continuously since before the time T12 to the input terminal INb. The transistor Tr81 is in an off state due to the potential VSS2 inputted from the input terminal INa, and the transistor Tr82 is continuously in an off state due to the potential VSS2 inputted from the input terminal INb. In addition, since the potential VSS2 is inputted to the gate of the transistor Tr84, the transistor Tr84 is turned off. By the above operation, the node N81 and the node N82 are in a floating state, and the potentials of the node N81 and the node N82 are held. Thus, the potential outputted from the output terminal OTBF is not changed.

At the time T13, the potential VSS2 is inputted continuously since before the time T13 to the input terminal INa. The potential VDD2 is inputted to the input terminal INb. The transistor Tr82 has a diode-connected structure. Thus, the potential of the node N82 electrically connected to the second terminal of the transistor Tr82 increases. The potential VDD2 is inputted to the gate of the transistor Tr83 from the input terminal INb, and accordingly the transistor Tr83 is turned on. The potential of the node N81 electrically connected to the first terminal of the transistor Tr83 decreases to the potential VSS. The potential VDD2 is inputted to the gate of the transistor Tr86 from the input terminal INb, and accordingly the transistor Tr86 is turned on, and the potential of the node N83 decreases to the potential VSS.

Here, the transistor Tr88 is focused on. The potential VDD2 is inputted to the gate of the transistor Tr88 from the input terminal INb, and accordingly the transistor Tr88 is turned on. The potential outputted from the output terminal OTBF gradually decreases to the potential VSS.

At the time T14, the potential VSS2 is inputted continuously since before the time T14 to the input terminal INa. In addition, the potential VSS2 is inputted to the input terminal INb. The transistor Tr81 is continuously in an off state due to the potential VSS2 inputted from the input terminal INa, and the transistor Tr82 is in an off state due to the potential VSS2 inputted from the input terminal INb. Moreover, the potential VSS2 is inputted to the gate of the transistor Tr83, and accordingly, the transistor Tr83 is turned off. By the above operation, the node N81 and the node N82 are in a floating state, and the potentials of the node N81 and the node N82 are held. Thus, the potential outputted from the output terminal OTBF is not changed.

When the buffer circuit 621 has a circuit configuration illustrated in FIG. 17A, the potential VDD or the potential GND can be outputted from the output terminal OTBF depending on the input potentials of the input terminal INa and the input terminal INb.

The buffer circuit 621 has such a configuration that the transistor Tr87 and the transistor Tr88 are added to the circuit of the level shifter 600 in FIG. 15. In the level shifter 600, the second terminal of the capacitor C31 is electrically connected to the output terminal OUT. In the buffer circuit 621, the second terminal of the capacitor C81 is not electrically connected to the output terminal OTBF. In other words, the potential of the node N83 of the buffer circuit 621 is not affected by the potential of the output terminal OTBF (e.g., the potential applied to the output terminal OTBF from the outside of the buffer circuit 621). Thus, the potential that is more stable than the potential outputted from the output terminal OUT of the level shifter 600 can be outputted.

«Differential Amplifier»

Next, a specific configuration example of a differential amplifier is described.

Figure 18A:
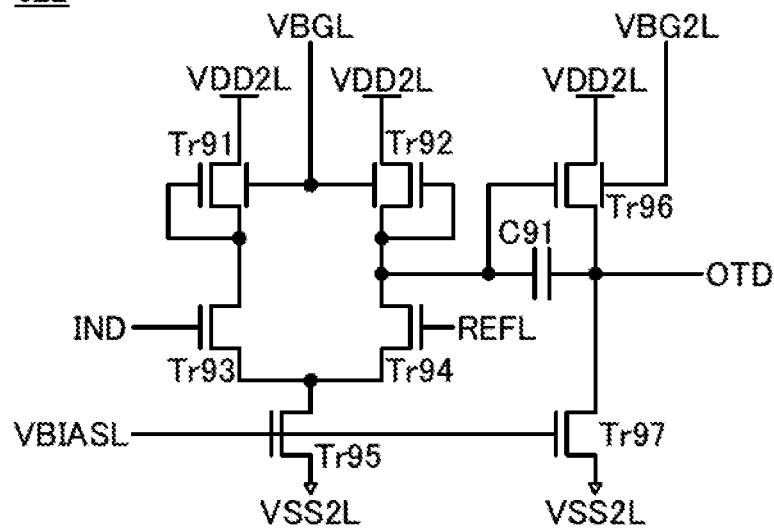
FIGS. 18A and 18B are a circuit diagram illustrating a configuration example of a differential amplifier and a timing chart illustrating an operation example of the circuit configuration.

FIG. 18A illustrates an example of a differential amplifier. A differential amplifier 622 includes transistors Tr91 to Tr97 and a capacitor C91.

A first terminal of the transistor Tr91 is electrically connected to a wiring VDD2L, a second terminal of the transistor Tr91 is electrically connected to a first terminal of the transistor Tr93, a gate of the transistor Tr91 is electrically connected to a second terminal of the transistor Tr91, and a back gate of the transistor Tr91 is electrically connected to a wiring VBGL. A first terminal of the transistor Tr92 is electrically connected to the wiring VDD2L, a second terminal of the transistor Tr92 is electrically connected to a first terminal of the transistor Tr94, a gate of the transistor Tr92 is electrically connected to the second terminal of the transistor Tr92, and a back gate of the transistor Tr92 is electrically connected to the wiring VBGL. A second terminal of the transistor Tr93 is electrically connected to a first terminal of the transistor Tr95, and a gate of the transistor Tr93 is electrically connected to an input terminal IND. A second terminal of the transistor Tr94 is electrically connected to the first terminal of the transistor Tr95, and a gate of the transistor Tr94 is electrically connected to a wiring REFL. A second terminal of the transistor Tr95 is electrically connected to a wiring VSS2L, and a gate of the transistor Tr95 is electrically connected to a wiring VBIASL.

A first terminal of the transistor Tr96 is electrically connected to the wiring VDD2L, a second terminal of the transistor Tr96 is electrically connected to an output terminal OTD, a gate of the transistor Tr96 is electrically connected to the second terminal of the transistor Tr92, and a back gate of the transistor Tr96 is electrically connected to a wiring VBG2L. A first terminal of the transistor Tr97 is electrically connected to the output terminal OTD, a second terminal of the transistor Tr97 is electrically connected to the wiring VSS2L, and a gate of the transistor Tr97 is electrically connected to the wiring VBIASL.

A first terminal of the capacitor C91 is electrically connected to the second terminal of the transistor Tr92, and a second terminal of the capacitor C91 is electrically connected to the output terminal OTD.

Next, an operation example of the differential amplifier 622 is described.

Figure 18B:
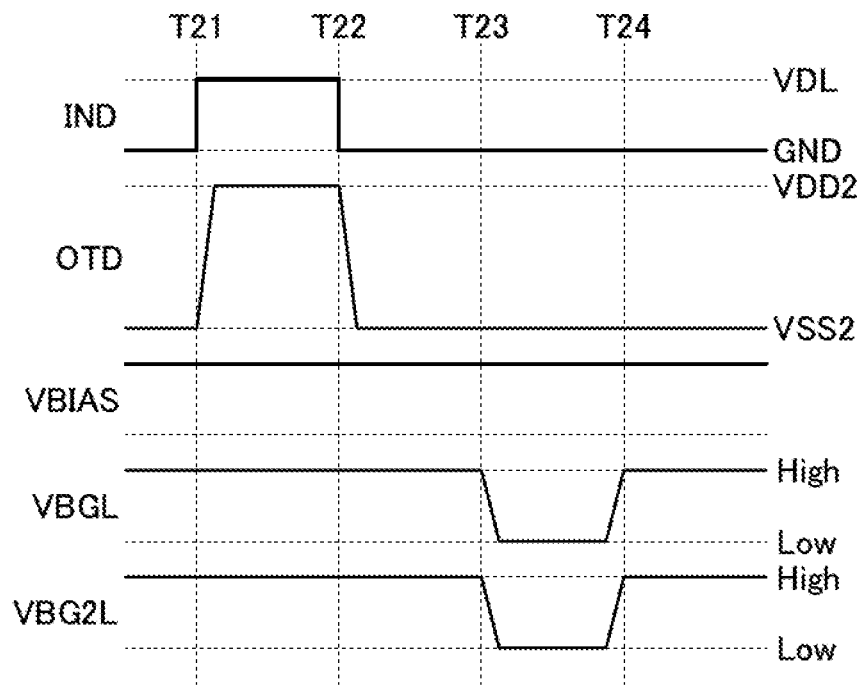

FIG. 18B is a timing chart showing the operation example of the differential amplifier 622. The timing chart shows changes in potentials of the input terminal IND, the output terminal OTD, the wiring VBIASL, the wiring VBGL, and the wiring VBG2L from a time T21 to a time 124.

To the input terminal IND, either a potential VDL as a high-level potential or the potential GND as a low-level potential is applied. In addition, a potential VDD2 is applied to the wiring VDD2L and a potential VSS2 is applied to the wiring VSS2L.

The wiring REFL is a wiring that supplies a reference potential, and the reference potential is compared with a potential inputted to the input terminal IND. In accordance with the comparison results, a potential outputted from the output terminal OTD is fixed to be either the potential VDD2 or the potential VSS2. Although there is a case where a potential that is lower than the potential VDD2 and higher than the potential VSS2 is outputted from the output terminal OTD, the potential outputted from the output terminal OTD is defined as the potential VDD2 or the potential VSS2 for convenience. Note that in this operation example, the reference potential is lower than the potential VDL and higher than the potential GND. For example, the reference potential may be assumed to be (potential VDL+potential GND)/2 and supplied from the wiring REFL.

The wiring VBGL is a wiring that supplies a potential to the back gates of the transistor Tr91 and the transistor Tr92. In particular, the potential of the wiring VBGL is set to high, whereby the transistor Tr91 and the transistor Tr92 each function as a current source. Specifically, the second terminal of the transistor Tr91 and the gate thereof have the same potential, and accordingly the voltage between the gate and the source of the transistor Tr91 is 0 V. At this time, the potential of the back gate of the transistor Tr91 is set to high, whereby the voltage-current characteristics of the transistor Tr91 can be shifted negatively (hereinafter, this state is referred to as normally-on state). Thus, even when the voltage between the gate and the source of the transistor Tr91 is 0 V, current flows from the first terminal to the second terminal of the transistor Tr91. The second terminal of the transistor Tr91 has a potential lower than the potential VDD2 by the threshold voltage of the transistor Tr91.

Furthermore, the voltage between the gate and the source of the transistor Tr92 is 0 V. Thus, the potential of the back gate of the transistor Tr92 is set to a high potential as in the above case, whereby the current flows from the first terminal to the second terminal of the transistor Tr92. The second terminal of the transistor Tr92 has a potential lower than the potential VDD2 by the threshold voltage of the transistor Tr92.

The wiring VBG2L is a wiring that supplies a potential to the back gate of the transistor Tr96. In particular, the potential of the wiring VBG2L is set to a high-level potential, whereby the transistor Tr96 functions as a current source. Specifically, when the potential of the back gate of the transistor Tr96 is set to a high-level potential, the transistor Tr96 can be in a normally-on state. Thus, even when the voltage between the gate and the source of the transistor Tr96, that is, the potential held at the capacitor C91, is 0 V, the current flows from the first terminal to the second terminal of the transistor Tr96.

The wiring VBIASL is a wiring that supplies an adjust potential so that the differential amplifier 622 operates appropriately.

At the time 721, the potential VDL is inputted to the input terminal IND. A high-level potential (denoted by High in FIG. 18B) is inputted to the wiring VBGL and the wiring VBG2L.

At this time, the potential of the gate of the transistor Tr93 is the potential VDL, which is higher than the reference potential of the gate of the transistor Tr94. Thus, the on-state current of the transistor Tr93 is higher than that of the transistor Tr94.

The on-state current of the transistor Tr95 is determined by the adjust potential applied to the gate of the transistor Tr95 and the potential of the source thereof (here, the second terminal of the transistor Tr95). By Kirchhoff's low, the on-state current of the transistor Tr95 is equal to the sum of the on-state current of the transistor Tr93 and the on-state current of the transistor Tr94.

Since the high-level potential is applied to each of the back gates of the transistor Tr91 and the transistor Tr92, each of the transistor Tr91 and the transistor Tr92 functions as a current source. The on-state current of the transistor Tr94 is lower than that of the transistor Tr93, and thus, charge is held at the first terminal of the capacitor C91. The first terminal of the capacitor C91 has a potential lower than the potential VDD2 by the threshold voltage of the transistor Tr92 (VDD2−$V_{th}$).

Here, the transistor Tr96 is focused on. The potential of the gate of the transistor Tr96 is substantially equivalent to that of the first terminal of the capacitor C91, i.e., VDD2−$V_{th}$. In addition, a high-level potential is applied to the back gate of the transistor Tr96, which makes the transistor Tr96 be in a normally-on state. Thus, the current flows from the first terminal to the second terminal of the transistor Tr96.

Since the adjust potential is applied to the gate of the transistor Tr97, the transistor Tr97 is turned on, and the current flows from the first terminal to the second terminal of the transistor Tr97. The on-state current of the transistor Tr96 is higher than that of the transistor Tr97 because VDD2−$V_{th}$ is applied to the gate of the transistor Tr96, and the high-level potential is applied to the back gate of the transistor Tr96. Thus, the potential outputted from the output terminal OTD is the potential VDD2.

At the time 122, the potential GND is inputted to the input terminal IND. The high-level potential is inputted continuously since before the time T22 to the wiring VBGL and the wiring VBG2L.

At this time, the potential of the gate of the transistor Tr93 is the potential GND, and accordingly, the on-state current of the transistor Tr93 is lower than that of the transistor Tr94. Although the transistor Tr93 becomes in an off state depending on the size of the transistor Tr93, in this operation, the on-state current lower than that of the transistor Tr94 flows in the transistor Tr93.

As described above, the on-state current of the transistor Tr95 is equal to the sum of the on-state current of the transistor Tr93 and the on-state current of the transistor Tr94. However, the on-state current of the transistor Tr94 is higher than that of the transistor Tr93, and the charge held at the first terminal of the capacitor C91 is discharged; accordingly, the potential of the first terminal of the capacitor C91 decreases to the potential close to the potential VSS2.

Here, the transistor Tr96 is focused on. The potential of the gate of the transistor Tr96 is substantially equivalent to the potential of the first terminal of the capacitor C91, that is, the potential close to the potential VSS2. Thus, the on-state current of the transistor Tr96 is lower than that immediately before the time T22.

Since the adjust potential is applied to the gate of the transistor Tr97, the transistor Tr97 is in an on state, and the current flows from the first terminal to the second terminal of the transistor Tr97 continuously since before the time T22. The on-state current of the transistor Tr97 is higher than that of the transistor Tr96, and thus, the potential outputted from the output terminal OTD is the potential VSS2.

At the time T23, the low-level potential is applied to the wiring VBGL and the wiring VBG2L. That is, the low-level potential is applied to each of the back gates of the transistor Tr91, the transistor Tr92, and the transistor Tr96, and accordingly, each of the transistor Tr91, the transistor Tr92, and the transistor Tr96 becomes in an off state. By this operation, the shoot-through current flowing through the transistor Tr91, the transistor Tr92, and the transistor Tr96 is reduced, and the power consumption of the differential amplifier 622 can be reduced. In other words, in the case where the potential of the input terminal IND is determined to be the potential GND, for example, in the case where a timing signal has a low-level potential for a long time during a retrace period or a period of IDS driving (described later) performed by a display device, the potentials of the wiring VBGL and the wiring VBG2L are set to the low-level potential, whereby lower power consumption can be achieved.

《Circuit 610》

Here, another configuration example of a level shifter different from the level shifter 600 is described.

Figure 19A:
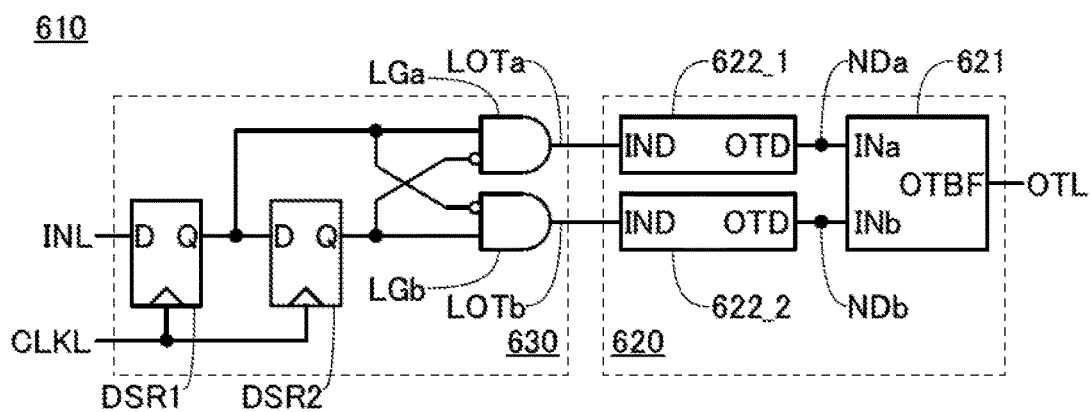
FIGS. 19A and 19B are a circuit diagram illustrating a configuration example of a logic circuit and a level shifter and a timing chart illustrating an operation example of the circuit configuration.

A circuit 610 illustrated in FIG. 19A includes a level shifter 620 and a logic circuit 630. The logic circuit 630 is a circuit that generates an input signal to the level shifter 620.

The logic circuit 630 includes a flip-flop circuit DSR1, a flip-flop circuit DSR2, an AND circuit LGa, and an AND circuit LGb. The AND circuit LGa and the AND circuit LGb each have a function of inverting a logic of a signal inputted to a second input terminal. As an actual configuration, an inverter may be electrically connected to one of two input terminals of the AND circuit.

An input terminal of the flip-flop circuit DSR1 is electrically connected to a wiring INL, an output terminal of the flip-flop circuit DSR1 is electrically connected to an input terminal of the flip-flop circuit DSR2, a first input terminal of the AND circuit LGa, and the second input terminal of the AND circuit LGb, and a clock input terminal of the flip-flop circuit DSR1 is electrically connected to a wiring CLKL. An output terminal of the flip-flop circuit DSR2 is electrically connected to the second terminal of the AND circuit LGa and a first terminal of the AND circuit LGb, and a clock input terminal of the flip-flop circuit DSR2 is electrically connected to the wiring CLKL.

The wiring INL is a wiring that supplies an input signal to the logic circuit 630, and the wiring CLKL is a wiring that supplies a clock signal to drive the logic circuit 630.

In the case where a potential of a signal inputted to the wiring INL is shifted, the logic circuit 630 is synchronized with a clock signal and has a function of outputting pulse signals from an output terminal LOTa and an output terminal LOTb.

The level shifter 620 includes a differential amplifier 622_1, a differential amplifier 622_2, and the buffer circuit 621. For each of the differential amplifier 622_1 and the differential amplifier 622_2, the differential amplifier 622 described above can be used.

The input terminal IND of the differential amplifier 622_1 is electrically connected to the output terminal LOTa of the AND circuit LGa, and the output terminal OTD of the differential amplifier 622_1 is electrically connected to the input terminal INa of the buffer circuit 621. The input terminal IND of the differential amplifier 622_2 is electrically connected to the output terminal LOTb of the AND circuit LGb, and the output terminal OTD of the differential amplifier 622_2 is electrically connected to the input terminal INb of the buffer circuit 621. The output terminal OTBF of the buffer circuit 621 is electrically connected to a wiring OTL. Note that a portion where the output terminal OTD of the differential amplifier 622_1 and the input terminal INa of the buffer circuit 621 are electrically connected is referred to as a node NDa, and a portion where the output terminal OTD of the differential amplifier 622_2 and the input terminal INb of the buffer circuit 621 are electrically connected is referred to as a node NDb.

Next, an operation example of the circuit 610 is described.

Figure 19B:
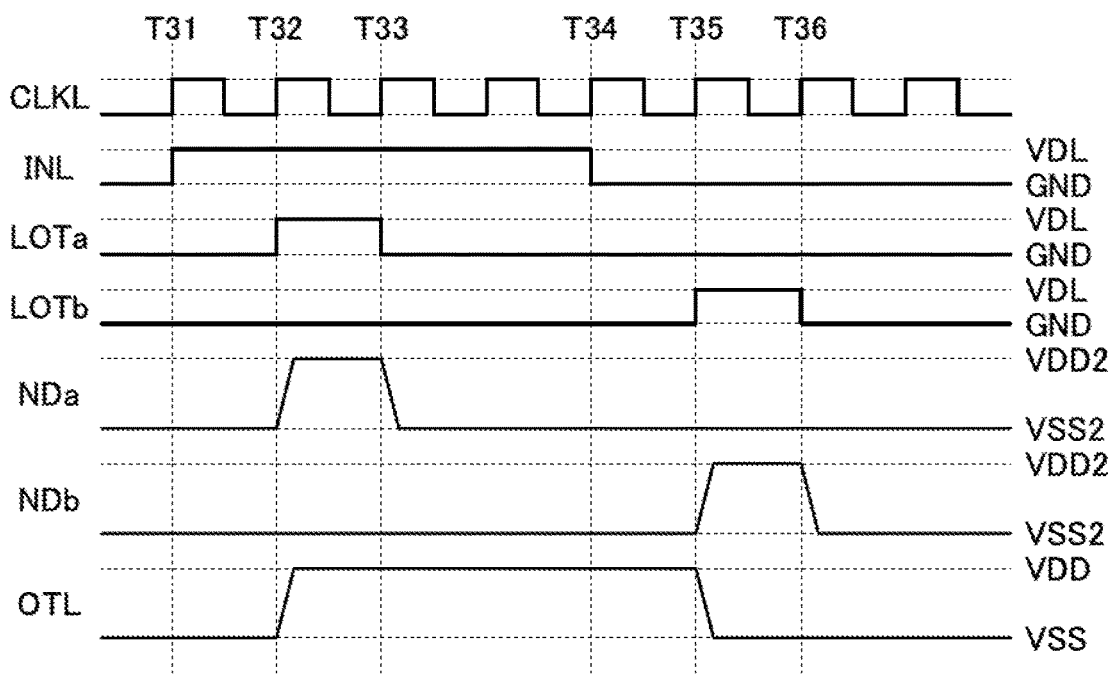

FIG. 19B is a timing chart showing an operation example of the circuit 610. The timing chart shows changes in potentials of the wiring CLKL, the wiring INL, the output terminal LOTa, the output terminal LOTb, the node NDa, the node NDb, and the wiring OTL from a time T31 to a time 136.

At the time T31, a signal whose potential level is shifted from a low-level potential L (GND) to a high-level potential H (VDL) is inputted to the wiring INL.

At the time T32, the logic circuit 630 outputs a pulse signal of the high-level potential H (VDL) from the output terminal LOTa in synchronization with the rising edge of the first clock signal after the transition of the signal. As a result, the high-level potential H (VDL) is inputted to the input terminal IND of the differential amplifier 622_1, and accordingly, the potential VDD2 is outputted from the output terminal OTD of the differential amplifier 622_1. Thus, the potential of the node NDa is the potential VDD2.

In contrast, the low-level potential L (GND) is outputted from the output terminal LOTb, and the low-level potential L (GND) is inputted to the input terminal of the differential amplifier 622_2. Thus, the potential VSS2 is outputted from the output terminal OTD of the differential amplifier 622_2, and the potential of the node NDb is the potential VSS2.

From the above, the potential VDD2 is inputted to the input terminal INa of the buffer circuit 621, and the potential VSS2 is inputted to the input terminal INb of the buffer circuit 621. By inputting the potential VDD2 to the input terminal INa and inputting the potential VSS2 to the input terminal INb, the potential VDD is outputted from the output terminal OTBF of the buffer circuit 621. Thus, the potential VDD is outputted from the wiring OTL of the circuit 610.

The length of the pulse signal outputted from the output terminal LOTa corresponds to one cycle of the clock signal inputted to the wiring CLKL. Thus, the pulse signal outputted from the output terminal LOTa at the time T33 decreases to the low-level potential L (GND), and the potentials of the output terminal OTD of the differential amplifier 622_1 and the node NDa decrease to the potential VSS2. Note that the potential outputted from the output terminal OTBF of the buffer circuit 621 is the potential VDD continuously since before the time T33. Thus, the potential VDD is outputted from the wiring OTL of the circuit 610.

At the time T34, a signal whose potential level is shifted from the high-level potential H (VDL) to the low-level potential L (GND) is inputted to the wiring INL.

At the time T35, the logic circuit 630 outputs a pulse signal with the high-level potential H (VDL) from the output terminal LOTb in synchronization with the rising edge of the first clock signal after the transition of the signal. As a result, the high-level potential H (VDL) is inputted to the input terminal IND of the differential amplifier 622_2, and accordingly, the potential VDD2 is outputted from the output terminal OTD of the differential amplifier 622_2. Thus, the potential of the node NDb becomes the potential VDD2.

In contrast, the low-level potential L (GND) is outputted from the output terminal LOTa, and the low-level potential L (GND) is inputted to the input terminal of the differential amplifier 622_1. Thus, the potential VSS2 is outputted from the output terminal OTD of the differential amplifier 622_1, and the potential of the node NDa becomes the potential VSS2.

From the above, the potential VSS2 is inputted to the input terminal INa of the buffer circuit 621, and the potential VDD2 is inputted to the input terminal INb of the buffer circuit 621. By inputting the potential VSS2 to the input terminal INa and inputting the potential VDD2 to the input terminal INb, the potential VSS is outputted from the output terminal OTBF of the buffer circuit 621. Thus, the potential VSS is outputted from the wiring OTL of the circuit 610.

The length of the pulse signal outputted from the output terminal LOTb corresponds to one cycle of the clock signal inputted to the wiring CLKL. Thus, the pulse signal outputted from the output terminal LOTb decreases to the low-level potential L (GND) at the time T36, and accordingly the potentials of the output terminal OTD of the differential amplifier 622_2 and the node NDb decrease to the potential VSS2. Note that the potential outputted from the output terminal OTBF of the buffer circuit 621 is the potential VSS continuously since before the time T36. Thus, the potential VSS is outputted from the wiring OTL of the circuit 610.

When the level shifter 104 has such a configuration of the level shifter 620 illustrated in FIG. 19A that the input signal to the level shifter 620 is generated in the logic circuit 630, the level of the input potential is shifted higher or lower. Note that the level shifter 620 may be used to shift the level of a timing signal inputted to a gate driver of a liquid crystal element.

OS transistors can be used for the transistors Tr1 to Tr4 included in the pixel circuits 21 to 25, and the pixel circuits 31 to 36 and the transistors Tr11 to Tr23, the transistors Tr31 to Tr36, the transistors Tr81 to Tr88, and the transistors Tr91 to Tr97 included in the gate driver 103 or the like.

In particular, in the case where the gate driver 103 is formed using only OS transistors, a timing signal inputted to the gate driver 103 is preferably set to a high voltage because the field-effect mobility of the OS transistor is lower than that of a Si transistor in some cases. In such a case, it is necessary that the timing signal inputted to the gate driver 103 is raised by the level shifter 600, the level shifter 620, or the like. In other words, the following configuration is preferable: in the display device 100 illustrated in FIGS. 1A and 1B, the level shifter 600 (level shifter 620) is used as the level shifter 104, a timing signal is transmitted to the level shifter 600 (level shifter 620) from the controller IC 112, the level of the timing signal is shifted by the level shifter 600 (level shifter 620), and the signal is inputted to the gate driver 103.

In the case where the level shifter 620 is used as the level shifter 104, the logic circuit 630 is preferably formed in the controller IC 112 in the display device 100 illustrated in FIGS. 1A and 1B. When the logic circuit 630 has a complementary MOS (CMOS) structure, the circuit size can be reduced. Thus, the logic circuit 630 is preferably formed using only Si transistors or using both Si transistors and OS transistors.

In such a structure, the level shifter 104 is preferably formed using only OS transistors. With such a structure, a reduction in power consumption, a reduction in signal delay, and an improvement in operation characteristics can be achieved. Furthermore, the level shifter 104 can be formed concurrently with the gate driver 103 over the base 101, and thus, a fabrication process of the display device 100 can be shortened.

Note that this embodiment is effective not only in the display device 100 but also in the display device 100A.

This embodiment can be combined with any of the other embodiments in this specification as appropriate.

(Embodiment 3)

In this embodiment, a chip of a source driver IC or a controller IC that can be mounted over the display device 100 or the display device 100A described in Embodiment 1 will be described.

<Source Driver IC>

Figure 20:
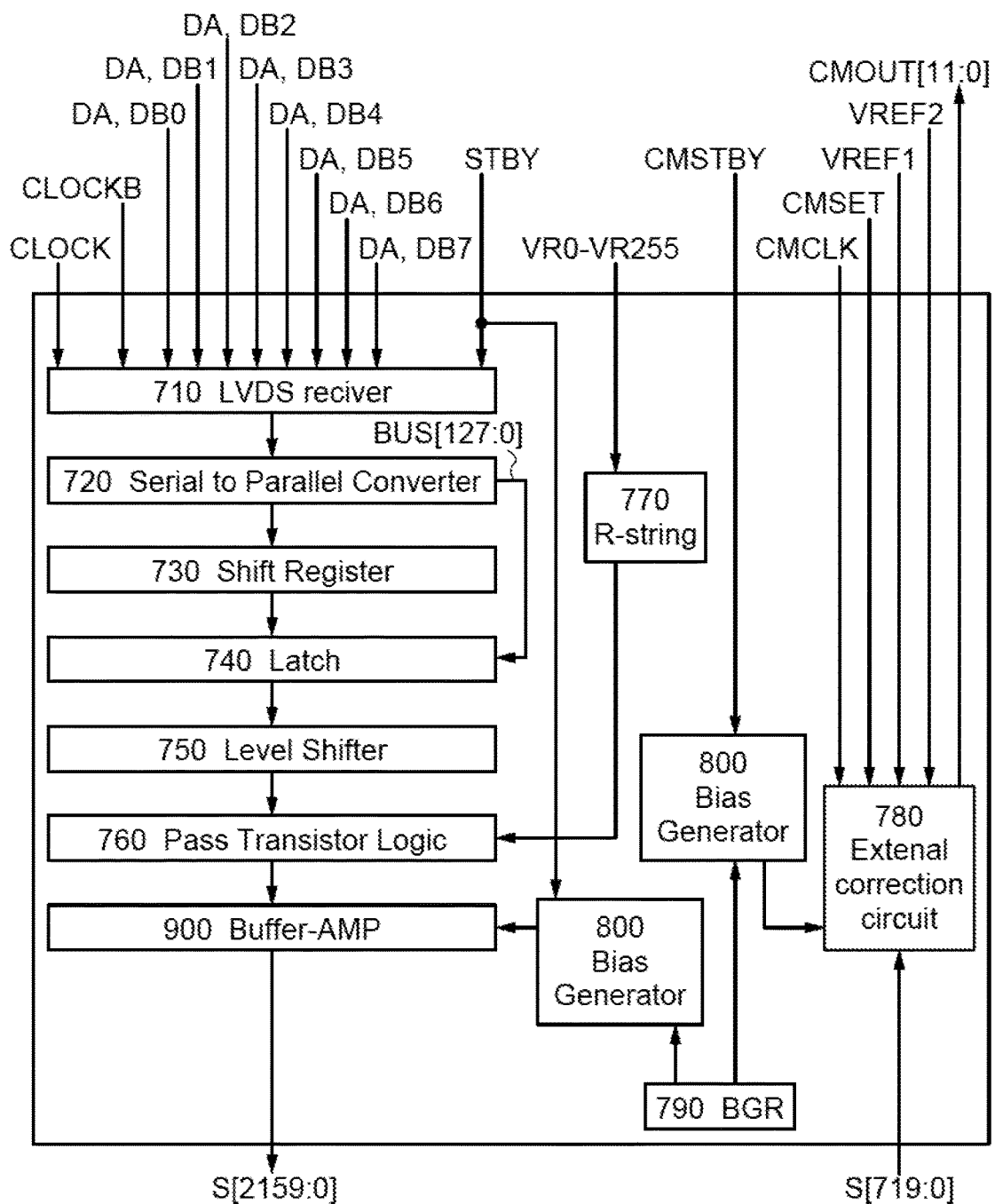
FIG. 20 is a block diagram illustrating a structure example of a source driver IC.

FIG. 20 is a block diagram illustrating an example of a source driver IC. The source driver IC 111 includes a low voltage differential signaling (LVDS) receiver 710, a serial-parallel converter circuit 720, a shift register circuit 730, a latch circuit 740, a level shifter 750, a pass transistor logic circuit 760, a resistor string circuit 770, an external correction circuit 780, a band gap reference (BGR) circuit 790, bias generators 800, and a buffer amplifier 900. Note that the number of the bias generators 800 included in the source driver IC 111 in FIG. 20 is two.

The LVDS receiver 710 is electrically connected to an external host processor. The LVDS receiver 710 has a function of receiving video signals from the host processor. Moreover, the LVDS receiver 710 converts a differential signal into a single-ended signal and sends the signal to the serial-parallel converter circuit 720. In FIG. 20, an analog voltage signal DA,DB0, an analog voltage signal DA,DB1, an analog voltage signal DA,DB2, an analog voltage signal DA,DB3, an analog voltage signal DA,DB4, an analog voltage signal DA,DB5, an analog voltage signal DA,DB6, and an analog voltage signal DA,DB7 are input as video signals to the LVDS receiver. Note that the LVDS receiver 710 sequentially operates in response to inputs of a clock signal CLOCK and a clock signal CLOCKB and can change from a driving state to a standby state (can be temporarily stopped) in response to a standby signal STBY. Note that the clock signal CLOCKB is an inverted signal of the clock signal CLOCK.

The serial-parallel converter circuit 720 is electrically connected to the LVDS receiver 710. The serial-parallel converter circuit 720 has a function of receiving a single-ended signal from the LVDS receiver 710. Moreover, the serial-parallel converter circuit 720 converts the single-ended signal into parallel signals and transmits the signals as signals BUS[127:0] to internal buses.

The shift register circuit 730 is electrically connected to the serial-parallel converter circuit 720, and the latch circuit 740 is electrically connected to the shift register circuit 730. The shift register circuit 730 has a function of designating the timing at which data in the internal bus is stored in the latch circuit 740 in each line, in synchronization with the serial-parallel converter circuit 720.

The level shifter 750 is electrically connected to the latch circuit 740. The level shifter 750 has a function of shifting the levels of pieces of data in all the lines when the pieces of data in all the lines are stored in the latch circuit 740.

The pass transistor logic circuit 760 is electrically connected to the level shifter 750 and the resistor string circuit 770. Note that the pass transistor logic circuit 760 and the resistor string circuit 770 form a digital to analog converter (DAC). An 8-bit signal (denoted by VR0-VR255 in FIG. 20) is inputted to the resistor string circuit 770, and the resistor string circuit 770 outputs a potential corresponding to the signal to the pass transistor logic circuit 760. The pass transistor logic circuit 760 has a function of digital-analog conversion of the pieces of data with the shifted levels when the potential is supplied.

The buffer amplifier 900 is electrically connected to the pass transistor logic circuit 760. The buffer amplifier 900 has a function of amplifying the data subjected to digital-analog conversion and sending the amplified data as a data signal (denoted by S[2159:0] in FIG. 20) to a pixel array.

The BGR circuit 790 has a function of generating a voltage serving as a reference for driving the source driver IC 111. The BGR circuit 790 is electrically connected to each of the bias generators.

One of the bias generators 800 is electrically connected to the BGR circuit 790 and the buffer amplifier 900. The one bias generator 800 has a function of generating a bias voltage for driving the buffer amplifier 900 on the basis of the voltage serving as a reference that is generated in the BGR circuit 790. Note that the standby signal STBY is inputted to the one bias generator 800 at the same timing as the input of the standby signal STBY to the LVDS receiver 710 to cause the one bias generator 800 to enter a standby state (to stop temporarily or to enter an idling stop state).

The other of the bias generators 800 is electrically connected to the external correction circuit 780. The other of the bias generators 800 has a function of generating a bias voltage for driving the external correction circuit 780 on the basis of the voltage serving as a reference that is generated in the BGR circuit 790. Note that when the external correction circuit 780 does not need to operate, a standby signal CMSTBY is transmitted to the other bias generator 800 to cause the other bias generator 800 to enter a standby state (to stop temporarily or to enter an idling stop state).

The external correction circuit 780 is electrically connected to transistors included in pixels. When pixel transistors in the pixel array have variations in voltage-current characteristics, the variations influence an image displayed on the display device, causing reduction in the display quality of the display device. The external correction circuit 780 has a function of measuring the amount of current flowing thought the pixel transistor and adjusting the amount of the current flowing through the pixel transistor as appropriate depending on the measured current amount. A set signal CMSET is inputted to the external correction circuit 780 to initialize the external correction circuit 780. The external correction circuit 780 operates with input of a clock signal CMCLK. The external correction circuit 780 is supplied with signals (denoted by S[719:0] in FIG. 20) from the transistors included in the pixel circuits, and makes determination related to image correction with a reference potential VREF1 and a reference potential VREF2 that are supplied to the external correction circuit 780, used as references. A result of the determination relating to correction is sent as an output signal CMOUT[11:0] to an image processor provided in the outside of the source driver IC 111. The image processor corrects image data on the basis of the contents of CMOUT[11:0].

Note that the source driver IC 111 is not necessarily provided with the external correction circuit 780. For example, instead of the external correction circuit 780 provided in the source driver IC 111, a correction circuit may be provided in each pixel included in the pixel array. Alternatively, for example, the external correction circuit 780 may be provided in a controller IC described later, instead of being provided in the source driver IC 111.

To form circuits in the source driver IC 111, high withstand-voltage Si transistors are preferably used. With the high withstand-voltage Si transistors, miniaturization of the circuits in the source driver IC 111 becomes possible in some cases, and thus, a high-resolution display device can be achieved.

<Controller IC>

Figure 21:
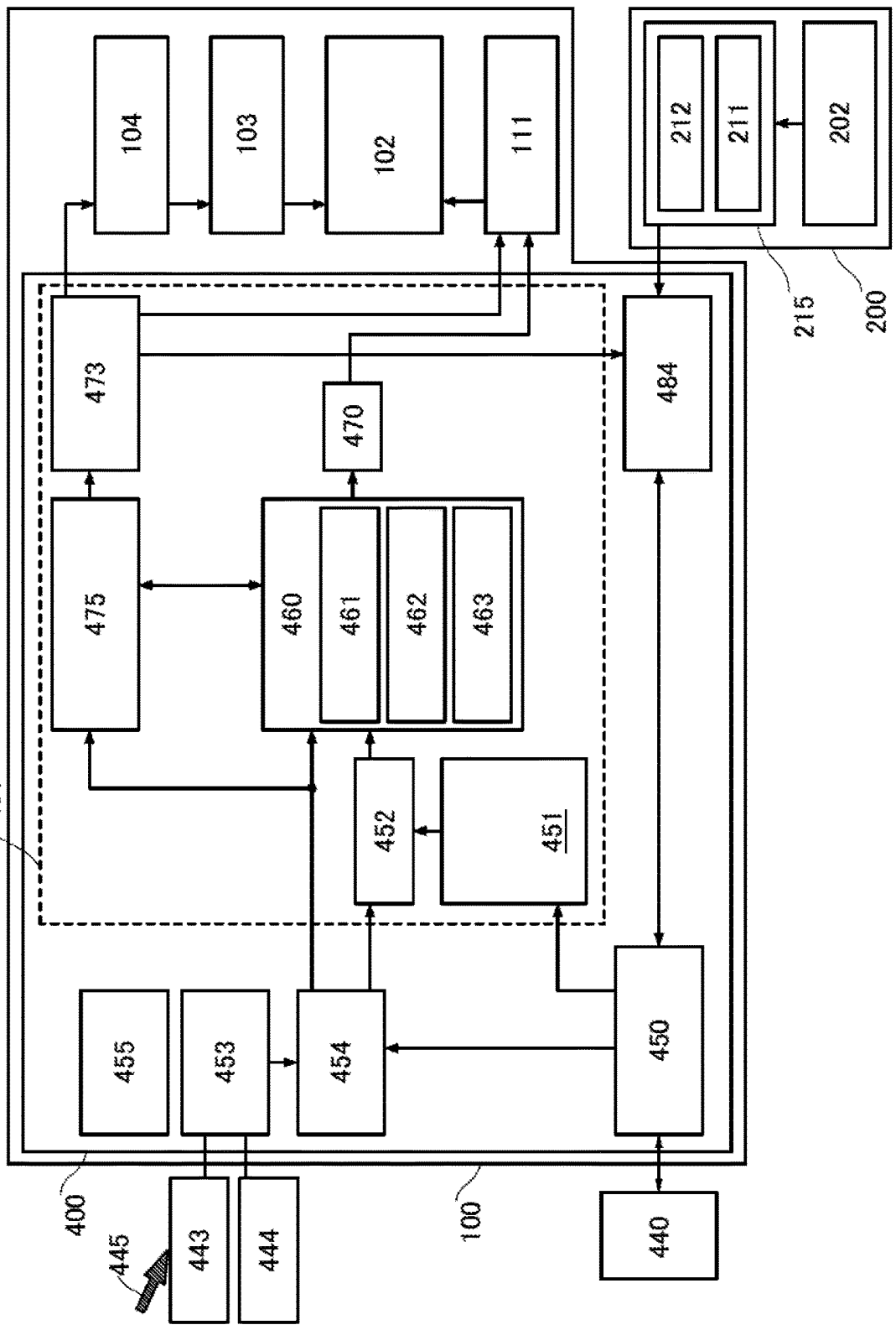
FIG. 21 is a block diagram illustrating a configuration example of a controller IC.

FIG. 21 is a block diagram illustrating a structure example of a controller IC 400 that can be used for the display device 100. The controller IC 400 is an example of the controller IC 112 and includes an interface 450, a frame memory 451, a decoder 452, a sensor controller 453, a controller 454, a clock generation circuit 455, an image processing portion 460, a memory 470, a timing controller 473, a register 475, and a touch sensor controller 484.

The controller IC 400 is preferably mounted over a base by a COG method. Alternatively, the controller IC 400 may be mounted on an FPC or the like by a COF method depending on cases. FIG. 21 shows functions of the controller IC 400 in detail, which illustrates a host device 440, the level shifter 104, the gate driver 103, the display portion 102, the source driver IC 111, and the touch sensor unit 200. Furthermore, as described in Embodiment 1, each of the level shifter 104, the gate driver 103, and the display portion 102 are preferably formed using OS transistors over the base.

Communication between the controller IC 400 and the host device 440 is performed through the interface 450. Image data, a variety of control signals, and the like are transmitted from the host device 440 to the controller IC 400. Information on a touch position or the like obtained by the touch sensor controller 484 is transmitted from the controller IC 400 to the host device 440. Note that the decision whether the circuits included in the controller IC 400 are chosen or not is made as appropriate depending on the standard of the host device 440, the specifications of the display device 100, and the like.

The frame memory 451 is a memory for storing the image data inputted to the controller IC 400. In the case where compressed image data is transmitted from the host device, the frame memory 451 can store the compressed image data. The decoder 452 is a circuit for decompressing the compressed image data. When decompression of the image data is not needed, processing is not performed in the decoder 452. Alternatively, the decoder 452 can be provided between the frame memory 451 and the interface 450.

The image processing portion 460 has a function of performing various kinds of image processing on the image data. The image processing portion 460 includes a gamma correction circuit 461, a dimming circuit 462, and a toning circuit 463, for example.

The image data processed in the image processing portion 460 is outputted to the source driver IC 111 in FIGS. 1A and 1B through the memory 470. The memory 470 is a memory for temporarily storing image data and is called a line buffer in some cases. The source driver IC 111 has a function of processing the inputted image data and writing the image data to the source line of the display portion 102.

The timing controller 473 has a function of generating timing signals to be used in the source driver IC 111, the touch sensor controller 484, and the gate driver 103 in the display device 100. In one embodiment of the present invention, the level of a timing signal inputted to the gate driver 103 is shifted by the level shifter 104 in the display device 100, and then the signal is transmitted to the gate driver 103. The gate driver 103 has a function of selecting a pixel in the display portion 102.

The touch sensor controller 484 has a function of controlling the TS driver IC 211 and the sense circuit 212 of the touch sensor unit 200 in FIG. 21. A signal including touch information read from the sense circuit 212 is processed in the touch sensor controller 484 and transmitted to the host device 440 through the interface 450. The host device 440 generates image data reflecting the touch information and transmits the image data to the controller IC 400. Note that the controller IC 400 can reflect the touch information in the image data.

The clock generation circuit 455 has a function of generating a clock signal to be used in the controller IC 400. The controller 454 has a function of processing a variety of control signals transmitted from the host device 440 through the interface 450 and controlling a variety of circuits in the controller IC 400. The controller 454 also has a function of controlling power supply to the variety of circuits in the controller IC 400. Hereinafter, temporary stop of power supply to a circuit that is not used is referred to as power gating.

Note that a circuit subjected to the power gating is not limited to the circuits in a region 490. For example, power gating may be performed on the gate driver 103, the level shifter 104, the source driver IC 111, and the display portion 102.

In particular, when the display portion 102 includes the OS transistor, image data can be stored in a display element for a long time because the off-state current of the OS transistor is extremely low. In other words, refresh operation of the image data is not necessarily performed in displaying a still image, and thus power gating can be performed on a predetermined circuit in the display device 100. In this specification, such operation is referred to as idling stop (also referred to as IDS in this specification) driving.

The register 475 stores data used for the operation of the controller IC 400. The data stored in the register 475 includes a parameter used to perform correction processing in the image processing portion 460, parameters used to generate waveforms of a variety of timing signals in the timing controller 473, and the like. The register 475 is provided with a scan chain register including a plurality of registers.

The sensor controller 453 is electrically connected to the optical sensor 443. The optical sensor 443 senses external light 445 and generates a sensor signal. The sensor controller 453 generates a control signal on the basis of the sensor signal. The control signal generated in the sensor controller 453 is outputted to the controller 454, for example. Note that the optical sensor 443 is not necessarily provided.

The dimming circuit 462 has a function of adjusting brightness (also called luminance) of image data displayed on the display portion 102. Here, the adjustment can be referred to as dimming or dimming treatment. In particular, the dimming treatment can be performed in combination with the optical sensor 443. In this case, measurement is performed using the optical sensor 443 and the sensor controller 453. The luminance of the image data displayed on the display portion 102 can be adjusted in accordance with the brightness of the external light 445.

The toning circuit 463 can correct a color (also called a color tone) of image data displayed on the display portion 102. Here, the correction can be referred to as toning or toning treatment.

The image processing portion 460 might include another processing circuit such as an RGB-RGBW conversion circuit depending on the specifications of the display device 100. The RGB-RGBW conversion circuit has a function of converting image data of red, green, and blue (RGB) into image signals of red, green, blue, and white (RGBW). That is, in the case where the display device 100 includes pixels of four colors of RGBW, power consumption can be reduced by displaying a white (W) component in the image data using the white (W) pixel. Note that in the case where the display unit 100 includes pixels of four colors of RGBY, for example, a RGB-RGBY (red, green, blue, and yellow) conversion circuit without limitation to the RGB-RGBW conversion circuit can be used.

<Parameter>

Image correction processing such as gamma correction, dimming, or toning corresponds to processing of generating output correction data Y with respect to input image data X. The parameter that the image processing portion 460 uses is a parameter for converting the image data X into the correction data Y.

Figure 22A:
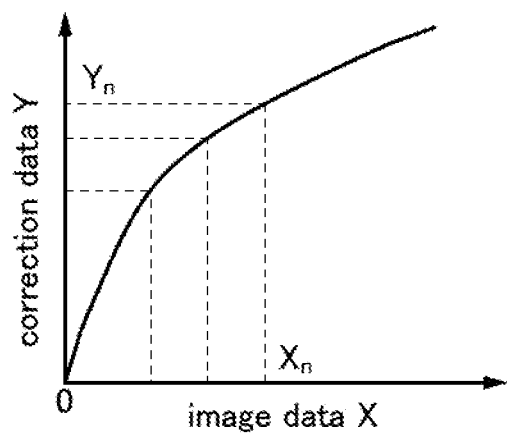
FIGS. 22A to 22C are graphs explaining a parameter.
Figure 22B:
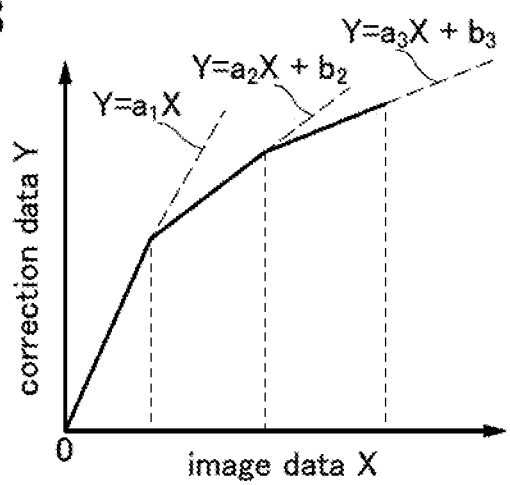

As a parameter setting method, there are a table method and a function approximation method. In a table method shown in FIG. 22A, correction data Yn with respect to image data Xn is stored in a table as a parameter. In the table method, a number of registers for storing the parameters that correspond to the table is necessary; however, correction can be performed with high degree of freedom. In contrast, in the case where the correction data Y with respect to the image data X can be empirically determined in advance, it is effective to employ a function approximation method as shown in FIG. 22B. Note that a1, a2, b2, and the like are parameters. Although a method of performing linear approximation in every period is shown here, a method of performing approximation with a nonlinear function can be employed. In the function approximation method, correction is performed with low degree of freedom; however, the number of registers for storing parameters that defines a function can be small.

Figure 22C:
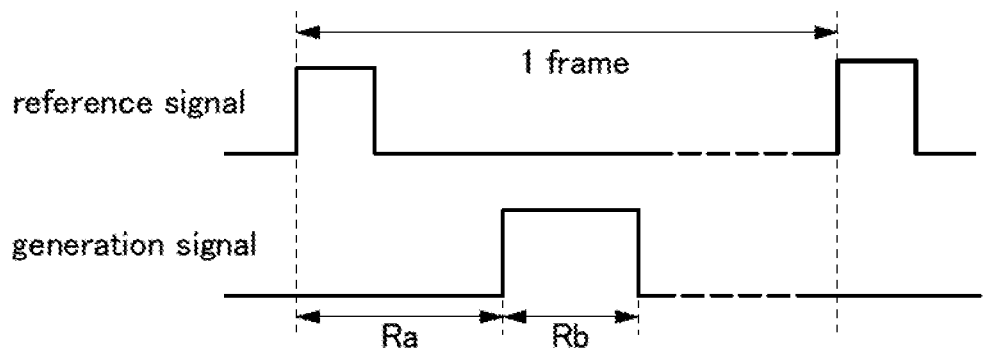

The parameter that the timing controller 473 uses indicates timing at which a generation signal of the timing controller 473 becomes a low-level potential "L" (or high-level potential "H") with respect to a reference signal as explained in FIG. 22C. A parameter Ra (or Rb) indicates the number of clock cycles that corresponds to timing at which the parameter becomes "L" (or "H") with respect to the reference signal.

The above parameter for correction can be stored in the register 475. Other parameters that can be stored in the register 475 include data of the EL correction circuit 464, luminance, color tones, and setting of energy saving (time until display is made dark or turn off display) of the display device 100 which are set by a user, sensitivity of the touch sensor controller 484, and the like.

<Power Gating>

In the case where image data transmitted from the host device 440 is not changed, the controller 454 can conduct power gating on some circuits in the controller IC 400. Specifically, for example, the circuits subjected to power gating are circuits in a region 490 (the frame memory 451, the decoder 452, the image processing portion 460, the memory 470, the timing controller 473, and the register 475). Power gating can be performed in the case where a control signal that indicates no change in the image data is transmitted from the host device 440 to the controller IC 400 and detected by the controller 454.

The circuits subjected to power gating are not limited to the circuits in the controller IC 400. For example, the power gating may be performed on the source driver IC 111, the level shifter 104, the gate driver 103, and the like.

The circuits in the region 490 are the circuits relating to image data and the circuits for driving the display device 100; therefore, the circuits in the region 490 can be temporarily stopped in the case where the image data is not changed. Note that even in the case where the image data is not changed, a time during which a transistor used for a pixel in the display portion 102 can store data (time for idling stop) may be considered. Furthermore, in the case where a liquid crystal element is used as a reflective element in the pixel in the display portion 102, a time for inversion driving performed to prevent burn-in of the liquid crystal element may be considered.

For example, the controller 454 may be incorporated with a timer function so as to determine timing at which power supply to the circuits in the region 490 is restarted, on the basis of time measured by a timer. Note that it is possible to store image data in the frame memory 451 or the memory 470 in advance and supply the image data to the display portion 102 at inversion driving. With such a structure, inversion driving can be performed without transmitting the image data from the host device 440. Thus, the amount of data transmitted from the host device 440 can be reduced and power consumption of the controller IC 400 can be reduced.

Specific circuit configurations of the frame memory 451 and the register 475 will be described below. Note that the circuits that can be power gated are not limited to the circuits in the region 490, the sensor controller 453, the touch sensor controller 484, and the like, which are described here. A variety of combinations can be considered depending on the configuration of the controller IC 400, the standard of the host device 440, the specifications of the display device 100, and the like.

<Frame Memory 451>

FIG. 23A illustrates a configuration example of the frame memory 451. The frame memory 451 includes a control portion 502, a cell array 503, and a peripheral circuit 508. The periphery circuit 508 includes a sense amplifier circuit 504, a driver 505, a main amplifier 506, and an input/output circuit 507.

The control portion 502 has a function of controlling the frame memory 451. For example, the control portion 502 controls the driver 505, the main amplifier 506, and the input/output circuit 507.

The driver 505 is electrically connected to a plurality of wirings WL and CSEL. The driver 505 generates signals outputted to the plurality of wirings WL and CSEL.

The cell array 503 includes a plurality of memory cells 509. The memory cells 509 are electrically connected to wirings WL, LBL (or LBLB), and BGL. The wiring WL is a word line. The wirings LBL and LBLB are local bit lines. Although a folded-bit-line method is employed for the configuration of the cell array 503 in the example of FIG. 23A, an open-bit-line method can also be employed.

FIG. 23B illustrates a configuration example of the memory cell 509. The memory cell 509 includes a transistor MW1 and a capacitor CS1. The memory cell 509 has a circuit configuration similar to that of a memory cell for a dynamic random access memory (DRAM).

The transistor MW1 is an OS transistor. Since an OS transistor has an extremely low off-state current, the frequency of refresh operation of the frame memory 451 can be reduced because leakage of charge from the capacitor CS1 can be suppressed by forming the memory cell 509 using an OS transistor. The frame memory 451 can retain image data for a long time even when power supply is stopped. Moreover, by setting the voltage Vbg_w1 to a negative voltage, the threshold voltage of the transistor MW1 can be shifted to the positive potential side and thus the retention time of the memory cell 509 can be increased.

Here, an off-state current refers to a current that flows between a source and a drain of a transistor in an off state. In the case of an n-channel transistor, for example, when the threshold voltage of the transistor is approximately 0 V to 2 V, a current flowing between a source and a drain when a voltage of a gate with respect to the source is negative can be referred to as an off-state current. An extremely low off-state current means that, for example, an off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

A metal oxide (oxide semiconductor) in a channel formation region of an OS transistor has a bandgap of 3.0 eV or higher; thus, the OS transistor has a low leakage current due to thermal excitation and, as described above, an extremely low off-state current. The metal oxide in the channel formation region preferably contains at least one of indium (In) and zinc (Zn). Typical examples of such a metal oxide include an In-M-Zn oxide (M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Such a metal oxide can be referred to as a highly purified metal oxide. For example, by using a highly purified metal oxide, the off-state current of the OS transistor that is normalized by channel width can be as low as approximately several yoctoamperes per micrometer to several zeptoamperes per micrometer.

The transistors MW1 in the plurality of memory cells 509 included in the cell array 503 are OS transistors; Si transistors formed over a silicon wafer can be used as transistors in other circuits, for example. Accordingly, the cell array 503 can be stacked over the sense amplifier circuit 504. Thus, the circuit area of the frame memory 451 can be reduced, which leads to miniaturization of the controller IC 400.

The cell array 503 is stacked over the sense amplifier circuit 504. The sense amplifier circuit 504 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 504, one wiring GBL is provided for four wirings LBL, and one wiring GBLB is provided for four wirings LBLB. However, the configuration of the sense amplifier circuit 504 is not limited to the configuration example of FIG. 23A.

The main amplifier 506 is connected to the sense amplifier circuit 504 and the input/output circuit 507. The main amplifier 506 has a function of amplifying the potential difference between the wirings GBL and GBLB. The main amplifier 506 is not necessarily provided.

The input/output circuit 507 has a function of outputting a potential corresponding to a write data to the wirings GBL and GBLB or the main amplifier 506 and a function of outputting the potentials of the wirings GBL and GBLB or an output potential of the main amplifier 506 to the outside as read data. The sense amplifier SA from which data is read and the sense amplifier SA to which data is written can be selected in accordance with the signal of the wiring CSEL. Therefore, there is no need to provide a selection circuit such as a multiplexer in the input/output circuit 507. Thus, the input/output circuit 507 can have a simple circuit configuration and a small occupied area.

<Register 475>

Figure 24:
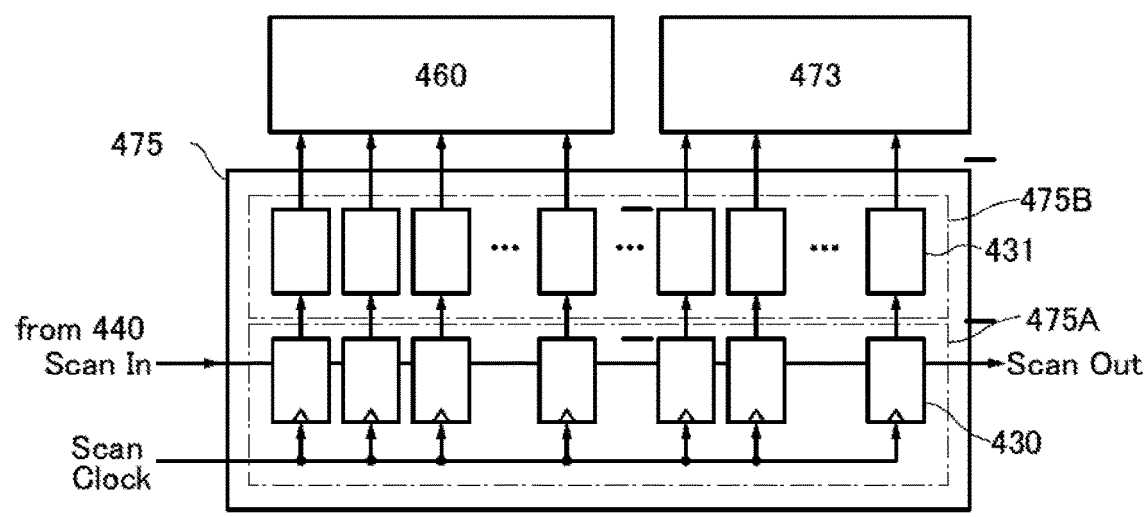
FIG. 24 is a block diagram illustrating a configuration example of a register.

FIG. 24 is a block diagram illustrating a configuration example of the register 475. The register 475 includes a scan chain register portion 475A and a register portion 475B. The scan chain register portion 475A includes a plurality of registers 430. The scan chain register is formed by the plurality of registers 430. The register portion 475B includes a plurality of registers 431.

The register 430 is a nonvolatile register which does not lose data even when power supply is stopped. Here, the register 430 is provided with a retention circuit including an OS transistor to be nonvolatile.

The other register 431 is a volatile register. There is no particular limitation on the circuit configuration of the register 431, and a latch circuit, a flip-flop circuit, or the like is used as long as data can be stored. The image processing portion 460 and the timing controller 473 access the register portion 475B and take data from the corresponding registers 431. Alternatively, the processing contents of the image processing portion 460 and the timing controller 473 are controlled in accordance with data supplied from the register portion 475B.

To update data stored in the register 475, first, data in the scan chain register portion 475A are changed. After the data in the registers 430 of the scan chain register portion 475A are rewritten, the data are loaded into the registers 431 of the register portion 475B at the same time.

Accordingly, the image processing portion 460, the timing controller 473, and the like can perform various kinds of processing using the data which are updated at the same time. The operation of the controller IC 400 can be stable because simultaneity can be maintained in updating data. By providing the scan chain register portion 475A and the register portion 475B, data in the scan chain register portion 475A can be updated even during the operation of the image processing portion 460 and the timing controller 473.

At the time when the power gating is executed in the controller IC 400, power supply is stopped after data is stored (saved) in the retention circuit of the register 430. After the power supply is restored, normal operation is restarted after data in the registers 430 are restored (loaded) in the register 431. Note that in the case where the data stored in the register 430 and the data stored in the register 431 do not match each other, it is preferable to save the data of the register 431 in the register 430 and then store the data again in the retention circuit of the register 430. For example, while updated data is inserting in the scan chain register portion 475A, the data do not match each other.

Figure 25:
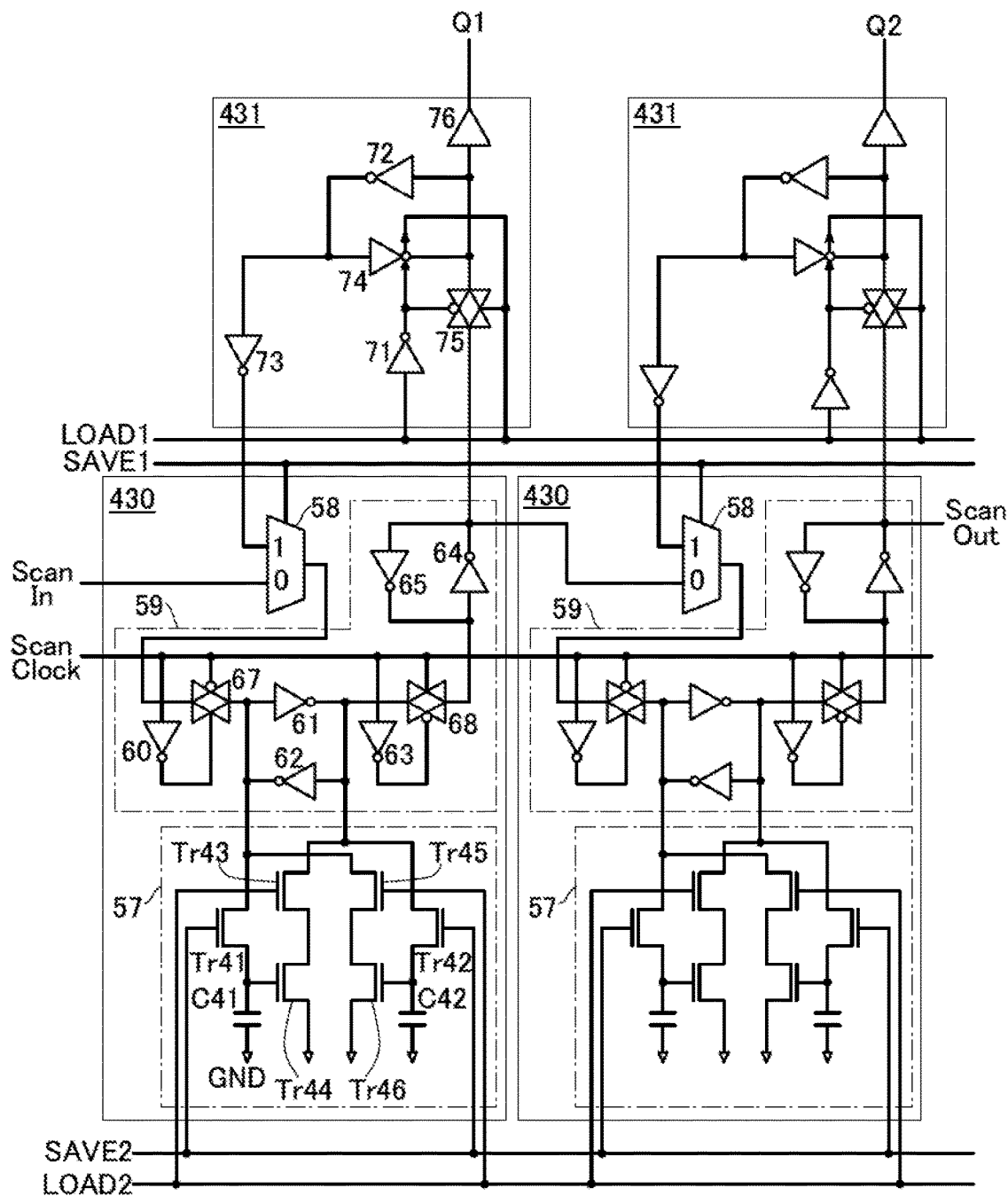
FIG. 25 is a circuit diagram illustrating a configuration example of a register.

FIG. 25 illustrates an example of a circuit configuration of the register 430 and the register 431. FIG. 25 illustrates two registers 430 of the scan chain register portion 475A and corresponding two registers 431.

The register 430 includes a retention circuit 57, a selector 58, and a flip-flop circuit 59. The selector 58 and the flip-flop circuit 59 form a scan flip-flop circuit.

A signal SAVE2 and a signal LOAD2 are inputted to the retention circuit 57. The retention circuit 57 includes transistors Tr41 to Tr46 and capacitors C41 and C42. Each of the transistors Tr41 and Tr42 is an OS transistor. The transistors Tr41 and Tr42 may each be an OS transistor having a back gate similar to the transistor MW1 of the memory cell 509 (see FIG. 23B).

A 3-transistor gain cell is formed by the transistor Tr41, the transistor Tr43, the transistor Tr44, and the capacitor C41. In a similar manner, a 3-transistor gain cell is formed by the transistor Tr42, the transistor Tr45, the transistor Tr46, and the capacitor C42. The two gain cells store complementary data retained in the flip-flop circuit 59. Since the transistor Tr41 and the transistor Tr42 are OS transistors, the retention circuit 57 can retain data for a long time even when power supply is stopped. In the register 430, the transistors other than the transistor Tr41 and the transistor Tr42 may be formed using Si transistors.

The retention circuit 57 stores complementary data retained in the flip-flop circuit 59 in response to the signal SAVE2 and loads the retained data in the flip-flop circuit 59 in response to the signal LOAD2.

An output terminal of the selector 58 is electrically connected to an input terminal of the flip-flop circuit 59, and an input terminal of the register 431 is electrically connected to a data output terminal. The flip-flop circuit 59 includes an inverter 60, an inverter 61, an inverter 62, an inverter 63, an inverter 64, an inverter 65, an analog switch 67, and an analog switch 68. The on or off state of each of the analog switch 67 and the analog switch 68 is controlled by a scan clock signal. The flip-flop circuit 59 is not limited to the circuit configuration in FIG. 25 and a variety of flip-flop circuits 59 can be employed.

An output terminal of the register 431 is electrically connected to one of two input terminals of the selector 58, and an output terminal of the flip-flop circuit 59 in the previous stage is electrically connected to the other input terminal of the selector 58. Note that data is inputted from the outside of the register 475 to the input terminal of the selector 58 in the first stage of the scan chain register portion 475A. The selector 58 outputs a signal from one of the two input terminals to the output terminal in accordance with a signal SAVE 1. Specifically, the selector 58 has a function of selecting either data transmitted from the flip-flop circuit 59 in the previous stage or data transmitted from the register 431 and inputting the selected data to the flip-flop circuit 59.

The register 431 includes an inverter 71, an inverter 72, an inverter 73, a clocked inverter 74, an analog switch 75, and a buffer 76. The register 431 loads the data of the flip-flop circuit 59 on the basis of a signal LOAD1. Then the loaded data is outputted from a terminal Q1 and a terminal Q2. The transistors of the register 431 may be formed using Si transistors.

<Another Configuration Example of Controller IC>

Another configuration example of a controller IC different from the controller IC 400 is described below.

Figure 26:
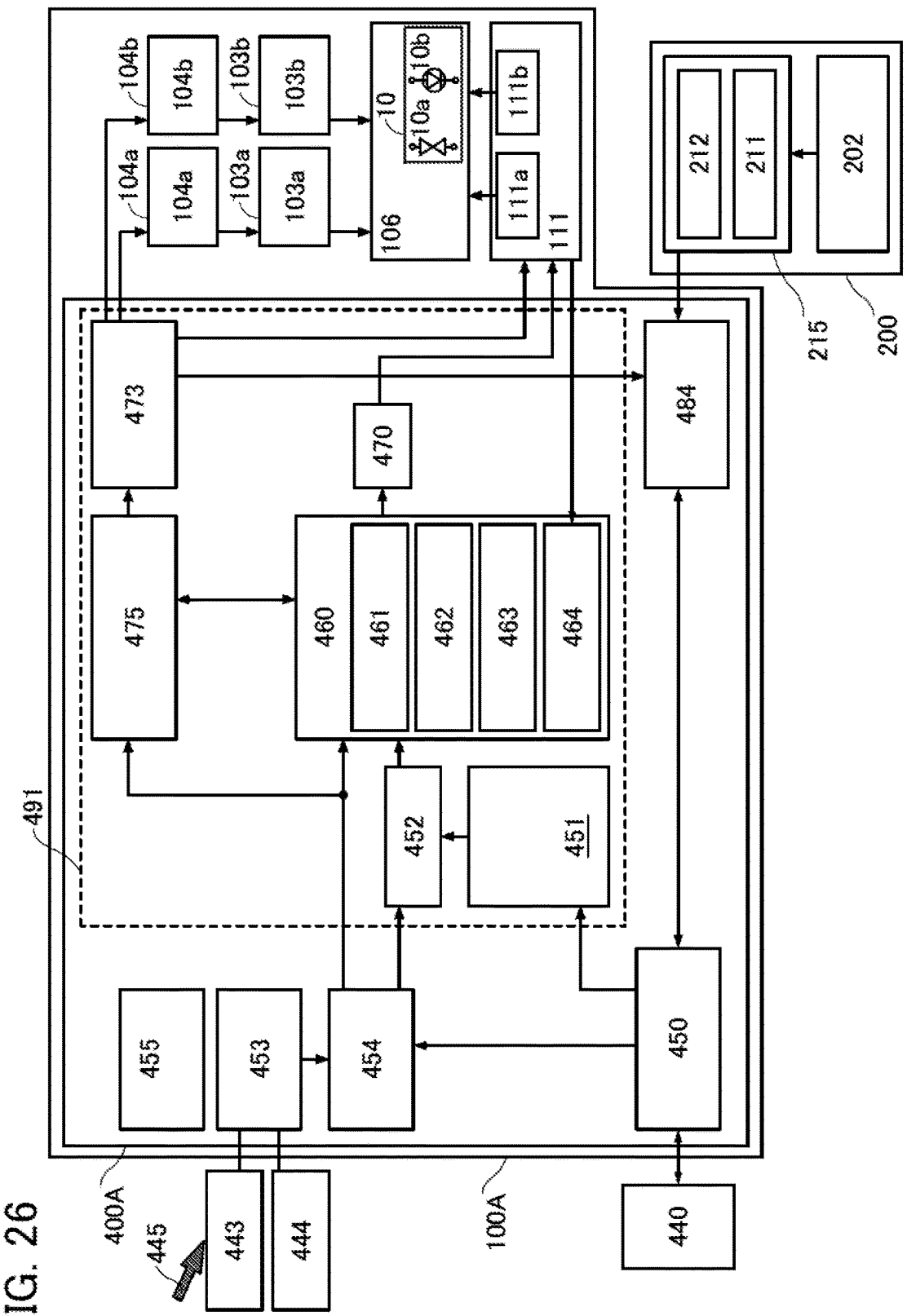
FIG. 26 is a block diagram illustrating a configuration example of a controller IC.

FIG. 26 is a block diagram illustrating a configuration example of the controller IC 112 that can be used for the display device 100A. A controller IC 400A illustrated in FIG. 26 is an example of the controller IC 112 and a modification example of the controller IC 400. The controller IC 112 includes a region 491, and the controller 454 controls the power supply to the circuits in the region 491. As the description of the controller IC 400A, only portions different from those of the controller IC 400 are made, and the description of the same portion as that in the controller IC 400 is omitted.

The controller IC 400A is preferably mounted over the base by a COG method. Alternatively, the controller IC 400A may be mounted on an FPC or the like by a COF method. FIG. 26 shows functions of the controller IC 400A in detail, which illustrates the level shifter 104a, the level shifter 104b, the gate driver 103a, the gate driver 103b, the display portion 106, the source driver IC 111, and the touch sensor unit 200. As described in Embodiment 1, each of the level shifter 104a, the level shifter 104b, the gate driver 103a, the gate driver 103b, and the display portion 106 is formed using OS transistors over the base.

As described in Embodiment 1 and Embodiment 2, the display device 100A is a hybrid display device, and thus a pixel 10 of the display portion 106 in the display device 100A includes a reflective element 10a and a light-emitting element 10b. The reflective element 10a is a display element that displays an image with use of reflected light in the display device, and a liquid crystal element, for example, can be used as the reflective element 10a. The light-emitting element 10b is a display element that displays an image by self-emission in the display device, and an organic EL element, for example, can be used as the light-emitting element 10b. Note that the light-emitting element 10b is not limited to an organic EL element. For example, a transmissive liquid crystal element provided with a backlight, an LED, or a display element utilizing quantum dot may be used. In this case, the controller IC 400A in which a liquid crystal element is used as the reflective element 10a and an organic EL element is used as the light-emitting element 10b is described.

The source driver IC 111 is mounted over the base 101 of the display device 100A by a COG method. In this configuration example, the source driver IC 111 includes a source driver IC 111a and a source driver IC 111b. The source driver IC 111a has a function of driving either the reflective element 10a or the light-emitting element 10b, and the source driver IC 111*b* has a function of driving the other of the reflective element 10*a* and the light-emitting element 10*b*. Although the source driver of the display portion 106 is formed using two kinds of the source drivers IC 111*a* and 111*b*, the configuration of the source driver is not limited thereto. For example, the display device 100A may include a source driver IC that enables both a source driver for driving the reflective element 10*a* and a source driver for driving the light-emitting element 10*b* to drive.

As described in Embodiment 1, the gate drivers 103*a* and 103*b* are formed over the base 101. The gate driver 103*a* has a function of driving a scanning line for one of the reflective element 10*a* and the light-emitting element 10*b*, and the gate driver 103*b* has a function of driving a scanning line for the other of the reflective element 10*a* and the light-emitting element 10*b*. Although two kinds of gate drivers, the gate drivers 103*a* and 103*b*, of the display portion 106 are used, the structure of the gate driver is not limited thereto. For example, the display device 100A may include a gate driver that can drive both the reflective element 10*a* and the light-emitting element 10*b*.

The display device 100A includes an organic EL element as the light-emitting element 10*b*, and thus the EL correction circuit 464 can be provided in the image processing portion 460 of the controller IC 400A. The EL correction circuit 464 is provided in the case where a current detection circuit for detecting the current flowing in the light-emitting element 10*b* is provided for the source driver IC (the source driver IC 111*a* or the source driver IC 111*b*) for driving the light-emitting element 10*b*. The EL correction circuit 464 has a function of adjusting luminance of the light-emitting element 10*b* on the basis of a signal transmitted from the current detection circuit.

In the controller IC 400A, the sensor controller 453 can be electrically connected to the optical sensor 443 as in the controller IC 400. The optical sensor 443 senses external light 445 and generates a sensor signal. The sensor controller 453 generates a control signal on the basis of the sensor signal. The control signal generated in the sensor controller 453 is outputted to the controller 454, for example.

In the case where the reflective element 10*a* and the light-emitting element 10*b* display the same image data, the image processing portion 460 has a function of separately generating image data that the reflective element 10*a* displays and image data that the light-emitting element 10*b* displays. In that case, reflection intensity of the reflective element 10*a* and emission intensity of the light-emitting element 10*b* can be adjusted (dimming treatment) in response to brightness of the external light 445 measured using the optical sensor 443 and the sensor controller 453.

In the case where the display device 100A is used outside at daytime on a sunny day, it is not necessary to make the light-emitting element 10*b* emit light if sufficient luminance can be obtained only with the reflective element 10*a*. This is due to the fact that favorable display cannot be obtained because, even when the light-emitting element 10*b* is used to perform display, the intensity of external light exceeds that of light emitted from the light-emitting element 10*b*. In contrast, in the case where the display device 100A is used at night or in a dark place, display is performed by making the light-emitting element 10*b* emit light.

In response to the brightness of external light, the image processing portion 460 can generate image data that only the reflective element 10*a* displays, image data that only the light-emitting element 10*b* displays, or image data that the reflective element 10*a* and the light-emitting element 10*b* display in combination. Accordingly, the display device 100A can perform favorable display even in an environment with high intensity of external light or an environment with low intensity of external light. Furthermore, power consumption of the display device 100A can be reduced by making the light-emitting element 10*b* emit no light or reducing the luminance of the light-emitting element 10*b* in the environment with bright external light.

Color tones can be corrected by combining the display by the light-emitting element 10*b* with the display by the reflective element 10*a*. A function of measuring the color tones of the external light 445 may be added to the optical sensor 443 and the sensor controller 453 to perform such tone correction. For example, in the case where the display device 100 is used in a reddish environment at evening, a blue (B) component or a green (G) component is not sufficient or both of the components are not sufficient only with the display by the reflective element 10*a*; thus, the color tones can be corrected (calibration processing) by making the light-emitting element 10*b* emit light.

The reflective element 10*a* and the light-emitting element 10*b* can display different image data. In general, operation speed of liquid crystal, electronic paper, or the like that can be used as a reflective element is low in many cases (it takes time to display a picture). Thus, a still image to be a background can be displayed on the reflective element 10*a* and a moving mouse pointer or the like can be displayed on the light-emitting element 10*b*. By performing the above IDS driving on a still image and making the light-emitting element 10*b* emit light to display a moving image, the display device 100A can achieve display of a smooth moving image and reduction of power consumption at the same time. In that case, the frame memory 451 may be provided with regions for storing image data displayed on the reflective element 10*a* and image data displayed on the light-emitting element 10*b*.

The controller IC 400A may be provided with one or both of the TS driver IC 211 and the sense circuit 212. The same applies to the controller IC 400.

«Operation Example»

Operation examples of the controller IC 400A and the register 475 of the display device 100A before shipment, at boot-up of an electronic device including the display device 100A, and at normal operation will be described separately.

<Before Shipment>

Parameters relating to the specifications and the like of the display device 100A are stored in the register 475 before shipment. These parameters include, for example, the number of pixels, the number of touch sensors, parameters used to generate the variety of timing signals in the timing controller 473, and correction data of the EL correction circuit 464 in the case where the source driver IC (the source driver IC 111*a* or the source driver IC 111*b*) is provided with the current detection circuit that detects current flowing through the light-emitting element 10*b*. These parameters may be stored by providing a dedicated ROM other than the register 475.

<At Boot-Up>

At boot-up of an electronic device including the display device 100A, the parameters set by an user or the like which are transmitted from the host device 440 are stored in the register 475. These parameters include, for example, luminance, color tones, sensitivity of a touch sensor, setting of energy saving (time taken to make display dark or turn off display), and a curve or a table for gamma correction. Note that in storing the parameters in the register 475, a scan clock signal and data corresponding to the parameters in synchronization with the scan clock signal are transmitted from the controller 454 to the register 475.

<Normal Operation>

Normal operation can be classified into a state of displaying a moving image or the like, a state capable of performing IDS driving while a still image is being displayed, a state of displaying no image, and the like. The image processing portion 460, the timing controller 473, and the like are operating in the state of displaying a moving image or the like; however, the image processing portion 460 and the like are not influenced because only the data of the register 475 in the scan chain register portion 475A are changed. After the data of the scan chain register portion 475A are changed, the data of the scan chain register portion 475A are loaded in the register portion 475B at the same time, so that change of the data of the register 475 is completed. The operation of the image processing portion 460 and the like is switched to the operation corresponding to the data.

In the state capable of performing IDS driving while a still image is displaying, the register 475 can be power gated in a manner similar to that of the other circuits in the region 490. In that case, the complementary data retained in the flip-flop circuit 59 is stored in the retention circuit 57 in response to the signal SAVE2 before the power gating in the register 430 included in the scan chain register portion 475A.

To restore the data retained in the retention circuit 57 from power gating, the data is loaded in the flip-flop circuit 59 in response to the signal LOAD2 and the data in the flip-flop circuit 59 is loaded in the register 431 in response to the signal LOAD1. In this manner, the data of the register 475 becomes effective in the same state as before the power gating. Note that even when the register 475 is in a state of power gating, the parameter of the register 475 can be changed by canceling the power gating in the case where change of the parameter is requested by the host device 440.

In the state of displaying no image, for example, the circuits (including the register 475) in the region 490 can be power gated. In that case, the operation of the host device 440 might also be stopped; however, when the data in the frame memory 451 and the register 475 are restored from the power gating, the frame memory 451 and the register 475 can perform display (a still image) before power gating without waiting the restore of the host device 440 because they are nonvolatile.

For example, a configuration in which an open/close sensor 444 is electrically connected to the sensor controller 453 in the display device 100A is considered. In particular, in the case where the display device 100A with the above configuration is employed for a display portion of a foldable mobile phone, when the mobile phone is folded and the display surface of the display device 100A is sensed to be unused by a signal from the open/close sensor 444, the sensor controller 453, the touch sensor controller 484, and the like can be power gated in addition to the circuits in the region 490.

When the mobile phone is folded, the operation of the host device 440 might be stopped depending on the standard of the host device 440. Even when the mobile phone is unfolded while the operation of the host device 440 is stopped, the image data in the frame memory 451 can be displayed before image data, a variety of control signals, and the like are transmitted from the host device 440 because the frame memory 451 and the register 475 are nonvolatile.

In such a manner, the register 475 includes the scan chain register portion 475A and the register portion 475B and data of the scan chain register portion 475A are changed, so that the data can be changed smoothly without influencing the image processing portion 460, the timing controller 473, and the like. Each register 430 in the scan chain register portion 475A includes the retention circuit 57 and can perform transfer to and restore from a power gated state smoothly.

A logic Si transistor and an OS transistor can be formed over one base. For example, a logic Si transistor is formed on a Si wafer, and an OS transistor is formed above the logic Si transistor, whereby the above-described controller IC 400 or 400A can be achieved.

Note that a configuration of one embodiment of the present invention is not limited to the display device 100 illustrated in FIG. 21 or the display device 100A in FIG. 26. Depending on the circumstances or conditions or as needed, components of the display device 100 in FIG. 21 or the display device 100A in FIG. 26 can be selected as appropriate. For example, in the case where the display device 100 in FIG. 21 or the display device 100A in FIG. 26 is used as a display device in an electronic device that is not a foldable device, the display device 100 in FIG. 21 or the display device 100A in FIG. 26 is not necessarily provided with the open/close sensor 444.

This embodiment can be combined with any of the other embodiments in this specification as appropriate.

(Embodiment 4)

In this embodiment, a specific configuration example of the host device 440 described in the above embodiment will be described.

Figure 27:
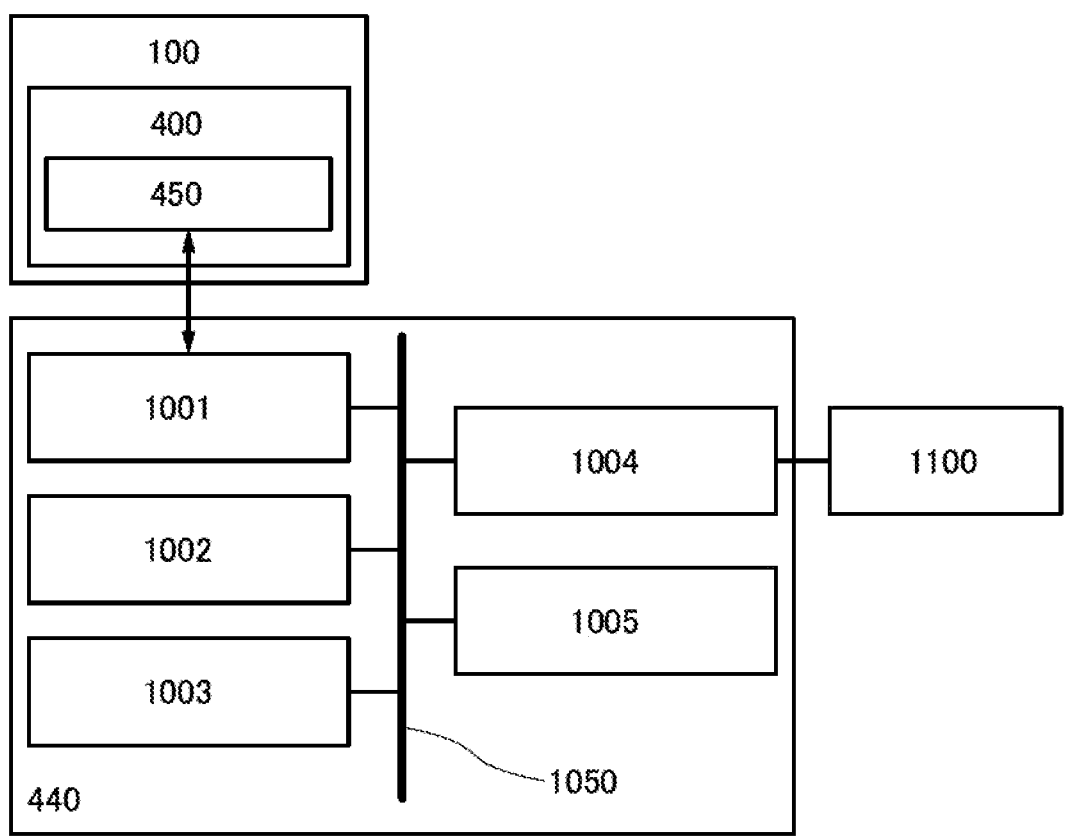
FIG. 27 is a block diagram illustrating a configuration example of a host device.

FIG. 27 is a block diagram illustrating a configuration example of the host device 440. In FIG. 27, the display device 100 and a device 1100 which are electrically connected to the host device 440 are also illustrated.

The host device 440 includes a display interface 1001, a graphics processing unit (GPU) 1002, a processor 1003, a device interface 1004, a memory 1005, and a data bus 1050.

The display interface 1001, the GPU 1002, the processor 1003, the device interface 1004, and the memory 1005 are electrically connected to each other with the data bus 1050.

The display interface 1001 is electrically connected to the interface 450 included in the controller IC 400. The display interface 1001 is a device which performs communication between the controller IC 400 and the host device 440 and control thereof.

The GPU 1002 is a device that processes image data transmitted to the display device 100. In particular, the GPU 1002 can conduct calculation needed to display 3D images, and thus the amount of processing by the processor 1003 can be reduced.

The processor 1003 functions as an arithmetic device or a control device and controls the entire operation of devices in the host device 440. For the processor 1003, a central processing unit (CPU) or a microprocessor (MPU) can be used.

The device interface 1004 performs communication between the host device 440 and the device 1100 corresponding to an external device. Examples of the device 1100 include a keyboard, a mouse, an external storage device, a microphone, and a speaker.

The memory 1005 stores data. In the case where data is stored temporarily, a volatile memory such as a dynamic random access memory (DRAM) or a static random access memory (SRAM) can be used. In the case where the data is stored constantly, a nonvolatile memory such as a flash memory, a magnetic memory device (hard disk drive, a magnetic memory, or the like), or a read only memory (ROM) can be used. Furthermore, both the volatile memory and the nonvolatile memory can be used.

This embodiment is effective not only in the display device 100 but also in the display device 100A.

Note that the configuration of the host device 440 described in this embodiment is just an example. Depending on circumstances or conditions or as needed, the components can be selected as appropriate. For example, a plurality of device interfaces may be provided, unlike the case of only one device interface as illustrated in FIG. 27. Furthermore, in the case where the image processing with a high load is not performed, a configuration without the GPU 1002 may be employed.

This embodiment can be combined with any of the other embodiments in this specification as appropriate.

(Embodiment 5)

In this embodiment, a specific structure of the display device 100A that is a hybrid display device will be described.

<Cross-Sectional View>

Figure 28:
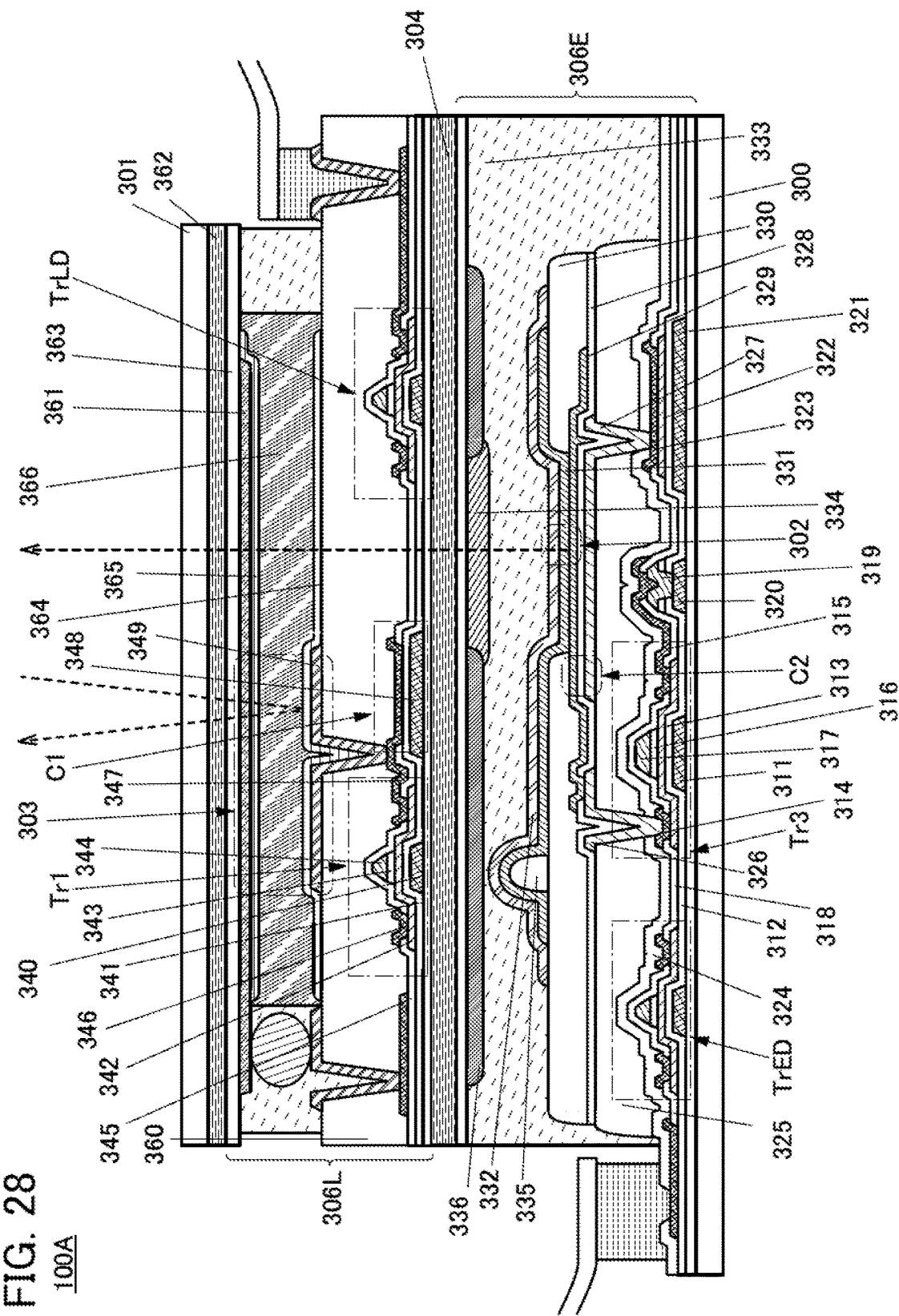
FIG. 28 is a cross-sectional view illustrating an example of a display device.

FIG. 28 is a cross-sectional view illustrating the display device 100A. The display device 100A in FIG. 28 includes the pixel circuit 35 or the pixel circuit 36 described in Embodiment 2.

The display device 100A in FIG. 28 has such a structure that a display portion 306E and a display portion 306L are stacked between a substrate 300 and a substrate 301. Specifically, the display portion 306E and the display portion 306L are bonded to each other with a bonding layer 304 in FIG. 28.

In addition, a light-emitting element 302, the transistor Tr3, and the capacitor C2 included in a pixel of the display portion 306E, and a transistor TrED included in a driver circuit of the display portion 306E are illustrated in FIG. 28. The light-emitting element 302 corresponds to the light-emitting element 10b in the other embodiment. The transistor Tr3 and the capacitor C2 are each described in Embodiment 2.

FIG. 28 also illustrates a liquid crystal element 303, the transistor Tr1, and the capacitor C1, which are included in a pixel of the display portion 306L, and a transistor TrLD included in a driver circuit of the display portion 306L. The liquid crystal element 303 corresponds to the reflective element 10a described in the other embodiment. The transistor Tr1 and the capacitor C1 are described in Embodiment 2.

The transistor Tr3 includes a conductive layer 311 functioning as a back gate, an insulating layer 312 over the conductive layer 311, a semiconductor layer 313 which is provided over the insulating layer 312 to overlap with the conductive layer 311, an insulating layer 316 over the semiconductor layer 313, a conductive layer 317 which functions as a gate and is positioned over the insulating layer 316, and conductive layers 314 and 315 which are positioned over an insulating layer 318 over the conductive layer 317 and electrically connected to the semiconductor layer 313.

The conductive layer 315 is electrically connected to a conductive layer 319, and the conductive layer 319 is electrically connected to a conductive layer 320. The conductive layer 319 is formed in the same layer as the conductive layer 317. The conductive layer 320 is formed in the same layer as the conductive layer 311.

A conductive layer 321 which functions as a back gate of the transistor Tr2 (not illustrated) is positioned in the same layer as the conductive layers 311 and 320. The insulating layer 312 is positioned over the conductive layer 321, and a semiconductor layer 322 having a region overlapping with the conductive layer 321 is positioned over the insulating layer 312. The semiconductor layer 322 includes a channel formation region of the transistor Tr2 (not illustrated). The insulating layer 318 is positioned over the semiconductor layer 322, and a conductive layer 323 is positioned over the insulating layer 318. The conductive layer 323 is electrically connected to the semiconductor layer 322 and serves as a source electrode or a drain electrode of the transistor Tr2 (not illustrated).

The transistor TrED has the same structure as the transistor Tr3, and therefore, detailed description thereof is omitted.

An insulating layer 324 is positioned over the transistor Tr3, the conductive layer 323, and the transistor TrED, and an insulating layer 325 is positioned over the insulating layer 324. A conductive layer 326 and a conductive layer 327 are positioned over the insulating layer 325. The conductive layer 326 is electrically connected to the conductive layer 314, and the conductive layer 327 is electrically connected to the conductive layer 323. An insulating layer 328 is positioned over the conductive layers 326 and 327, and a conductive layer 329 is positioned over the insulating layer 328. The conductive layer 329 is electrically connected to the conductive layer 326 and serves as a pixel electrode of the light-emitting element 302.

A region where the conductive layer 327, the insulating layer 328, and the conductive layer 329 overlap with each other serves as the capacitor C2.

An insulating layer 330 is positioned over the conductive layer 329, an EL layer 331 is positioned over the insulating layer 330, and a conductive layer 332 serving as a counter electrode is positioned over the EL layer 331. The conductive layer 329, the EL layer 331, and the conductive layer 332 are electrically connected to each other in an opening of the insulating layer 330. A region where the conductive layer 329, the EL layer 331, and the conductive layer 332 are electrically connected to each other serves as the light-emitting element 302. The light-emitting element 302 has a top emission structure in which light is emitted in a direction indicated by a dotted arrow from the conductive layer 332 side.

One of the conductive layers 329 and 332 serves as an anode, and the other serves as a cathode. When a voltage higher than the threshold voltage of the light-emitting element 302 is applied between the conductive layer 329 and the conductive layer 332, holes are injected to the EL layer 331 from the anode side and electrons are injected to the EL layer 331 from the cathode side. The injected electrons and holes are recombined in the EL layer 331 and a light-emitting substance contained in the EL layer 331 emits light.

Note that in the case where a metal oxide (oxide semiconductor) is used for the semiconductor layers 313 and 322, it is preferable to use an insulating material containing oxygen for the insulating layer 318 and it is preferable to use a material through which impurities such as water and hydrogen do not easily diffuse for the insulating layer 324.

In the case where an organic material is used for the insulating layer 325 or 330, when the insulating layer 325 or 330 is exposed at an end portion of the display device, impurities such as water may enter the light-emitting element 302 and the like from the outside of the display device through the insulating layer 325 or 330. Deterioration of the light-emitting element 302 due to the entry of impurities can lead to deterioration of the display device. For this reason, the insulating layers 325 and 330 are preferably not positioned at the end portion of the display device, as illustrated in FIG. 28.

The light-emitting element 302 overlaps with a coloring layer 334 with an adhesive layer 333 provided therebetween. The spacer 335 overlaps with the light-blocking layer 336 with the adhesive layer 333 provided therebetween. Although FIG. 28 illustrates the case where a space is provided between the conductive layer 332 and the light-blocking layer 336, the conductive layer 332 and the light-blocking layer 336 may be in contact with each other.

The coloring layer 334 is a colored layer that transmits light in a specific wavelength range. For example, a color filter that transmits light in a specific wavelength range, such as red, green, blue, or yellow light, can be used.

Note that one embodiment of the present invention is not limited to a color filter method, and a separate coloring method, a color conversion method, a quantum dot method, and the like may be employed.

The transistor Tr1 in the display portion 306L includes a conductive layer 340 functioning as a back gate, an insulating layer 341 over the conductive layer 340, a semiconductor layer 342 which is provided over the insulating layer 341 to overlap with the conductive layer 340, an insulating layer 343 over the semiconductor layer 342, a conductive layer 344 which functions as a gate and is positioned over the insulating layer 343, and conductive layers 346 and 347 which are positioned over an insulating layer 345 over the conductive layer 344 and electrically connected to the semiconductor layer 342.

A conductive layer 348 is positioned in the same layer as the conductive layer 340. The insulating layer 341 is positioned over the conductive layer 348, and the conductive layer 347 is positioned over the insulating layer 341 and in a region overlapping with the conductive layer 348. A region where the conductive layer 347, the insulating layer 341, and the conductive layer 348 overlap with one another functions as the capacitor C1.

The transistor TrD has the same structure as the transistor Tr1, and therefore, detailed description thereof is omitted.

An insulating layer 360 is positioned over the transistor Tr1, the capacitor C1, and the transistor TrD. A conductive layer 349 is positioned over the insulating layer 360. The conductive layer 349 is electrically connected to the conductive layer 347 and serves as a pixel electrode of the liquid crystal element 303. An alignment film 364 is positioned over the conductive layer 349.

A conductive layer 361 serving as a common electrode is positioned over the substrate 301. Specifically, in FIG. 28, an insulating layer 363 is bonded to the substrate 301 with an adhesive layer 362 interposed therebetween, and the conductive layer 361 is positioned over the insulating layer 363. An alignment film 365 is positioned over the conductive layer 361, and a liquid crystal layer 366 is positioned between the alignment film 364 and the alignment film 365.

In FIG. 28, the conductive layer 349 has a function of reflecting visible light, and the conductive layer 361 has a function of transmitting visible light; accordingly, light entering through the substrate 301 can be reflected by the conductive layer 349 and then exits through the substrate 301, as shown by an arrow of a broken line.

For example, a material containing one of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Examples of a conductive material that reflects visible light include aluminum, silver, and an alloy including any of these metal elements. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used.

Although the structure of the display device including a top-gate transistor with a back gate is illustrated in FIG. 28, the display device of one embodiment of the present invention may include a transistor without a back gate or a transistor including a back gate.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistor, a metal oxide (oxide semiconductor) can be used. Typically, a metal oxide containing indium or the like can be used. In particular, a CAC-OS to be described in Embodiment 7 is preferably used as a metal oxide in the transistor.

In particular, a semiconductor material having a wider band gap and a lower carrier density than silicon is preferably used because off-state current of the transistor can be reduced.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistors including the metal oxide, the oxide preferably contains a stabilizer in addition to In and Zn.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—

Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

Note that although the structure of the display device in which a liquid crystal element is used as a reflective display element is exemplified in this embodiment, a display element using a microcapsule method, an electrophoretic method, an electrowetting method, an Electronic Liquid Powder (registered trademark) method, or the like can also be used, other than micro electro mechanical systems (MEMS) shutter element or an optical interference type MEMS element.

As a light-emitting display element, a self-luminous light-emitting element such as an organic light-emitting diode (OLED), a light-emitting diode (LED), and a quantum-dot light-emitting diode (QLED) can be used.

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a vertical alignment (VA) mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, or the like can be used.

As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either of a positive liquid crystal and a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

<Pixel Portion>

Figure 29:
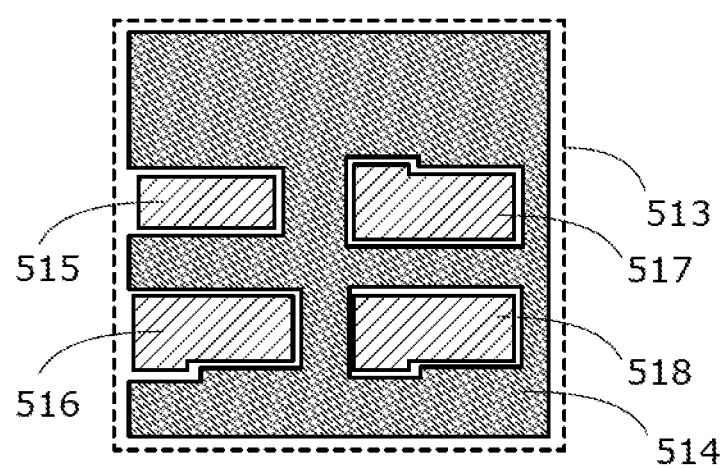
FIG. 29 is a top view illustrating an example of a pixel.

FIG. 29 is a top view illustrating one pixel included in the display portion 106 of the display device 100A. Specifically, FIG. 29 illustrates a layout of a display region by a liquid crystal element and a layout of a display region of a light-emitting element in a pixel 513 in the display portion 106.

The pixel 513 in FIG. 29 includes a display region 514 of the liquid crystal element, a display region 515 of a light-emitting element corresponding to yellow, a display region 516 of a light-emitting element corresponding to green, a display region 517 of a light-emitting element corresponding to red, and a display region 518 of a light-emitting element corresponding to blue.

Note that in order to display black with high color reproducibility by using the light-emitting elements corresponding to green, blue, red, and yellow, the amount of current flowing to the light-emitting element corresponding to yellow per unit area needs to be the smallest among those flowing to the light-emitting elements. In FIG. 29, the display region 516 of the light-emitting element corresponding to green, the display region 517 of the light-emitting element corresponding to red, and the display region 518 of the light-emitting element corresponding to blue have substantially the same area, and the display region 515 of the light-emitting element corresponding to yellow has a slightly smaller area than the other display regions. Therefore, black can be displayed with high color reproducibility.

This embodiment can be combined with any of the other embodiments as appropriate.

(Embodiment 6)

In this embodiment, the touch sensor unit 200 will be described.

Figure 30:
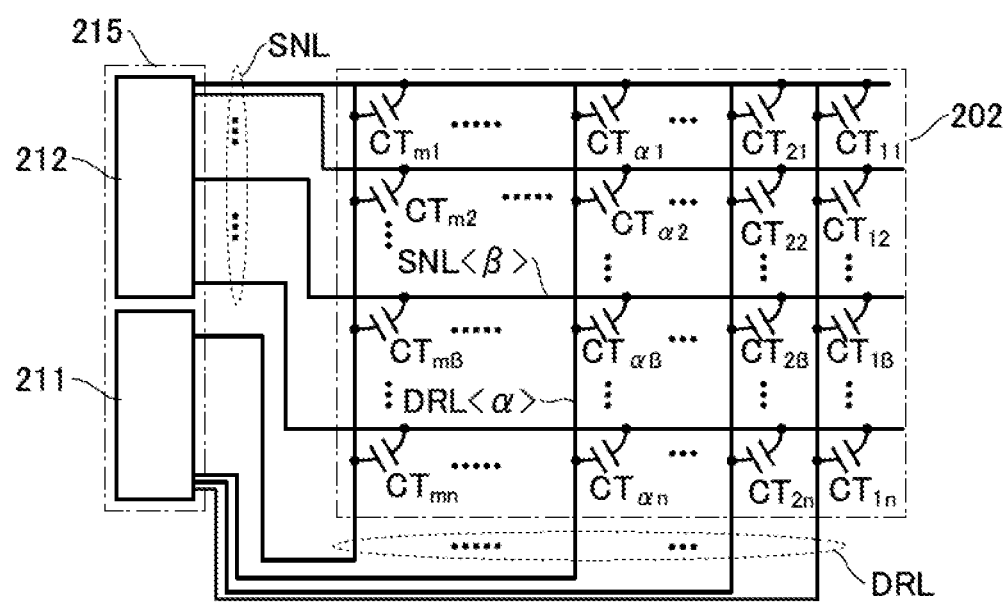
FIG. 30 is a circuit diagram illustrating an example of a touch sensor unit.

FIG. 30 illustrates a configuration example of the touch sensor unit 200. The touch sensor unit 200 includes the sensor array 202, the TS driver IC 211, and the sense circuit 212. In FIG. 30, the TS driver IC 211 and the sense circuit 212 are collectively referred to as the peripheral circuit 215.

Here, the touch sensor unit 200 is a mutual capacitive touch sensor unit as an example. The sensor array 202 includes m wirings DRL and n wirings SNL, where m is an integer greater than or equal to 1 and n is an integer greater than or equal to 1. The wiring DRL is a driving line, and the wiring SNL is a sensing line. Here, the α-th wiring DRL is referred to as a wiring DRL<α>, and the β-th wiring SNL is referred to as a wiring SNL<β>. A capacitor $CT_{\alpha\beta}$ refers to a capacitor formed between the wiring DRL<α> and the wiring SNL<β>.

The m wirings DRL are electrically connected to the TS driver IC 211. The TS driver IC 211 has a function of driving the wirings DRL. The n wirings SNL are electrically connected to the sense circuit 212. The sense circuit 212 has a function of sensing signals of the wirings SNL. A signal of the wiring SNL<β> at the time when the wiring DRL<α> is driven by the TS driver IC 211 has information on the change amount of capacitance of the capacitor $CT_{\alpha\beta}$. By analyzing signals of n wirings SNL, information on the presence or absence of touch, the touch position, and the like can be obtained.

This embodiment can be combined with any of the other embodiments in this specification as appropriate.

(Embodiment 7)
<Composition of CAC-OS>

Described below will be the composition of a cloud-aligned composite oxide semiconductor (CAC-OS) applicable to a transistor of one embodiment of the present invention.

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments and the other examples described in this specification as appropriate.

(Embodiment 8)

In this embodiment, examples of electronic devices including the display device 100 or the display device 100A described in Embodiment 1 will be described. The electronic devices shown below as the examples can include the display device 100 or the display device 100A described in Embodiment 1. Alternatively, the electronic devices shown below as the examples can include the touch sensor unit 200 in addition to the display device 100 or the display device 100A. In particular, the electronic devices described below as examples are each provided with the controller IC disclosed in this specification, whereby power consumption of the electronic devices can be reduced.

Note that one embodiment of the present invention described in this embodiment is not limited to a display device, and a hybrid display device including both a reflective element and a light-emitting element as display elements or an electronic device including the display device may be included.

<Tablet Information Terminal>

Figure 31A:
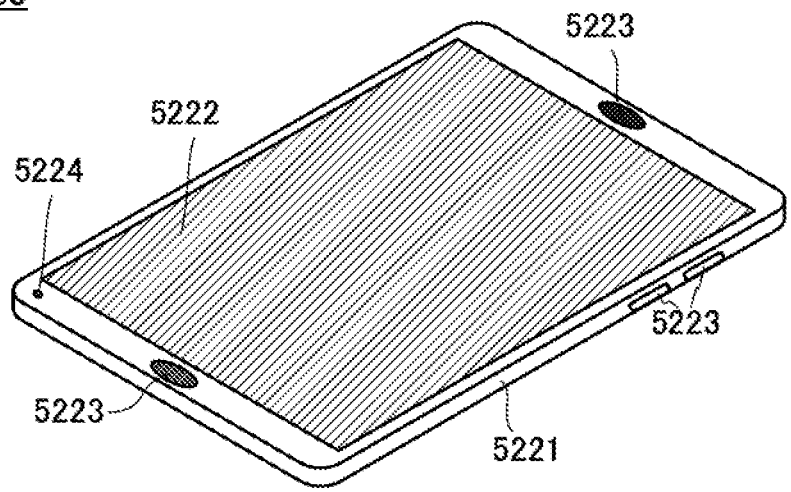
FIGS. 31A and 31B are perspective views each illustrating an example of an electronic device.

FIG. 31A illustrates a tablet information terminal 5200, which includes a housing 5221, a display portion 5222, operation buttons 5223, and a speaker 5224. A display device with a position input function may be used for a display portion 5222. Note that the position input function can be added by provision of a touch panel in a display device. Alternatively, the position input function can be added by providing a photoelectric conversion element called a photosensor in a pixel area of a display device. As the operation buttons 5223, any one of a power switch for starting the information terminal 5200, a button for operating an application of the information terminal 5200, a volume control button, a switch for turning on or off the display portion 5222, and the like can be provided. Although the number of the operation buttons 5223 is four in the information terminal 5200 illustrated in FIG. 31A, the number and position of operation buttons included in the information terminal 5200 are not limited to this example.

Although not illustrated, the information terminal 5200 illustrated in FIG. 31A may include a microphone. With this structure, the information terminal 5200 can have a telephone function like a mobile phone, for example.

Although not illustrated, the information terminal 5200 in FIG. 31A may include a camera. Although not illustrated, the information terminal 5200 illustrated in FIG. 31A may include a light-emitting device for use as a flashlight or a lighting device.

Although not illustrated, the information terminal 5200 illustrated in FIG. 31A may include a sensor (that measures force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, infrared rays, or the like) inside the housing 5221. In particular, when a sensing device including a sensor for sensing inclination such as a gyroscope sensor or an acceleration sensor is provided, display on the screen of the display portion 5222 can be automatically changed in accordance with the orientation of the information terminal 5200 illustrated in FIG. 31A by determining the orientation of the information terminal 5200 (the orientation of the information terminal with respect to the vertical direction).

Although not illustrated, the information terminal 5200 illustrated in FIG. 31A may include a device for obtaining biological information such as fingerprints, veins, iris, or voice prints. With this structure, the information terminal 5200 can have a biometric identification function.

Although not illustrated, the information terminal 5200 illustrated in FIG. 31A may include a microphone, in which case the information terminal 5200 can have a telephone function. In some cases, the information terminal 5200 can have a speech interpretation function. With the speech interpretation function, the information terminal 5200 can have a function of operating the information terminal 5200 by speech recognition, a function of interpreting a speech or a conversation and creating a summary of the speech or the conversation, and the like. This can be utilized to create meeting minutes or the like, for example.

For the display portion 5222, a flexible base may be used. Specifically, the display portion 5222 may have a structure in which a transistor, capacitor, a display element, and the like are formed over the flexible base. With such a structure, in addition to the information terminal 5200 having the housing 5221 with a flat surface as illustrated in FIG. 31A, an electronic device having a housing with a curved surface can be achieved.

Figure 31B:
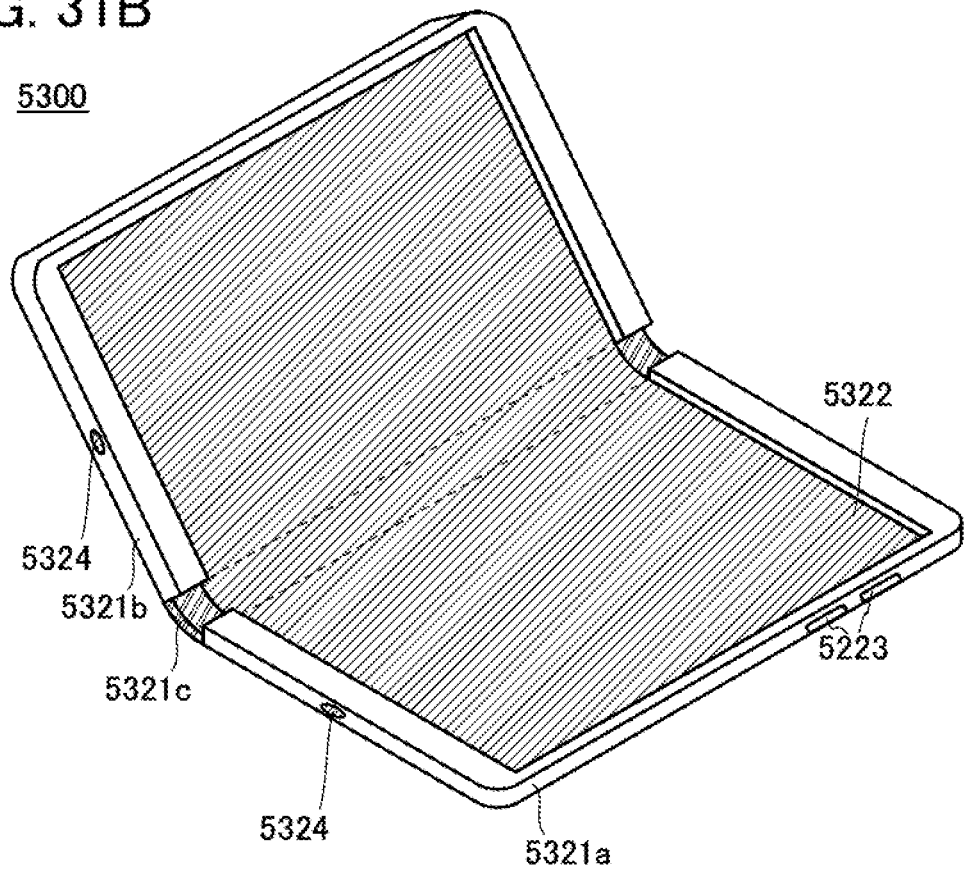

Furthermore, a flexible base may be used for the display portion 5222 of the information terminal 5200 so that the display portion 5222 is freely foldable. FIG. 31B illustrates such a structure. An information terminal 5300 is a tablet information terminal similar to the information terminal 5200 and includes a housing 5321a, a housing 5321b, a display portion 5322, operation buttons 5323, and speakers 5324.

The housing 5321a and the housing 5321b are connected to each other with a hinge portion 5321c that allows the display portion 5322 to be folded in half. The display portion 5322 is provided in the housing 5321a and the housing 5321b and over the hinge portion 5321c.

As a flexible base that can be used for the display portion 5222, any of the following materials that transmit visible light can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, or the like. Alternatively, a mixture or a stack including any of these materials may be used.

In an information terminal 5300 illustrated in FIG. 31B, when a controlloer IC, a driver IC, or the like is mounted over the display portion 5222, it is preferably that the controller IC, the driver IC, or the like is not mounted in a folded portion of the display portion 5222. In this manner, the interference between a curved portion caused by folding and the controller IC, the driver IC, or the like is prevented.

The display device 100 or the display device 100A disclosed in this specification is used for the information terminal 5200 or the information terminal 5300, whereby power consumption of the information terminal 5200 or the information terminal 5300 in IDS driving can be reduced, and a high-definition image can be displayed on the information terminal 5200 or the information terminal 5300.

<Portable Game Machine>

Figure 32A:
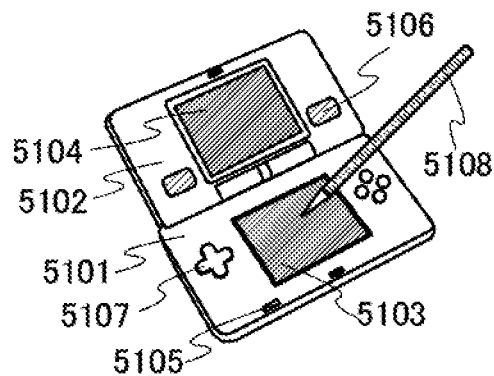
FIGS. 32A to 32F are perspective views each illustrating an example of an electronic device.

The display device of one embodiment of the present invention can be used for a portable game machine. FIG. 32A illustrates a portable game machine including a housing 5101, a housing 5102, a display portion 5103, a display portion 5104, a microphone 5105, a speaker 5106, an operation key 5107, a stylus 5108, and the like. Although the portable game machine in FIG. 32A has the two display portions 5103 and 5104, the number of display portions included in a portable game machine is not limited to this.

<Portable Information Terminal>

Figure 32B:
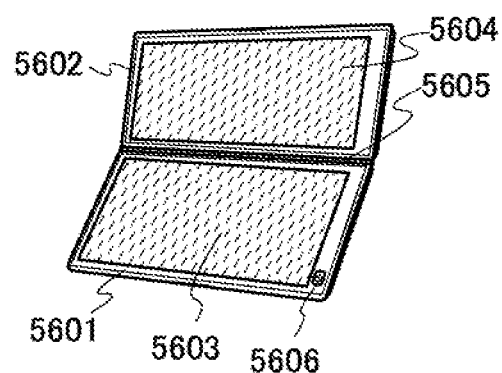

The display device of one embodiment of the present invention can be used for a portable information terminal. FIG. 32B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

<Laptop Personal Computer>

Figure 32C:
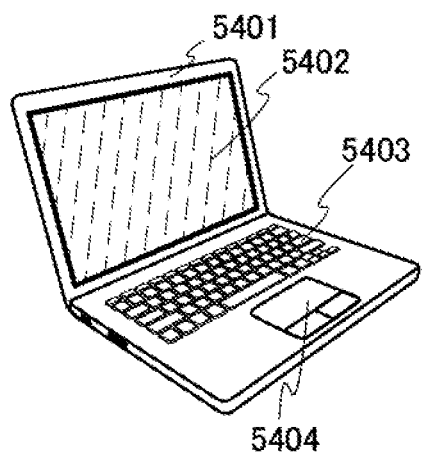

FIG. 32C illustrates a laptop personal computer including a housing 5401, a display portion 5402, a keyboard 5403, a pointing device 5404, and the like. The display device according to one embodiment of the present invention can be used as the display portion 5402.

<Smart Watch>

Figure 32D:
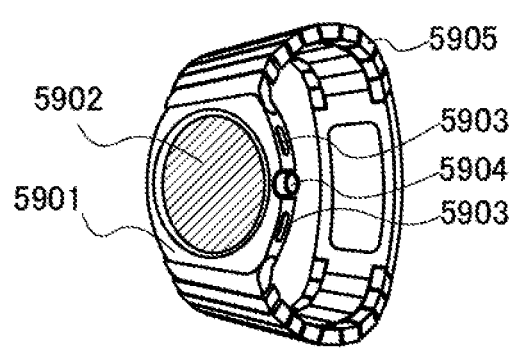

The display device of one embodiment of the present invention can be used for a smart watch. FIG. 32D illustrates a smart watch which is one of wearable terminals. The smart watch includes a housing 5901, a display portion 5902, operation buttons 5903, an operator 5904, and a band 5905. A display device with a position input function may be used as a display portion 5902. Note that the position input function can be added by provision of a touch panel in a display device. Alternatively, the position input function can be added by providing a photoelectric conversion element called a photosensor in a pixel area of a display device. As the operation buttons 5903, any one of a power switch for starting the smart watch, a button for operating an application of the smart watch, a volume control button, a switch for turning on or off the display portion 5902, and the like can be used. Although the smart watch in FIG. 32D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 32D includes the operator 5904, one embodiment of the present invention is not limited thereto and the operator 5904 is not necessarily provided.

<Video Camera>

Figure 32E:
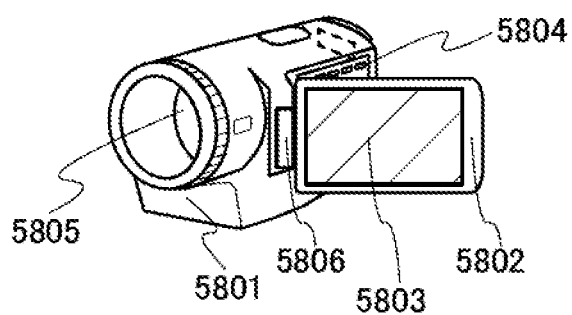

The display device of one embodiment of the present invention can be used for a video camera. FIG. 32E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

<Mobile Phone>

Figure 32F:
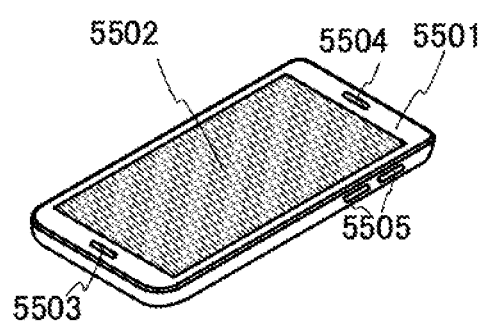

The display device of one embodiment of the present invention can be used for a mobile phone. FIG. 32F is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used.

Although the mobile phone in FIG. 32F includes two operation buttons 5505, the number of the operation buttons included in the mobile phone is not limited to two. Although not illustrated, the mobile phone illustrated in FIG. 32F may be provided with a camera. Although not illustrated, the mobile phone illustrated in FIG. 32F may include a light-emitting device used for a flashlight or a lighting purpose.

<Moving Vehicle>

The display device can be used around a driver's seat in an automobile, which is a moving vehicle.

Figure 33:
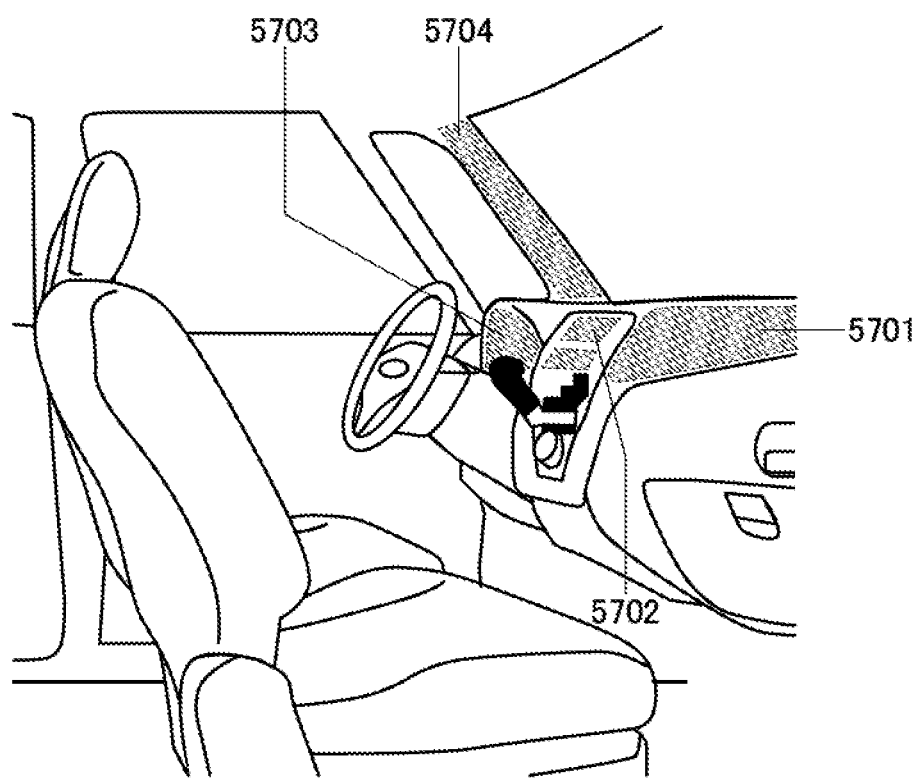
FIG. 33 illustrates an application example of a display device in a moving vehicle.

FIG. 33 illustrates a front glass and its vicinity inside the automobile, for example. In FIG. 33, a display panel 5701, a display panel 5702, and a display panel 5703 which are attached to a dashboard and a display panel 5704 which is attached to a pillar are illustrated.

The display panels 5701 to 5703 can provide a variety of kinds of information such as navigation data, a speedometer, a tachometer, a mileage, a fuel meter, a gearshift indicator, and air-condition setting. The content, layout, or the like of the display on the display panels can be changed freely to suit the user's preferences, so that the design can be improved. The display panels 5701 to 5703 can also be used as lighting devices.

The display panel 5704 can compensate for the view hindered by the pillar (blind areas) by displaying an image taken by an imaging unit provided for the car body. That is, displaying an image taken by an imaging unit provided on the outside of the car body leads to elimination of blind areas and enhancement of safety. In addition, showing an image so as to compensate for the area which a driver cannot see makes it possible for the driver to confirm safety easily and comfortably. The display panel 5704 can also be used as a lighting device.

<Head-Mounted Display>

Figure 34A:
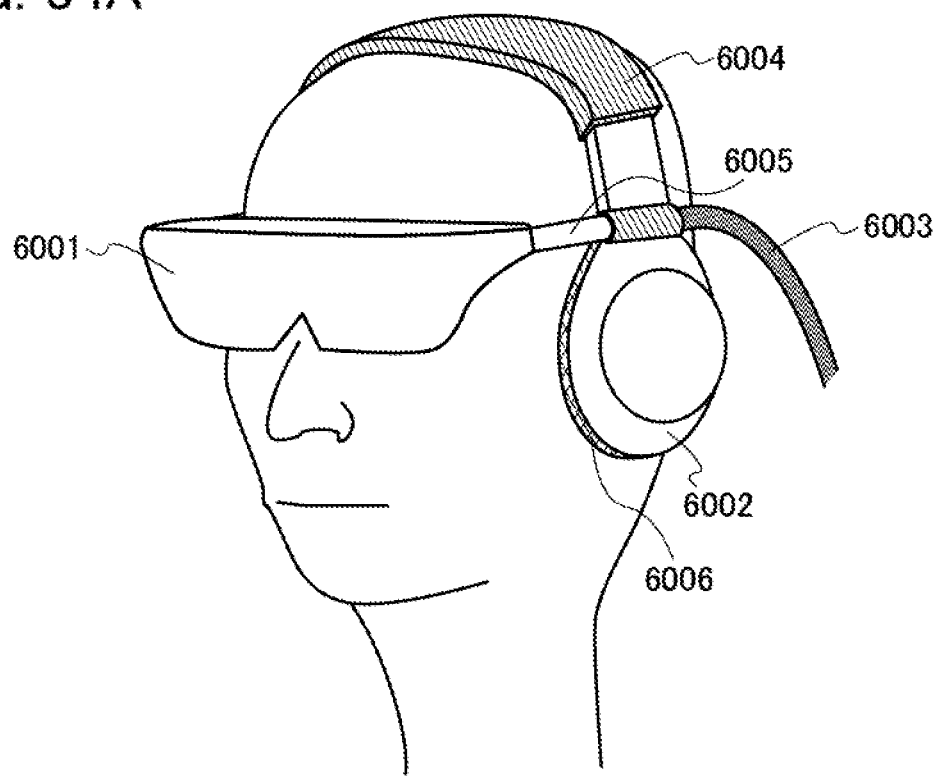
FIGS. 34A and 34B illustrate an example of an electronic device.

FIG. 34A illustrates an appearance of an electronic device worn on a head (head-mounted display) which is a kind of wearable terminals. The head-mounted display includes a housing 6001, a housing 6002, a wiring 6003, a headset 6004, a connection portion 6005, and an ear pad 6006. With these components, a structure body that can be worn on a head is formed. The wiring 6003 functions as a data line transmitting image data, audio data, music data, or the like, a wiring supplying power, and the like.

Although FIG. 34A illustrates a head-mounted display combined with a headphone, a head-mounted display using earphones instead of the headphone may be employed. In other words, the housing 6002, the headset 6004, and the ear pad 6006 are not necessarily provided.

Figure 34B:
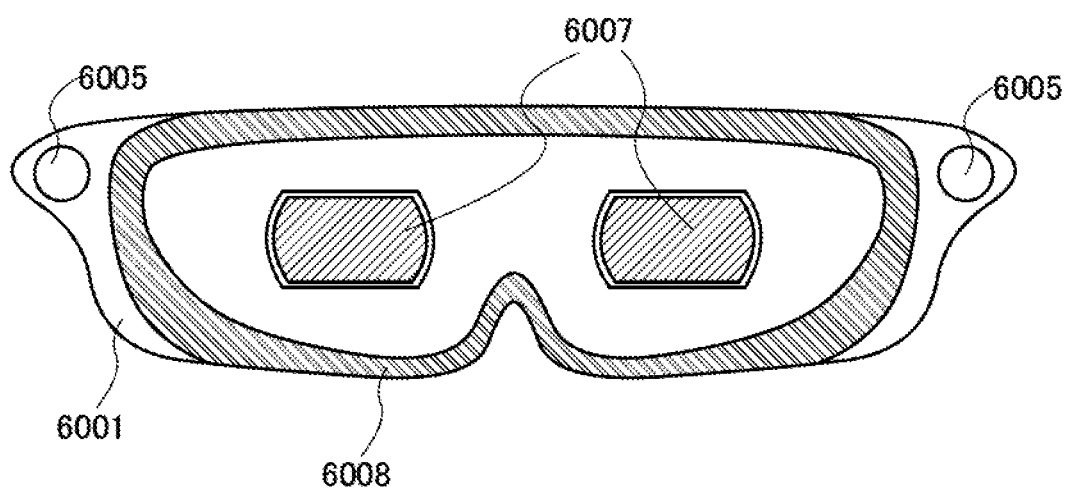

FIG. 34B illustrates a side of the head-mounted display illustrated in FIG. 34A, which is put on a face. The head-mounted display includes display portions 6007 and a cushion portion 6008. With the cushion portion 6008, the misalignment occurring in wearing the head-mounted display can be prevented because the cushion portion 6008 makes the head-mounted display fit a form of human face.

The display portions 6007 are located at portions close to human eyes and thus preferably have high resolution. As the resolution of the display portions 6007 is higher, an image displayed on the display portions 6007 can be recognized to be closer to a real object. For example, the resolution of the display portion 6007 is preferably higher than or equal to 300 ppi, further preferably higher than or equal to 1000 ppi, still further preferably higher than or equal to 2000 ppi, yet still further preferably higher than or equal to 4000 ppi.

In particular, an IC chip in a source driver or the like mounted over a display device is miniaturized easily; thus, a display device with high resolution can be achieved. That is, in combination with the display device of one embodiment, a head-mounted display which enables an image closer to a real object to be displayed can be achieved.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an electroluminescence (EL) element (e.g., an EL element including organic and inorganic materials, an organic EL element, or an inorganic EL element), a light-emitting diode (LED) chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulation (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by electric or magnetic action may be included in the display element, the display device, the light-emitting element, or the light-emitting device. Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the base of a display element including microelectromechanical systems (MEMS), a dry agent may be provided in a space where the display element is sealed (e.g., between an element substrate over which the display element is placed and a counter substrate opposed to the element substrate). Providing a dry agent can prevent MEMS and the like from becoming difficult to move or deteriorating easily because of moisture or the like.

This embodiment can be combined with any of the other embodiments in this specification as appropriate.

(Notes on Description of this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, for example, a "first" component in one embodiment can be referred to as a "second" component in other embodiments or claims. Furthermore, in this specification and the like, for example, a "first" component in one embodiment can be omitted in other embodiments or claims.

<Notes on the Description for Drawings>

The embodiments are described with reference to the drawings. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a perspective view, some components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal.

In this specification and the like, in the case where a transistor has two or more gates (such a structure is referred to as a dual-gate structure in some cases), these gates are referred to as a first gate and a second gate or a front gate and a back gate in some cases. In particular, the term "front gate" can be replaced with a simple term "gate". The term "back gate" can be replaced with a simple term "gate". Note that a "bottom gate" is a terminal which is formed before a channel formation region in manufacture of a transistor, and a "top gate" is a terminal which is formed after a channel formation region in manufacture of a transistor.

A transistor is an element having three terminals: a gate, a source, and a drain. A gate is a terminal which functions as a control terminal for controlling the conduction state of a transistor. Functions of input/output terminals of the transistor depend on the type and the levels of potentials applied to the terminals, and one of the two terminals serves as a source and the other serves as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

«Impurity in Semiconductor»

Note that an impurity in a semiconductor refers to, for example, elements other than the main components of a semiconductor layer. For example, an element with a concentration lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor layer is silicon, examples of an impurity which changes the characteristics of the semiconductor include oxygen, Group 1 elements except hydrogen, Group 2 elements, Group 13 elements, and Group 15 elements.

«Transistor»

In this specification, a transistor is an element having at least three terminals of a gate, a drain, and a source. The transistor has a channel formation region between the drain (a drain terminal, a drain region, or a drain electrode) and the source (a source terminal, a source region, or a source electrode). A voltage is applied between a gate and the source, whereby a channel can be formed in the channel formation region, and current can flow between the drain and the source.

Furthermore, functions of a source and a drain might be switched when transistors having different polarities are employed or a direction of current flow is changed in circuit operation, for example. Therefore, the terms "source" and "drain" can be switched in this specification and the like.

«Switch»

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

«Connection»

For example, in this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a line, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection path in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

«Parallel and Perpendicular»

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°.

«Trigonal and Rhombohedral»

In this specification, trigonal and rhombohedral crystal systems are included in a hexagonal crystal system.

This application is based on Japanese Patent Application Serial No. 2016-152678 filed with Japan Patent Office on Aug. 3, 2016, and Japanese Patent Application Serial No. 2016-167660 filed with Japan Patent Office on Aug. 30, 2016, the entire contents of which are hereby incorporated by reference.

What is claimed is:

1. A display device comprising:
   a base;
   a display portion formed over the base;
   a first circuit formed over the base;
   a second circuit formed over the base; and
   a third circuit mounted over the base,
   wherein the first circuit is configured to operate as a gate driver of the display portion,
   wherein the second circuit is configured to shift a level of a potential inputted to the second circuit and to supply the shifted potential to the first circuit,
   wherein the third circuit is configured to operate as a source driver of the display portion,
   wherein the second circuit comprises a fifth circuit,
   wherein the fifth circuit comprises a third transistor to an eighth transistor, a first capacitor, and a second capacitor,
   wherein the third transistor to the eighth transistor comprises a metal oxide in a channel formation region,
   wherein a first terminal of the third transistor is electrically connected to a gate of the third transistor,
   wherein a first terminal of the fourth transistor is electrically connected to a gate of the fourth transistor,
   wherein a gate of the fifth transistor is electrically connected to the first terminal of the fourth transistor,
   wherein a first terminal of the fifth transistor is electrically connected to a second terminal of the third transistor,
   wherein a gate of the sixth transistor is electrically connected to the first terminal of the third transistor,
   wherein a first terminal of the sixth transistor is electrically connected to a second terminal of the fourth transistor,
   wherein a first terminal of the seventh transistor is electrically connected to a first terminal of the eighth transistor,
   wherein a gate of the seventh transistor is electrically connected to the second terminal of the third transistor, wherein a gate of the eighth transistor is electrically connected to the second terminal of the fourth transistor, wherein a first terminal of the first capacitor is electrically connected to the gate of the seventh transistor, wherein a second terminal of the first capacitor is electrically connected to the first terminal of the seventh transistor, and wherein a first terminal of the second capacitor is electrically connected to the gate of the eighth transistor.

2. The display device according to claim 1, further comprising a fourth circuit mounted over the base, wherein the fourth circuit comprises a memory circuit, an image processing portion, and a controller, wherein the memory circuit is configured to store an image data, wherein the image processing portion is configured to process the image data, and wherein the controller is configured to control supplying power to at least one of the first circuit, the second circuit, the third circuit, the memory circuit, and the image processing portion.

3. The display device according to claim 2, wherein the fourth circuit comprises a first transistor, and wherein the first transistor comprises silicon in a channel formation region.

4. The display device according to claim 2, wherein the fourth circuit comprises a second transistor, and wherein the second transistor comprises a metal oxide in a channel formation region.

5. The display device according to claim 1, wherein the second circuit comprises a first differential amplifier, a second differential amplifier, and a buffer circuit, wherein the buffer circuit comprises a first input terminal, a second input terminal, and the fifth circuit, wherein the first input terminal is electrically connected to the first terminal of the third transistor, wherein the second input terminal is electrically connected to the first terminal of the fourth transistor, wherein each of the first differential amplifier and the second differential amplifier comprises a ninth transistor, wherein the ninth transistor comprises a metal oxide in a channel formation region, wherein an output terminal of the first differential amplifier is electrically connected to the first input terminal of the buffer circuit, and wherein an output terminal of the second differential amplifier is electrically connected to the second input terminal of the buffer circuit.

6. The display device according to claim 5, further comprising a fourth circuit mounted over the base, wherein the fourth circuit comprises a logic circuit, wherein a first output terminal of the logic circuit is electrically connected to an input terminal of the first differential amplifier, wherein a second output terminal of the logic circuit is electrically connected to an input terminal of the second differential amplifier, and wherein the logic circuit is configured to output a pulse signal from the first output terminal when a potential of a signal inputted to an input terminal of the logic circuit changes from a low level to a high level and configured to output a pulse signal from the second output terminal when a potential of a signal inputted to the input terminal of the logic circuit changes from a high level to a low level.

7. The display device according to claim 1, wherein each of the display portion and the first circuit comprises a tenth transistor, and wherein the tenth transistor comprises a metal oxide in a channel formation region.

8. The display device according to claim 1, wherein the third circuit comprises an eleventh transistor, and wherein the eleventh transistor comprises silicon in a channel formation region.

9. The display device according to claim 1, wherein the display portion comprises a first display element and a second display element, wherein the first display element is configured to display an image with use of light reflection, and wherein the second display element is configured to display an image by self light emission.

10. An electronic device comprising the display device according to claim 1, a touch sensor unit, and a housing.

11. A head-mounted electronic device comprising the display device according to claim 1, and a structure body that is worn on a head.

12. The display device according to claim 1, wherein the second circuit is not formed over a chip.

13. A display device comprising:

a base;

a first chip over the base;

a display portion over the base;

a gate driver over the base;

a level shifter over the base; and a source driver over the first chip, wherein the level shifter is electrically connected to the display portion through the gate driver, wherein the source driver is electrically connected to the display portion, wherein the level shifter is formed over the base, wherein the gate driver is formed over the base, wherein the level shifter comprises a second circuit, wherein the second circuit comprises a third transistor to an eighth transistor, a first capacitor, and a second capacitor, wherein the third transistor to the eighth transistor comprises a metal oxide in a channel formation region, wherein a first terminal of the third transistor is electrically connected to a gate of the third transistor, wherein a first terminal of the fourth transistor is electrically connected to a gate of the fourth transistor, wherein a gate of the fifth transistor is electrically connected to the first terminal of the fourth transistor, wherein a first terminal of the fifth transistor is electrically connected to a second terminal of the third transistor, wherein a gate of the sixth transistor is electrically connected to the first terminal of the third transistor, wherein a first terminal of the sixth transistor is electrically connected to a second terminal of the fourth transistor, wherein a first terminal of the seventh transistor is electrically connected to a first terminal of the eighth transistor, wherein a gate of the seventh transistor is electrically connected to the second terminal of the third transistor, wherein a gate of the eighth transistor is electrically connected to the second terminal of the fourth transistor, wherein a first terminal of the first capacitor is electrically connected to the gate of the seventh transistor, wherein a second terminal of the first capacitor is electrically connected to the first terminal of the seventh transistor, and wherein a first terminal of the second capacitor is electrically connected to the gate of the eighth transistor.

14. The display device according to claim 13, further comprising:

a second chip over the base; and a first circuit over the second chip, wherein the first circuit is electrically connected to the gate driver through the level shifter and electrically connected to the source driver, and wherein the level shifter is not over the second chip.

15. The display device according to claim 14, wherein the first circuit comprises a memory circuit, an image processing portion, and a controller, wherein the memory circuit is configured to store an image data, wherein the image processing portion is configured to process the image data, and wherein the controller is configured to control supplying power to at least one of the gate driver, the level shifter, the source driver, the memory circuit, and the image processing portion.

16. The display device according to claim 14, wherein the first circuit comprises a first transistor, and wherein the first transistor comprises silicon in a channel formation region.

17. The display device according to claim 14, wherein the first circuit comprises a second transistor, and wherein the second transistor comprises a metal oxide in a channel formation region.

18. The display device according to claim 13, wherein the level shifter comprises a first differential amplifier, a second differential amplifier, and a buffer circuit, wherein the buffer circuit comprises a first input terminal, a second input terminal, and the second circuit, wherein the first input terminal is electrically connected to the first terminal of the third transistor, wherein the second input terminal is electrically connected to the first terminal of the fourth transistor, wherein each of the first differential amplifier and the second differential amplifier comprises a ninth transistor, wherein the ninth transistor comprises a metal oxide in a channel formation region, wherein an output terminal of the first differential amplifier is electrically connected to the first input terminal of the buffer circuit, and wherein an output terminal of the second differential amplifier is electrically connected to the second input terminal of the buffer circuit.

19. The display device according to claim 18, further comprising a first circuit mounted over the base, wherein the first circuit comprises a logic circuit, wherein a first output terminal of the logic circuit is electrically connected to an input terminal of the first differential amplifier, wherein a second output terminal of the logic circuit is electrically connected to an input terminal of the second differential amplifier, and wherein the logic circuit is configured to output a pulse signal from the first output terminal when a potential of a signal inputted to an input terminal of the logic circuit changes from a low level to a high level and configured to output a pulse signal from the second output terminal when a potential of a signal inputted to the input terminal of the logic circuit changes from a high level to a low level.

20. The display device according to claim 13, wherein each of the display portion and the gate driver comprises a tenth transistor, and wherein the tenth transistor comprises a metal oxide in a channel formation region.

21. The display device according to claim 13, wherein the source driver comprises an eleventh transistor, and wherein the eleventh transistor comprises silicon in a channel formation region.

22. The display device according to claim 13, wherein the display portion comprises a first display element and a second display element, wherein the first display element is configured to display an image with use of light reflection, and wherein the second display element is configured to display an image by self light emission.

23. An electronic device comprising the display device according to claim 13, a touch sensor unit, and a housing.

24. A head-mounted electronic device comprising the display device according to claim 13, and a structure body that is worn on a head.

* * * * *